United States Patent
Hussell

(10) Patent No.: US 11,776,460 B2
(45) Date of Patent: Oct. 3, 2023

(54) ACTIVE CONTROL OF LIGHT EMITTING DIODES AND LIGHT EMITTING DIODE DISPLAYS

(71) Applicant: CreeLED, Inc., Durham, NC (US)

(72) Inventor: Christopher P. Hussell, Cary, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 16/543,009

(22) Filed: Aug. 16, 2019

(65) Prior Publication Data

US 2020/0312226 A1    Oct. 1, 2020

Related U.S. Application Data

(63) Continuation-in-part of application No. 16/437,878, filed on Jun. 11, 2019, which is a continuation-in-part
(Continued)

(51) Int. Cl.
*G09G 3/32* (2016.01)
*H01L 25/16* (2023.01)
(Continued)

(52) U.S. Cl.
CPC ............. *G09G 3/32* (2013.01); *G09G 3/2003* (2013.01); *H01L 25/167* (2013.01)

(58) Field of Classification Search
CPC ...... H05B 45/20; H05B 45/22; H05B 39/086; H05B 39/088; H05B 45/10; H05B 45/37;
(Continued)

(56) References Cited

U.S. PATENT DOCUMENTS 5,359,345 A    10/1994  Hunter
6,016,038 A    1/2000   Mueller et al.
(Continued)

FOREIGN PATENT DOCUMENTS

JP    2002229502 A    8/2002
WO    2020030993 A1    2/2020

OTHER PUBLICATIONS

Final Office Action for U.S. Appl. No. 16/369,003, dated Dec. 9, 2020, 17 pages.
(Continued)

*Primary Examiner* — Wei Victor Y Chan
(74) *Attorney, Agent, or Firm* — Withrow & Terranova, P.L.L.C.

(57) ABSTRACT

Active control of light emitting diodes (LEDs) and LED packages within LED displays is disclosed. LED packages are disclosed that include a plurality of LED chips that form at least one LED pixel for an LED display or an LED panel. Each LED package may include an active electrical element that is configured to receive a control signal and actively maintain an operating state, such as brightness or grey level while other LED packages are being addressed. Active electrical elements are disclosed that are configured to provide both forward and reverse bias states to LEDs to detect adverse operating conditions including reverse leakage and deviations to forward voltage levels. LED packages are also disclosed that may self-configure based on the manner in which various input or output lines are connected.

30 Claims, 37 Drawing Sheets

Related U.S. Application Data of application No. 16/369,003, filed on Mar. 29, 2019.

(51) Int. Cl.
*G09G 3/20* (2006.01)
*H05B 45/20* (2020.01)
*H05B 45/22* (2020.01)

(58) Field of Classification Search
CPC ...... H05B 47/105; H05B 47/19; H05B 45/00;
H05B 45/24; H05B 45/28; H05B 45/46;
H05B 45/58; H05B 47/00
See application file for complete search history.

(56) References Cited

U.S. PATENT DOCUMENTS

| | | | |
|---|---|---|---|
| 6,150,774 A | 11/2000 | Mueller et al. | |
| 6,166,496 A | 12/2000 | Lys et al. | |
| 6,211,626 B1 | 4/2001 | Lys et al. | |
| 6,292,901 B1 | 9/2001 | Lys et al. | |
| 6,538,626 B1* | 3/2003 | Nieberger | G08B 5/36 |
| | | | 345/82 |
| 7,206,001 B1 | 4/2007 | Crandall et al. | |
| 7,579,629 B2 | 8/2009 | Inoguchi | |
| 8,111,001 B2 | 2/2012 | Underwood et al. | |
| 8,328,405 B2 | 12/2012 | Negley | |
| 8,922,458 B2* | 12/2014 | Sefton | G09G 3/32 |
| | | | 345/82 |
| 8,937,492 B1 | 1/2015 | Gideon | |
| 8,970,131 B2 | 3/2015 | Brandes et al. | |
| 9,414,454 B2 | 8/2016 | Brandes et al. | |
| 9,717,123 B1 | 7/2017 | Yao | |
| 10,368,411 B2 | 7/2019 | Zhang et al. | |
| 10,384,239 B2 | 8/2019 | Fedigan et al. | |
| 10,453,827 B1 | 10/2019 | Hussell et al. | |
| 10,663,418 B2 | 5/2020 | Magee et al. | |
| 10,682,675 B2 | 6/2020 | Magee et al. | |
| 10,695,805 B2 | 6/2020 | Magee et al. | |
| 10,908,414 B2* | 2/2021 | Revier | G01H 13/00 |
| 2001/0028356 A1 | 10/2001 | Balogh | |
| 2002/0130627 A1 | 9/2002 | Morgan et al. | |
| 2004/0160199 A1 | 8/2004 | Morgan et al. | |
| 2004/0246278 A1 | 12/2004 | Elliott | |
| 2006/0022214 A1 | 2/2006 | Morgan et al. | |
| 2006/0114269 A1 | 6/2006 | Chang-Ho et al. | |
| 2007/0097055 A1 | 5/2007 | Takamura et al. | |
| 2007/0195025 A1* | 8/2007 | Korcharz | H05B 45/46 |
| | | | 345/82 |
| 2007/0237165 A1 | 10/2007 | Chiang | |
| 2008/0018261 A1 | 1/2008 | Kastner | |
| 2008/0062158 A1 | 3/2008 | Willis | |
| 2008/0245949 A1 | 10/2008 | Morimoto et al. | |
| 2009/0079362 A1 | 3/2009 | Shteynberg et al. | |
| 2009/0147028 A1* | 6/2009 | Sefton | G06F 3/1446 |
| | | | 345/82 |
| 2009/0179843 A1 | 7/2009 | Ackermann et al. | |
| 2009/0201274 A1 | 8/2009 | Kuwabara et al. | |
| 2009/0230885 A1 | 9/2009 | Tanaka | |
| 2009/0278034 A1 | 11/2009 | Ackermann et al. | |
| 2010/0026208 A1 | 2/2010 | Shteynberg et al. | |
| 2010/0102734 A1 | 4/2010 | Quick et al. | |
| 2010/0156952 A1 | 6/2010 | Arai | |
| 2010/0214764 A1 | 8/2010 | Chaves et al. | |
| 2011/0057302 A1 | 3/2011 | Spehar et al. | |
| 2012/0056864 A1 | 3/2012 | Aioanei | |
| 2012/0126711 A1 | 5/2012 | Suminoe et al. | |
| 2012/0147567 A1 | 6/2012 | Lee et al. | |
| 2012/0218754 A1 | 8/2012 | Maes | |
| 2012/0286674 A1 | 11/2012 | Takanashi et al. | |
| 2012/0299480 A1* | 11/2012 | Peting | H05B 47/185 |
| | | | 315/185 R |
| 2013/0057763 A1 | 3/2013 | Cha et al. | |
| 2013/0076250 A1* | 3/2013 | Logiudice | H05B 45/37 |
| | | | 315/161 |
| 2014/0128941 A1 | 5/2014 | Williams | |
| 2014/0152902 A1 | 6/2014 | Morrisseau | |
| 2014/0265919 A1 | 9/2014 | Pope et al. | |
| 2014/0306966 A1 | 10/2014 | Kuo et al. | |
| 2015/0276144 A1 | 10/2015 | Tudhope et al. | |
| 2015/0319814 A1 | 11/2015 | Grotsch et al. | |
| 2015/0348496 A1* | 12/2015 | Santos, II | G06F 9/4451 |
| | | | 345/520 |
| 2015/0377695 A1 | 12/2015 | Chang et al. | |
| 2016/0071467 A1 | 3/2016 | Elder et al. | |
| 2016/0161326 A1 | 6/2016 | Chang et al. | |
| 2016/0217762 A1 | 7/2016 | Moon et al. | |
| 2016/0293811 A1 | 10/2016 | Hussell et al. | |
| 2016/0314730 A1 | 10/2016 | Sampsell | |
| 2017/0092198 A1 | 3/2017 | Ryu et al. | |
| 2017/0168212 A1* | 6/2017 | Chen | G02B 6/0083 |
| 2017/0263828 A1 | 9/2017 | Mao et al. | |
| 2017/0294495 A1 | 10/2017 | Shyu et al. | |
| 2017/0330856 A1 | 11/2017 | Zou et al. | |
| 2018/0033768 A1* | 2/2018 | Kumar | H01L 24/95 |
| 2018/0035018 A1 | 2/2018 | Yamada et al. | |
| 2018/0076368 A1 | 3/2018 | Hussell | |
| 2018/0114800 A1* | 4/2018 | Pan | H01L 27/1218 |
| 2018/0182927 A1 | 6/2018 | Vampola et al. | |
| 2018/0247608 A1 | 8/2018 | Chen | |
| 2018/0261149 A1 | 9/2018 | Lin | |
| 2018/0348959 A1* | 12/2018 | Lin | G09G 3/3258 |
| 2019/0132921 A1 | 5/2019 | Rumer | |
| 2019/0132923 A1 | 5/2019 | Rumer | |
| 2019/0149792 A1 | 5/2019 | Luo et al. | |
| 2019/0302917 A1 | 10/2019 | Pan | |
| 2019/0335081 A1 | 10/2019 | Baar et al. | |
| 2019/0371974 A1 | 12/2019 | Hussell | |
| 2020/0105179 A1 | 4/2020 | Greenebaum et al. | |
| 2020/0105221 A1 | 4/2020 | Marcu et al. | |
| 2020/0135093 A1 | 4/2020 | Prathaban et al. | |
| 2020/0184900 A1 | 6/2020 | Shin et al. | |
| 2020/0203319 A1 | 6/2020 | Lee et al. | |
| 2020/0251050 A1 | 8/2020 | Yee | |
| 2021/0005761 A1 | 1/2021 | Tsai et al. | |

OTHER PUBLICATIONS

Advisory Action for U.S. Appl. No. 16/369,003, dated Feb. 11, 2021, 3 pages.
Final Office Action for U.S. Appl. No. 16/381,116, dated Dec. 10, 2020, 10 pages.
Advisory Action for U.S. Appl. No. 16/381,116, dated Feb. 11, 2021, 3 pages.
Final Office Action for U.S. Appl. No. 16/437,878, dated Dec. 9, 2020, 14 pages.
Advisory Action and Examiner-Initiated Interview Summary for U.S. Appl. No. 16/437,878, dated Feb. 11, 2021, 4 pages.
Final Office Action for U.S. Appl. No. 16/542,923, dated Dec. 10, 2020, 16 pages.
Advisory Action and Examiner-Initiated Interview Summary for U.S. Appl. No. 16/542,923, dated Feb. 11, 2021, 4 pages.
Author Unknown, "APA102-2020 Super LED," Datasheet, Shenzhen LED Color Opto Electronic Co., Ltd., retrieved Apr. 10, 2019 from http://www.led-color.com/upload/201604/APA102-2020%20SMD%20LED.pdf, 6 pages.
Author Unknown, "APA102C: RGB Full Color LED control IC," iPixel LED, Shiji Lighting, retrieved Apr. 10, 2019 from https://cdn-shop.adafruit.com/datasheets/APA102.pdf, 5 pages.
Author Unknown, "Self-clocking signal," Jul. 1, 2018, Wikipedia, https://en.wikipedia.org/w/index.php?title=Self-clocking_signal&oldid=848405107, 3 pages.
Author Unknown, "Serial communication," May 2, 2019, Wikipedia, https://en.wikipedia.org/w/index.php?title=Serial_communication&oldid=895110130, 4 pages.
Author Unknown, "SK6812 Technical Data Sheet," Shenzhen LED Color Optoelectronic Co., Ltd., retrieved Apr. 10, 2019 from https://cdn-shop.adafruit.com/product-files/1138/SK6812+LED+datasheet+.pdf, 8 pages.

(56) References Cited

OTHER PUBLICATIONS

Author Unknown, "SK6812RGBW Specification: Integrated Light Source Intelligent Control of Chip-On-Top SMD Type LED," Jul. 31, 2015, Dongguang Opsco Optpelectronics Co., Ltd., 16 pages.
Author Unknown, "WS2811: Signal line 256 Gray level 3 channal Constant current LED drive IC," Worldsemi, retrieved May 23, 2019 from https://cdn-shop.adafruit.com/datasheets/WS2811.pdf, 7 pages.
Author Unknown, "WS2812: Intelligent control LED integrated light source," Worldsemi, retrieved Apr. 10, 2019 from https://cdn-shop.adafruit.com/datasheets/WS2811.pdf, 5 pages.
Zhu, K., "EC20-6812 Specification: Embedded Control LED," Dec. 19, 2018, Shenzhen Normand Electronic Co., Ltd., 35 pages.
Invitation to Pay Additional Fees and Partial Search for International Patent Application No. PCT/US2020/023140, dated Jun. 16, 2020, 25 pages.
International Search Report and Written Opinion for International Patent Application No. PCT/US2020/023140, dated Aug. 11, 2020, 27 pages.
Non-Final Office Action for U.S. Appl. No. 16/369,003, dated Aug. 21, 2020, 15 pages.
Non-Final Office Action for U.S. Appl. No. 16/381,116, dated Aug. 21, 2020, 8 pages.
Non-Final Office Action for U.S. Appl. No. 16/437,878, dated Aug. 21, 2020, 14 pages.
Non-Final Office Action for U.S. Appl. No. 16/542,923, dated Aug. 21, 2020, 15 pages.
Non-Final Office Action for U.S. Appl. No. 16/369,003, dated Apr. 1, 2021, 18 pages.
Non-Final Office Action for U.S. Appl. No. 16/381,116, dated Apr. 1, 2021, 12 pages.
Non-Final Office Action for U.S. Appl. No. 16/437,878, dated Apr. 1, 2021, 16 pages.
Non-Final Office Action for U.S. Appl. No. 16/437,878, dated Apr. 23, 2021, 17 pages.
Non-Final Office Action for U.S. Appl. No. 16/542,923, dated Apr. 1, 2021, 19 pages.
Final Office Action for U.S. Appl. No. 16/369,003, dated Jul. 22, 2021, 16 pages.
Final Office Action for U.S. Appl. No. 16/381,116, dated Jul. 22, 2021, 9 pages.
Final Office Action for U.S. Appl. No. 16/542,923, dated Jul. 22, 2021, 19 pages.
Invitation to Pay Additional Fees and Partial Search for International Patent Application No. PCT/US2021/019708, dated May 25, 2021, 17 pages.
International Search Report and Written Opinion for International Patent Application No. PCT/US2021/019708, dated Jul. 19, 2021, 23 pages.
Advisory Action for U.S. Appl. No. 16/369,003, dated Sep. 23, 2021, 3 pages.
Final Office Action for U.S. Appl. No. 16/437,878, dated Sep. 1, 2021, 16 pages.
Advisory Action for U.S. Appl. No. 16/542,923, dated Sep. 23, 2021, 3 pages.
Non-Final Office Action for U.S. Appl. No. 16/369,003, dated Nov. 12, 2021, 19 pages.
Non-Final Office Action for U.S. Appl. No. 16/381,116, dated Nov. 12, 2021, 10 pages.
Non-Final Office Action for U.S. Appl. No. 16/437,878, dated Dec. 15, 2021, 17 pages.
Non-Final Office Action for U.S. Appl. No. 16/542,923, dated Nov. 12, 2021, 21 pages.
Non-Final Office Action for U.S. Appl. No. 16/815,101, dated Nov. 12, 2021, 13 pages.
Non-Final Office Action for U.S. Appl. No. 17/081,522, dated Jan. 20, 2022, 18 pages.
Final Office Action for U.S. Appl. No. 16/381,116, dated Mar. 2, 2022, 17 pages.
Final Office Action for U.S. Appl. No. 16/542,923, dated Mar. 2, 2022, 21 pages.
Final Office Action for U.S. Appl. No. 16/815,101, dated Mar. 2, 2022, 14 pages.
Final Office Action for U.S. Appl. No. 16/369,003, dated Mar. 31, 2022, 23 pages.
Final Office Action for U.S. Appl. No. 16/437,878, dated Mar. 31, 2022, 22 pages.
Advisory Action and Examiner-Initiated Interview Summary for U.S. Appl. No. 16/381,116, dated May 6, 2022, 4 pages.
Non-Final Office Action for U.S. Appl. No. 16/381,116, dated Jun. 22, 2022, 17 pages.
Advisory Action and Examiner-Initiated Interview Summary for U.S. Appl. No. 16/542,923, dated May 6, 2022, 4 pages.
Non-Final Office Action for U.S. Appl. No. 16/542,923, dated Jun. 22, 2022, 23 pages.
Non-Final Office Action for U.S. Appl. No. 16/906,129, dated Jun. 9, 2022, 14 pages.
Advisory Action and Examiner-Initiated Interview Summary for U.S. Appl. No. 16/815,101, dated May 6, 2022, 4 pages.
Non-Final Office Action for U.S. Appl. No. 16/815,101, dated Jun. 22, 2022, 17 pages.
Final Office Action for U.S. Appl. No. 17/081,522, dated Apr. 28, 2022, 10 pages.
Advisory Action for U.S. Appl. No. 17/081,522, dated Jul. 5, 2022, 3 pages.
Non-Final Office Action for U.S. Appl. No. 16/369,003, dated Jul. 21, 2022, 29 pages.
Final Office Action for U.S. Appl. No. 16/381,116, dated Oct. 4, 2022, 17 pages.
Final Office Action for U.S. Appl. No. 16/437,878, dated Jul. 21, 2022, 23 pages.
Final Office Action for U.S. Appl. No. 16/542,923, dated Oct. 7, 2022, 23 pages.
Final Office Action for U.S. Appl. No. 16/815,101, dated Oct. 7, 2022, 16 pages.
Non-Final Office Action for U.S. Appl. No. 17/081,522, dated Aug. 17, 2022, 9 pages.
Non-Final Office Action for U.S. Appl. No. 16/437,878, dated Oct. 27, 2022, 21 pages.
Final Office Action for U.S. Appl. No. 16/542,923, dated Nov. 14, 2022, 29 pages.
Advisory Action and Examiner-Initiated Interview Summary for U.S. Appl. No. 16/542,923, dated Dec. 15, 2022, 4 pages.
Advisory Action and Examiner-Initiated Interview Summary for U.S. Appl. No. 16/815,101, dated Dec. 20, 2022, 4 pages.
Final Office Action for U.S. Appl. No. 17/081,522, dated Nov. 10, 2022, 10 pages.
Final Office Action for U.S. Appl. No. 16/906,129, dated Dec. 12, 2022, 15 pages.
Final Office Action for U.S. Appl. No. 16/369,003, dated Nov. 1, 2022, 23 pages.
Final Office Action for U.S. Appl. No. 16/369,003, dated Nov. 3, 2022, 24 pages.
Final Office Action for U.S. Appl. No. 16/369,003, dated Dec. 12, 2022, 24 pages.
Reason for Rejection for Japanese Patent Application No. 2021-560354, dated Oct. 11, 2022, 7 pages.
Final Office Action for U.S. Appl. No. 16/437,878, dated Feb. 9, 2023, 21 pages.
Notice of Allowance and Examiner-Initiated Interview Summary for U.S. Appl. No. 16/542,923, dated Mar. 17, 2023, 11 pages.
Ex Parte Quayle Action for U.S. Appl. No. 16/815,101, dated Jan. 19, 2023, 7 pages.
Notice of Allowance for U.S. Appl. No. 16/815,101, dated Feb. 13, 2023, 10 pages.
Advisory Action and Examiner-Initiated Interview Summary for U.S. Appl. No. 17/081,522, dated Jan. 23, 2023, 4 pages.
Non-Final Office Action for U.S. Appl. No. 17/081,522, dated Mar. 2, 2023, 11 pages.
Notice of Allowance for U.S. Appl. No. 16/906,129, dated Feb. 27, 2023, 10 pages.

(56) References Cited

OTHER PUBLICATIONS

Notice of Reason for Rejection for Japanese Patent Application No. 2021-560354, dated Mar. 10, 2023, 4 pages.
International Search Report and Written Opinion for International Patent Application No. PCT/US2023/061653, dated Apr. 6, 2023, 24 pages.
Notice of Allowance for U.S. Appl. No. 16/369,003, dated Mar. 30, 2023, 9 pages.
Advisory Action and Examiner-Initiated Interview Summary for U.S. Patent Application No. 16/437.878, dated Apr. 14, 2023, 4 pages.
Non-Final Office Action for U.S. Appl. No. 16/437,878, dated May 31, 2023, 19 pages.
Final Office Action for U.S. Appl. No. 17/081,522, dated Jun. 7, 2023, 11 pages.
Examination Report for European Patent Application No. 20718953.1, dated Jul. 6, 2023, 11 pages.

\* cited by examiner

ACTIVE CONTROL OF LIGHT EMITTING DIODES AND LIGHT EMITTING DIODE DISPLAYS

RELATED APPLICATIONS

This application is continuation-in-part of U.S. patent application Ser. No. 16/437,878, filed Jun. 11, 2019, which is a continuation-in-part of U.S. patent application Ser. No. 16/369,003, filed Mar. 29, 2019, the disclosures of which are hereby incorporated herein by reference in their entireties.

FIELD OF THE DISCLOSURE

The present disclosure relates to solid-state lighting devices including light-emitting diode devices and light-emitting diode displays.

BACKGROUND

Light emitting diodes (LEDs) are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from epitaxial layers of silicon carbide, gallium nitride, aluminum gallium nitride, indium nitride, gallium phosphide, aluminum nitride, gallium arsenide-based materials, and/or from organic semiconductor materials.

LEDs have been widely adopted in various illumination contexts, for backlighting of liquid crystal display (LCD) systems (e.g., as a substitute for cold cathode fluorescent lamps), and for direct-view LED displays. Applications utilizing LED arrays include vehicular headlamps, roadway illumination, light fixtures, and various indoor, outdoor, and specialty contexts. Desirable characteristics of LED devices include high luminous efficacy, long lifetime, and wide color gamut.

Conventional LCD systems require polarizers and color filters (e.g., red, green, and blue) that inherently reduce light utilization efficiency. Direct-view LED displays, which utilize self-emitting LEDs and dispense with the need for backlights, polarizers, and color filters, provide enhanced light utilization efficiency.

Large format multi-color direct-view LED displays (including full color LED video screens) typically include numerous individual LED panels, packages, and/or components providing image resolution determined by the distance between adjacent pixels or "pixel pitch." Direct-view LED displays include three-color displays with arrayed red, green, and blue (RGB) LEDs, and two-color displays with arrayed red and green (RG) LEDs. Other colors and combinations of colors may be used. Large format displays (e.g., electronic billboards and stadium displays) intended for viewing from great distances typically have relatively large pixel pitches and usually include discrete LED arrays with multi-color (e.g., red, green, and blue) LEDs that may be independently operated to form what appears to a viewer to be a full-color pixel. Medium-sized displays with relatively smaller viewing distances require shorter pixel pitches (e.g., 3 mm or less), and may include panels with arrayed red, green, and blue LED components mounted on a single electronic device attached to a driver printed circuit board that controls the LEDs. Driver printed circuit boards are typically densely populated with electrical devices including capacitors, field effect transistors (FETs), decoders, microcontrollers, and the like for driving the pixels of the display. As pixel pitches continue to decrease for higher resolution displays, the density of such electrical devices scales higher corresponding to the increased number of pixels for a given panel area. This tends to add higher complexity and costs to LED panels for display applications as well as increase thermal crowding in areas where driver electronics are more closely spaced.

The art continues to seek improved LED array devices with small pixel pitches while overcoming limitations associated with conventional devices and production methods.

SUMMARY

The present disclosure relates to light emitting diodes (LEDs), LED packages, and related LED displays, and more particularly to active control of LEDs within LED displays. LED displays may include rows and columns of LED diodes that form an array of LED pixels. A particular LED pixel may include a cluster of LED chips of the same color or multiple colors, with an exemplary LED pixel including a red LED chip, a green LED chip, and a blue LED chip. In certain embodiments, an LED package includes a plurality of LED chips that form at least one LED pixel and a plurality of such LED packages may be arranged to form an array of LED pixels for an LED display. Each LED package may include an active electrical element that is configured to receive a control signal and actively maintain an operating state, such as brightness or grey level, or a color select signal for the LED chips of the LED package while other LED packages are being addressed. In certain embodiments, the active electrical element may include active circuitry that includes one or more of a driver device, a signal conditioning or transformation device, a memory device, a decoder device, an electrostatic discharge (ESD) protection device, a thermal management device, and a detection device, among others. In this regard, each LED pixel of an LED display may be configured for operation with active matrix addressing. The active electrical element may be configured to receive one or more of an analog control signal, an encoded analog control signal, a digital control signal, and an encoded digital control signal. Display panels are disclosed that include an array of such LED pixels on a first face of a panel and control circuitry on a backside of the panel that is configured to communicate with each active electrical element of the LED pixels.

Data signals sent to active electrical elements may include compressed data codes that are subsequently decompressed, and one or more of transfer functions, gamma correction, and color depth data. Active electrical elements are disclosed that are configured to provide both forward and reverse bias states to LEDs in order to detect adverse operating conditions such as reverse leakage and deviations to forward voltage levels. Such adverse operating conditions may be performed as part of a self-check routine for an LED package. Active electrical elements as disclosed herein may comprise analog-to-digital converters (ADCs). LED packages are also disclosed that may self-configure based on the manner in which various input or output lines are connected.

In one aspect, an LED package comprises: at least one LED; and an active electrical element electrically connected to the at least one LED, the active electrical element configured to receive data values and transform the data values according to a transfer function. In certain embodiments, the transfer function is a linear function. In certain embodiments, the transfer function is a nonlinear function. In certain embodiments, the transfer function comprises one or more subsets of transfer function coefficients for the active electrical element to interpolate. In certain embodiments, the transfer function comprises a piecewise transfer function. In certain embodiments, the data values comprise a compressed data code that is received by the active electrical element, and the active electrical element is configured to transform the compressed data code to a decompressed data code. In certain embodiments, the decompressed data code comprises a brightness level for the at least one LED. In certain embodiments, the decompressed data code comprises a higher dynamic range than the compressed data code. In certain embodiments, transformation of the compressed data code to the decompressed data code follows a power law expression for gamma correction. In certain embodiments, the at least one LED comprises two or more adjacent LED pixels and the decompressed data code is determined based on a redundancy of data expected between neighboring ones of the two or more adjacent LED pixels. In certain embodiments, the data values are received from multiple sources. In certain embodiments, the active electrical element is configured to receive at least one of parameters and options of the transfer function at any of the plurality of connection ports. In certain embodiments, the plurality of connection ports comprise a plurality of polarity-agnostic connection ports. In certain embodiments, the transfer function is applied to direct a temperature measurement of the at least one LED. In certain embodiments, the transfer function is applied to direct a brightness output of the at least one LED. In certain embodiments, the active electrical element comprises an analog-to-digital converter and the transfer function is applied to an output of the analog-to-digital converter. In certain embodiments, the active electrical element comprises a pulse width modulation controller and the transfer function is applied to direct an output of the pulse width modulation controller. In certain embodiments, the active electrical element comprises a digital-to-analog converter and the transfer function is applied to direct an output of the digital-to-analog converter. In certain embodiments, the active electrical element is configured to drive the at least one LED and switch between a forward bias state and a reverse bias state for the at least one LED. In certain embodiments, the active electrical element is configured to receive selectable color depth data. In certain embodiments, the active electrical element comprises at least two bidirectional communication ports. In certain embodiments, the LED package further comprises a light-transmissive submount that comprises a first face and a second face that is opposite the first face, wherein the at least one LED and the active electrical element are mounted on the first face and the second face is a primary emission face of the LED package.

In another aspect, an LED package comprises: at least one LED; and an active electrical element electrically connected to the at least one LED, the active electrical element configured to drive the at least one LED and switch between a forward bias state and a reverse bias state for the at least one LED. In certain embodiments, the active electrical element further comprises a level sensor that is configured to provide an error signal while the at least one LED is in the reverse bias state. In certain embodiments, the active electrical element further comprises an analog-to-digital converter that is configured to provide reverse leakage measurements while the at least one LED is in the reverse bias state. In certain embodiments, the analog-to-digital converter comprises at least one of an analog filter circuit and digital filter circuitry. In certain embodiments, the analog-to-digital converter is configured to detect a voltage relating to an operating condition of the at least one LED while the at least one LED is in the reverse bias state. In certain embodiments, the analog-to-digital converter is configured to detect a voltage relating to an operating condition of the at least one LED while the at least one LED is in the forward bias state. In certain embodiments, the active electrical element is configured to adjust a drive signal of the at least one LED based on the voltage detected while the at least one LED is in the forward bias state. In certain embodiments, the drive signal comprises a pulse width modulation signal and the active electrical element is configured to adjust a pulse width modulation duty cycle of the at least one LED. In certain embodiments, the active electrical element comprises a resistor network that provides predetermined current limits to the at least one LED. In certain embodiments, the active electrical element comprises a current source that provides an adjustable current to the at least one LED. In certain embodiments, the active electrical element comprises an inverter that is configured to provide the reverse bias state. In certain embodiments, the active electrical element is configured to communicate with and respond to commands from another control element. In certain embodiments, the active electrical element is configured to receive data values and transform the data values according to a transfer function. In certain embodiments, the active electrical element is configured to receive selectable color depth data. In certain embodiments, the active electrical element comprises at least two bidirectional communication ports. In certain embodiments, the LED package further comprises a light-transmissive submount that comprises a first face and a second face that is opposite the first face, wherein the at least one LED and the active electrical element are mounted on the first face and the second face is a primary emission face of the LED package.

In another aspect, an LED package comprises: at least one LED; and an active electrical element electrically connected to the at least one LED, the active electrical element comprising at least one analog-to-digital converter. In certain embodiments, the at least one analog-to-digital converter is configured to detect a voltage relating to reverse leakage measurements of the at least one LED while the at least one LED is in a reverse bias state. In certain embodiments, the at least one analog-to-digital converter is configured to detect a voltage relating to forward voltage measurements of the at least one LED. In certain embodiments, the at least one analog-to-digital converter is configured to detect an electrical short condition of the at least one LED. In certain embodiments, the at least one analog-to-digital converter is configured to detect an electrical open condition of the at least one LED. In certain embodiments, the active electrical element is configured to adjust a pulse width modulation duty cycle of the at least one LED based on voltage levels that are detected by the at least one analog-to-digital converter. In certain embodiments, the at least one analog-to-digital converter is configured to transmit measured data from the at least one LED to the active electrical element for serial output. In certain embodiments, the at least one ADC is configured to provide at least one of reverse leakage measurements and forward voltage measurements for a plurality of LEDs. In certain embodiments, the at least one ADC is configured to provide temperature measurements by measuring a voltage provided by a thermal sensor. In certain embodiments, the active electrical element is configured to drive the at least one LED and switch between a forward bias state and a reverse bias state for the at least one LED. In certain embodiments, the active electrical element is configured to receive data values and transform the data values according to a transfer function. In certain embodiments, the active electrical element is configured to receive selectable color depth data. In certain embodiments, the active electrical element further comprises at least two bidirectional communication ports. In certain embodiments, the LED package further comprises a light-transmissive submount that comprises a first face and a second face that is opposite the first face, wherein the at least one LED and the active electrical element are mounted on the first face and the second face is a primary emission face of the LED package.

In another aspect, an LED package comprises: at least one LED; and an active electrical element electrically connected to the at least one LED, the active electrical element configured to receive selectable color depth data. In certain embodiments, the selectable color depth data is in a range including 1-bit color depth to 100-bit color depth. In certain embodiments, the selectable color depth data is selectable from any one of 24-bit, 30-bit, 36-bit, and 48-bit color depths. In certain embodiments, a particular bit depth is achieved by selecting a next-higher bit depth and zero-padding a number of least significant bits relating to the difference. In certain embodiments, the active electrical element is configured to receive data values and transform the data values according to a transfer function. In certain embodiments, the active electrical element is configured to drive the at least one LED and switch between a forward bias state and a reverse bias state for the at least one LED. In certain embodiments, the active electrical element comprises at least two bidirectional communication ports. In certain embodiments, the LED package further comprises a light-transmissive submount that comprises a first face and a second face that is opposite the first face, wherein the at least one LED and the active electrical element are mounted on the first face and the second face is a primary emission face of the LED package.

In another aspect, an LED package comprises: at least one LED; and an active electrical element electrically connected to the at least one LED, the active electrical element configured to run a self-check routine that provides an at least one output signal indicating at least one of a passing or failing condition for the at least one LED. In certain embodiments, the at least one passing or failing condition comprises a forward voltage requirement of the at least one LED. In certain embodiments, the at least one passing or failing condition comprises a reverse leakage requirement of the at least one LED. In certain embodiments, the self-check routine provides a temperature assessment for the at least one LED. In certain embodiments, the active electrical element is configured to run the self-check routine at power start-up. In certain embodiments, the active electrical element is configured to run the self-check routine when directly connected to a power source. In certain embodiments, the at least one output signal is communicated to an electrical port. In certain embodiments, the at least one output signal is communicated as an optical signal by the at least one LED. In certain embodiments, the optical signal comprises blinking the at least one LED according to one or more of predetermined colors, durations, and counts. In certain embodiments, the optical signal is configured to provide high speed communication followed by low speed communication and only the low speed communication comprises human-readable code. In certain embodiments, the self-check routine is configured to provide a time delay before the low speed communication such that the self-check routine can be aborted before transmitting the low-speed communication.

In another aspect, an LED package comprises: at least one LED; an active electrical element electrically connected to the at least one LED; and a plurality of polarity-agnostic connection ports that are connected to the active electrical element. In certain embodiments, each one of the plurality of polarity-agnostic inputs is capable of connecting with one of a supply voltage input, a ground input, a communication input, and a communication output. In certain embodiments, the active electrical element further comprises an active switching network that is connected to the plurality of polarity-agnostic connection ports. In certain embodiments, the active electrical element further comprises at least two bidirectional communication ports connected to the active switching network. In certain embodiments, the plurality of polarity-agnostic connection ports are package bond pads of the LED package.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
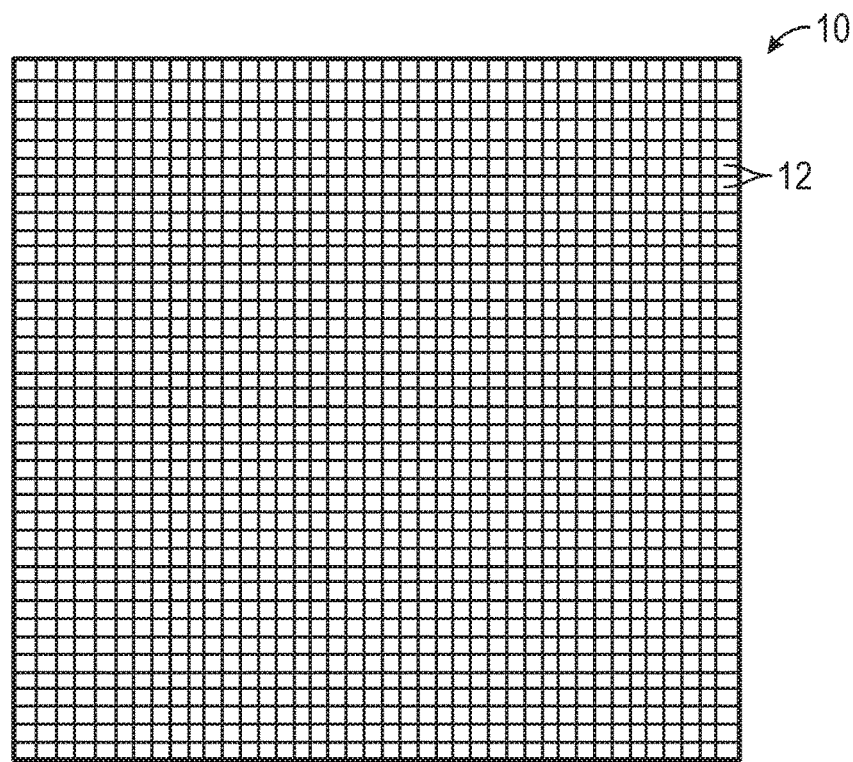
FIG. 1A is a top view of a front face of a representative display panel for a light emitting diode (LED) display that includes a plurality of active LED pixels.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "top" or "bottom" or "row" or "column" may be used herein to describe a relationship of one element, layer, surface, or region to another element, layer, surface or region as illustrated in the Figures. It will be understood that these terms and those discussed above are intended to encompass different orientations of the device in addition to the orientation depicted in the Figures. For example, if the apparatus in a particular Figure is turn over, an element, layer, surface or region described as "above" would now be oriented as "below."

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to light emitting diodes (LEDs), LED packages, and related LED displays, and more particularly to active control of LEDs within LED displays. LED displays may include rows and columns of LEDs that form an array of LED pixels. A particular LED pixel may include a cluster of LED chips of the same color or multiple colors, with an exemplary LED pixel including a red LED chip, a green LED chip, and a blue LED chip. In certain embodiments, an LED package includes a plurality of LED chips that form at least one LED pixel and a plurality of such LED packages may be arranged to form an array of LED pixels for an LED display. Each LED package may include an active electrical element that is configured to receive a control signal and actively maintain an operating state, such as brightness or grey level, or a color select signal for the LED chips of the LED package while other LED packages are being addressed. In certain embodiments, the active electrical element may include active circuitry that includes one or more of a driver device, a signal conditioning or transformation device, a memory device, a decoder device, an electrostatic discharge (ESD) protection device, a thermal management device, and a detection device, among others. In this regard, each LED pixel of an LED display may be configured for operation with active matrix addressing. The active electrical element may be configured to receive one or more of an analog control signal, an encoded analog control signal, a digital control signal, and an encoded digital control signal. Display panels are disclosed that include an array of such LED pixels on a first face of a panel and control circuitry on a backside of the panel that is configured to communicate with each active electrical element of the LED pixels.

LED packages are disclosed that are configured to receive a data stream that includes a plurality of data packets. Each data packet may include an identifier that enables each LED package of an array that receives the data packet to take one or more actions based on the identifier or a series of identifiers. Various additional data packets are disclosed including talk-back data packets, data packets for all LED packages that receive a data stream, and continuation data packets. LED packages with selectively assignable communication ports are also disclosed. Data signals and data packets sent to active electrical elements may include compressed data codes that are subsequently decompressed, and one or more of transfer functions, gamma correction, and color depth data. Active electrical elements are disclosed that are configured to provide both forward and reverse bias states to LEDs in order to detect adverse operating conditions such as reverse leakage and deviations to forward voltage levels. Such adverse operating conditions may be performed as part of a self-check routine for an LED package. Active electrical elements as disclosed herein may comprise analog-to-digital converters (ADCs). LED packages are also disclosed that may self-configure based on the manner in which various input or output lines are connected.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including but not limited to, buffer layers, nucleation layers, super lattice structures, un-doped layers, cladding layers, contact layers, current-spreading layers, and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. For example, the active LED structure for various LEDs may emit blue light with a peak wavelength range of approximately 430 nanometers (nm) to 480 nm, green light with a peak wavelength range of 500 nm to 570 nm, or red light with a peak wavelength range of 600 nm to 650 nm. The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{1-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips.

Light emitted by the active layer or region of the LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer may be arranged between the metal reflector layer and first and second electrical contacts, wherein the first electrical contact is arranged in conductive electrical communication with a first semiconductor layer, and the second electrical contact is arranged in conductive electrical communication with a second semiconductor layer. In some embodiments, the first and second electrical contacts themselves may be configured as mirror layers. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (for example, at least 80% reflective) may be considered a reflective material. In the case of ultraviolet (UV) LEDs, appropriate materials may be selected to provide a desired, and in some embodiments high reflectivity; and/or a desired, and in some embodiments low, absorption. In certain embodiments, a "light-transmissive" material may be configured to transmit at least 50% of emitted radiation of a desired wavelength. In certain embodiments, an initially "light-transmissive" material may be altered to be a "light-absorbing material" that transmits less than 50% of emitted radiation of a desired wavelength with the addition of one or more light-absorbing materials, such as opaque or non-reflective materials including grey, dark, or black particles or materials.

The present disclosure can be useful for LED chips having a variety of geometries, such as vertical geometry or lateral geometry. A vertical geometry LED chip typically includes anode and cathode connections on opposing sides of the LED chip. A lateral geometry LED chip typically includes both anode and cathode connections on the same side of the LED chip that is opposite a substrate, such as a growth substrate. Certain embodiments disclosed herein relate to the use of flip chip LED devices in which a light transmissive substrate represents an exposed light emitting surface.

LED chips or LED packages that include one or more LED chips can be arranged in many different applications to provide illumination of objects, surfaces, or areas. In certain applications, clusters of differently colored LED chips or LED packages may be arranged as pixels for LED display applications, including video displays. For example, individual clusters of red, green, and blue LED chips may form LED pixels of a larger LED display. In certain applications, the red, green, and blue LED chips of each pixel may be packaged together as a multiple-LED package and the LED display is formed when arrays of such multiple-LED packages are arranged together. In this regard, each pixel may include a single LED package that includes a red LED chip, a green LED chip, and a blue LED chip. In other embodiments, the red, green, and blue LED chips may be separately packaged or arranged in a chip-on-board configuration. In certain LED display applications, arrays of LED pixels are arranged on panels, which may also be referred to as tiles or LED modules, and arrays of such panels are arranged together to form larger LED displays. Depending on the application, each panel of an LED display may include different numbers of LED pixels. In certain applications, each panel of an LED display may include an array formed by 64 rows by 64 columns of LED pixels or more. In certain embodiments, each panel of an LED display may be configured with a horizontal display resolution of about 4,000 LED pixels, or 4K resolution. For applications where higher screen resolution is desired for LED displays, each panel may include even more rows and columns of LED pixels that are more closely spaced to one another. Depending on the desired screen resolution, pixel pitches may be about 3 millimeters (mm), or about 2.5 mm, or about 1.6 mm, or in a range from about 1.5 mm to about 3 mm, or in a range from about 1.6 mm to about 3 mm, or in a range from about 1.5 mm to about 2.5 mm. Additionally, for fine pitch LED displays with even higher screen resolutions, pixel pitches may be configured to be less than 1 mm, or less than 0.8 mm, or in a range from about 0.5 mm to about 1 mm, or about 0.7 mm for certain embodiments.

In conventional video display applications, the LED pixels are typically configured for passive matrix addressing. In this regard, the LED pixels may be arranged for coupling to a passive interface element that provides electrical connections to a separate driver or controller. For example, orthogonally arranged (e.g., vertical and horizontal) conductors form rows and columns in a grid pattern, whereby individual LED chips of each LED pixel are defined by each intersection of a row and column. Multiplex sequencing may be used to permit individual control of each LED chip of the array while employing a smaller number of conductors than the number of LED chips in the array, either by utilizing a common-row anode or common-row cathode matrix arrangement, and brightness control may be provided by pulse width modulation. In this manner, conductors for rows or columns are shared among many LED pixels and time division multiplexing is employed to address each individual LED pixel. Due to their passive configuration, each LED pixel only emits light within their respective communication times. The separate drivers for controlling the display are typically arranged remotely from the pixels of the display, such as on a separate board or module, or on a printed circuit board (PCB) that is attached or otherwise mounted to the backside of each panel, or on the backside of a common PCB that includes an array of pixels on the frontside. As previously, described, the PCBs are typically densely populated with electrical devices including capacitors, field effect transistors (FETs), decoders, microcontrollers, and the like for driving each of the pixels on a particular panel. For higher resolution displays, the density of such electrical devices scales higher corresponding to the increased number of pixels on each panel. As previously described, this can add higher complexity and costs to LED panels for display applications as well as increase thermal crowding in areas where driver electronics are more closely spaced. For passive matrix addressing, the LED pixels are typically driven by pulsed signal sequences. In this regard, the LED pixels may pulse rapidly at certain frequencies, such as 60 hertz (Hz) or 120 Hz depending on the display scan rate. While the video display may not appear to be rapidly pulsing to a human eye, it may be detectable with image capture equipment, and in some instances, interference beating can be present between the video display and other pulsed displays or light sources that are in proximity with the video display.

According to embodiments disclosed herein, each LED pixel of an LED display may be configured for operation with active matrix addressing. For active matrix addressing, each LED pixel is configured to actively maintain an operating or driving state, such as brightness or grey level, or color select, while other LED pixels are being addressed, thereby allowing each LED pixel to maintain their driving state with either reduced pulsing or no pulsing depending on the driving configuration. Accordingly, each LED pixel may be configured to hold its respective operating state with a continuous drive signal, rather than by pulsed signals associated with passive matrix addressing. In this regard, each LED pixel may include an active electrical chip or an active electrical element that may include a memory device and the ability to alter a driving condition or drive condition of the LED pixel based on a memory from the memory device. In certain embodiments, the continuous drive signal is a constant analog drive current, and in other embodiments where the brightness level may be controlled by pulsed methods such as pulse width modulation (PWM), the continuous drive signal may refer to a PWM signal that is not interrupted by the scanning of other LED pixels within the array or within a sub-array. In certain embodiments, the active electrical chip may include active circuitry that includes one or more of a driver device, a signal conditioning or transformation device, a memory device, a decoder device, an ESD protection device, a thermal management device, and a detection device, among others. As used herein, the term "active electrical chip," "active electrical element," or "active electrical component" includes any chip or component that is able to alter a driving condition of an LED based on memory or other information that may be stored within a chip or component. As used herein, the term "active LED pixel" includes one or more LED devices that form a pixel and an active electrical chip as described above. In certain embodiments, each LED pixel may comprise a single LED package that is configured as an active LED package that includes multiple LED chips and an active electrical element as described above. In this manner, the number of separate electrical devices needed for the LED display may be reduced, such as the separate electrical devices located on the backsides of LED panels of the LED display as previously described. Additionally, overall operating powers needed to run the LED panels may be reduced.

Figure 1B:
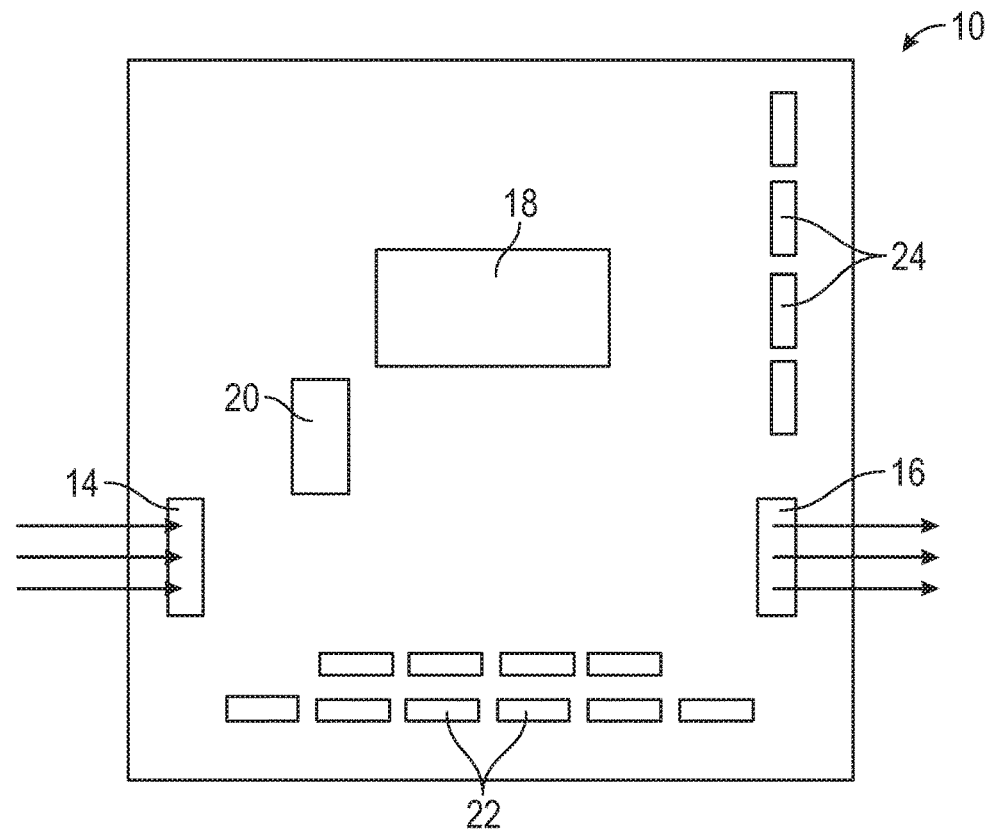
FIG. 1B is a bottom view of a back face of the representative display panel of FIG. 1A.

FIG. 1A is a top view of a front face of a representative display panel 10 for an LED display that includes a plurality of active LED pixels 12. As illustrated, the plurality of active LED pixels 12 may be arranged in rows and columns to form an array of active LED pixels 12 across the front face of the display panel 10. In certain embodiments, each of the active LED pixels 12 are configured with an active electrical element that includes the ability to receive an input signal, store a memory based on the input signal, alter a driving condition of LEDs within each active LED pixel 12 based on the stored memory, and update the driving condition each time the memory is updated by the input signal. In certain embodiments, each active LED pixel 12 comprises an LED package that includes a plurality of LED chips that form a LED pixel and the active electrical element. FIG. 1B is a bottom view of a back face of the representative display panel 10 of FIG. 1A. All illustrated, the display panel 10 may include additional passive or active elements that are configured to receive, process, and distribute signals to the active LED pixels (12 of FIG. 1A). For example, the display panel 10 may include an input signal connector 14 and an output signal connector 16, each of which may be configured as a video source connector, including a video graphics array (VGA) connector, a digital visual interface (DVI) connector, a high-definition multimedia interface (HDMI) connector, or a DisplayPort connector, among others. The display panel 10 may comprise a control element 18 that includes control circuitry, such as a semiconductor control element. The control element 18 may be configured to receive an input signal via the input signal connector 14 and output control signals for the active LED pixels. As will later be described in more detail, the active electrical element of each LED pixel is configured to independently alter a driving condition of each LED chip within the LED pixel in response to the control signals that are outputted from the control element 18. In certain embodiments, the control element 18 comprises an integrated circuit, such as one or more of an application-specific integrated circuit (ASIC), a microcontroller, a programmable control element, and a field-programmable gate array (FPGA). In certain embodiments, a plurality of control elements 18 may be configured on or registered with each display panel 10. A decoder element 20 may be configured to receive and route the control signals from the control element 18 to a plurality of signal lines for the active LED pixels (12 of FIG. 1A). In certain embodiments, one or more digital-to-analog converters (DACs) 22 may be provided to convert digital signals from the control element 18 and the decoder element 20 before reaching the active LED pixels (12 of FIG. 1A). The display panel 10 may also include other passive or active elements 24, which may include additional decoders, resistors, capacitors, or other electrical elements or circuits for video displays. In this manner, the signal connectors 14 and 16, the control element 18, the decoder element 20, the DACs 22, and the other passive or active elements 24 are registered with the display panel 10. In alternative embodiments, the back face of the display panel 10 may comprise another plurality of LED packages that form another array of LED pixels. In this regard, the display panel 10 may be configured for a double-sided display application. In such embodiments, at least some of the signal connectors 14 and 16, the control element 18, the decoder element 20, the DACs 22, and the other passive or active elements 24 may be registered with the display panel 10 in locations other than the back face in configurations to provide control signals from one or more edges of the display panel 10.

Figure 2A:
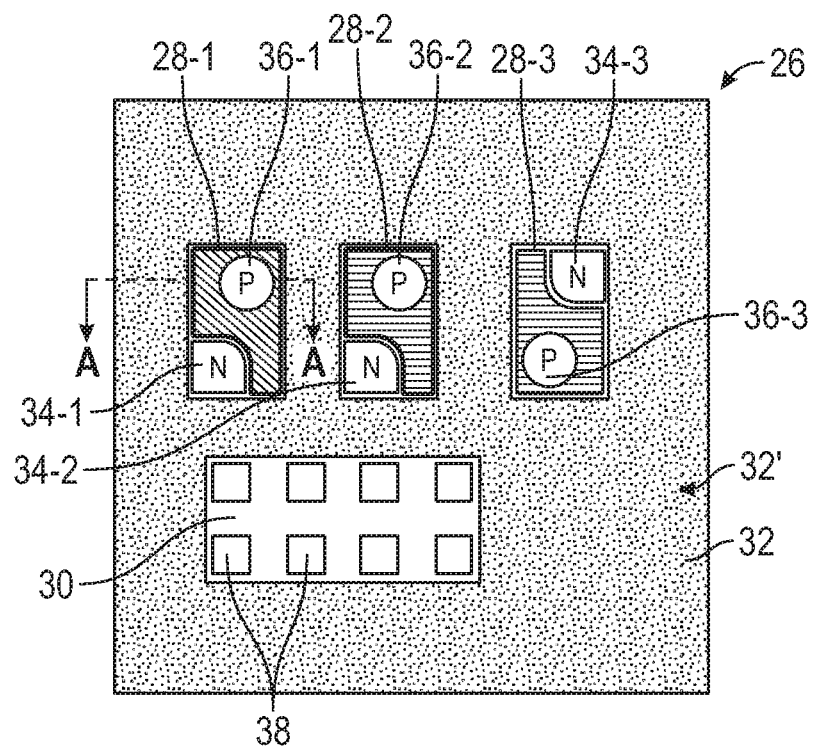
FIG. 2A is a bottom view of an LED package at a particular state of fabrication where a plurality of LEDs and an active electrical element are mounted on a submount.

FIGS. 2A-2I illustrate various states of fabrication for an LED package 26 that includes a plurality of LEDs 28-1 to 28-3 and an active electrical element 30 according to embodiments disclosed herein. In certain embodiments, separate LED packages 26 may be configured to form each of the active LED pixels (12 of FIG. 1A) in a display panel (10 of FIG. 1A). The active electrical element 30 may also be referred to as an active electrical chip or an active electrical component. FIG. 2A is a bottom view of the LED package 26 at a particular state of fabrication where the plurality of LEDs 28-1 to 28-3 and the active electrical element 30 are mounted on a submount 32. In particular, the plurality of LEDs 28-1 to 28-3 and the active electrical element 30 may be mounted on a first face 32' of the submount 32. A light transmissive die attach material may be arranged between the plurality of LEDs 28-1 to 28-3 and the submount 32 to facilitate mounting. Each of the plurality of LEDs 28-1 to 28-3 may include a corresponding cathode contact 34-1 to 34-3 (e.g., an n-type contact pad) and a corresponding anode contact 36-1 to 36-3 (e.g., a p-type contact pad). In certain embodiments, the plurality of LEDs 28-1 to 28-3 comprise individual LED chips that generate different dominant wavelengths of light. For example, the LED 28-1 may be configured to generate predominantly green emissions, the LED 28-2 may be configured to generate predominantly blue emissions, and the LED 28-3 may be configured to generate predominantly red emissions. Accordingly, the plurality of LEDs 28-1 to 28-3 may comprise a green LED chip, a blue LED chip, and a red LED chip. In other embodiments, different combinations of colors and numbers of LEDs are possible. In still further embodiments, each of the plurality of LEDs 28-1 to 28-3 may be configured to generate light emissions that are predominantly the same as one another. In other embodiments, the plurality of LEDs 28-1 to 28-3 may comprise a micro-LED structure where a common active LED structure is segregated into a plurality of active LED structure portions to form the plurality of LEDs 28-1 to 28-3 that may be independently addressable from one another.

In certain embodiments, the active electrical element 30 is configured to receive a signal or a plurality of signals and independently drive each LED of the plurality of LEDs 28-1 to 28-3. In certain embodiments, the active electrical element 30 includes a memory element, chip, or component that is configured to store one or more operating states for the plurality of LEDs 28-1 to 28-3 that are received from an external source, such as the control element (18 of FIG. 1B). The active electrical element 30 may further be configured to alter one or more driving conditions of the plurality of LEDs 28-1 to 28-3 based on the one or more stored operating states. In certain embodiments, the active electrical element 30 is configured to independently alter a driving condition of each LED of the plurality of LEDs 28-1 to 28-3 based on a plurality of operating states that are stored by the memory element. In this regard, the active electrical element 30 may be configured to receive and store one or more operating states, and independently drive each LED of the plurality of LEDs 28-1 to 28-3 according to one or more operating states. The active electrical element 30 may continue to drive and maintain the operating state for each LED of the plurality of LEDs 28-1 to 28-3 until the active electrical element 30 receives refreshed or updated signals that correspond to updated operating states. In this manner, the active electrical element 30 may be configured to alter a driving condition of the plurality of LEDs 28-1 to 28-3 in accordance to a temporarily stored operating state of the memory element. Accordingly, the plurality of LEDs 28-1 to 28-3 may be configured for active matrix addressing as previously described. In order to rapidly receive one or more operating states for the plurality of LEDs 28-1 to 28-3, the active electrical element 30 may include a plurality of contact pads 38. In certain embodiments, certain contact pads of the plurality of contact pads 38 are configured to receive one or more signals and other contact pads of the plurality of contact pads 38 are configured to send signals to independently drive or address the plurality of LEDs 28-1 to 28-3. In certain embodiments, the active electrical element 30 comprises one or more of an integrated circuit chip, an ASIC, a microcontroller, or a FPGA. In certain embodiments, the active electrical element 30 may be configured to be programmable or reprogrammable after it is manufactured through various memory elements and logic that are incorporated within the active electrical element 30. In this regard, the active electrical element 30 may be considered programmable for embodiments where the active electrical element 30 does not include a full FPGA.

The submount 32 can be formed of many different materials with a preferred material being electrically insulating. Suitable materials include, but are not limited to ceramic materials such as aluminum oxide or alumina, AlN, or organic insulators like polyimide (PI) and polyphthalamide (PPA). In other embodiments the submount 32 can comprise a PCB, sapphire, Si or any other suitable material. For PCB embodiments, different PCB types can be used such as standard FR-4 PCB, bismaleimide-triazine (BT), or related materials, metal core PCB, or any other type of PCB. In certain embodiments, the submount 32 comprises a light-transmissive material such that light emissions from the plurality of LEDs 28-1 to 28-3 may pass through the submount 32. In this regard, a light emitting face of each of the plurality of LEDs 28-1 to 28-3 may be mounted to the submount 32. Suitable light-transmissive materials for the submount 32 include glass, sapphire, epoxy, and silicone. In certain embodiments where the submount 32 is a light-transmissive submount, the submount 32 may be referred to as a superstrate. The term "superstrate" is used herein, in part, to avoid confusion with other substrates that may be part of the semiconductor light emitting device, such as a growth or carrier substrate of an LED chip or a different submount for the LED package 26. The term "superstrate" is not intended to limit the orientation, location, and/or composition of the structure it describes. In certain embodiments, the submount 32 may comprise a light-transmissive superstrate and the LED package 26 may be devoid of another submount. In other embodiments, the submount 32 may comprise a light-transmissive superstrate and the LED package 26 comprises an additional submount, wherein the plurality of LEDs 28-1 to 28-3 are arranged between the submount 32 and the additional submount.

Figure 2B:
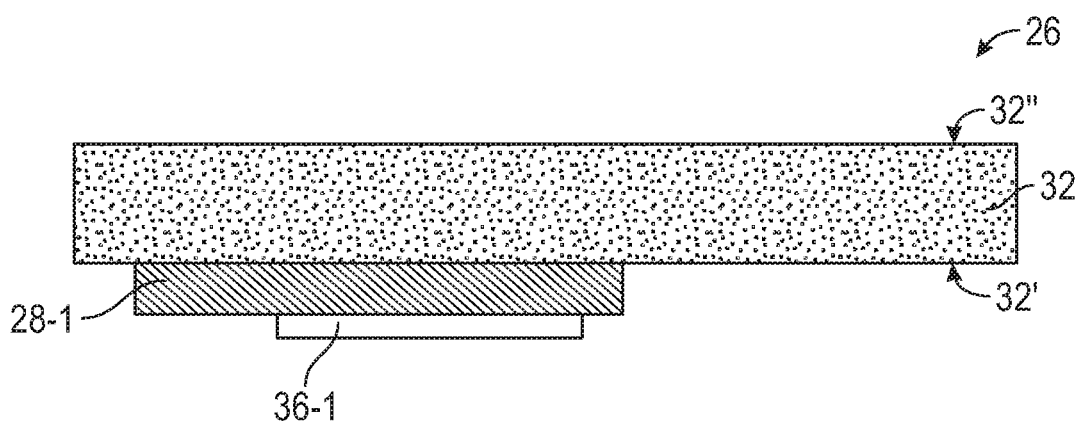
FIG. 2B is a cross-sectional view taken along the section line A-A of FIG. 2A.

FIG. 2B is a cross-sectional view taken along the section line A-A of FIG. 2A. As illustrated, the LED 28-1 is mounted to the first face 32' of the submount 32. Accordingly, emissions from the LED 28-1 may be configured to pass through the submount 32 such that a second face 32" of the submount 32 is configured as a primary emission face of the LED package 26. Notably, the anode contact 36-1 and the cathode contact (34-1) of the LED 28-1 are arranged on an opposite side of the LED 28-1 relative to the submount 32. In this regard, light emissions from the LED 28-1 may pass through the submount and out of the opposite face 32" without interacting or being absorbed by the anode contact 36-1 and the cathode contact (34-1). The orientation of the cross-sectional view in FIG. 2B is intended to illustrate that the second face 32" of the submount 32 will be configured as the primary light emission face; however, during intermediate fabrication steps, the orientation of FIG. 2B and subsequent cross-sectional fabrication views may be rotated 180 degrees such that the LED 28-1 is assembled sequentially above the submount 32.

Figure 2C:
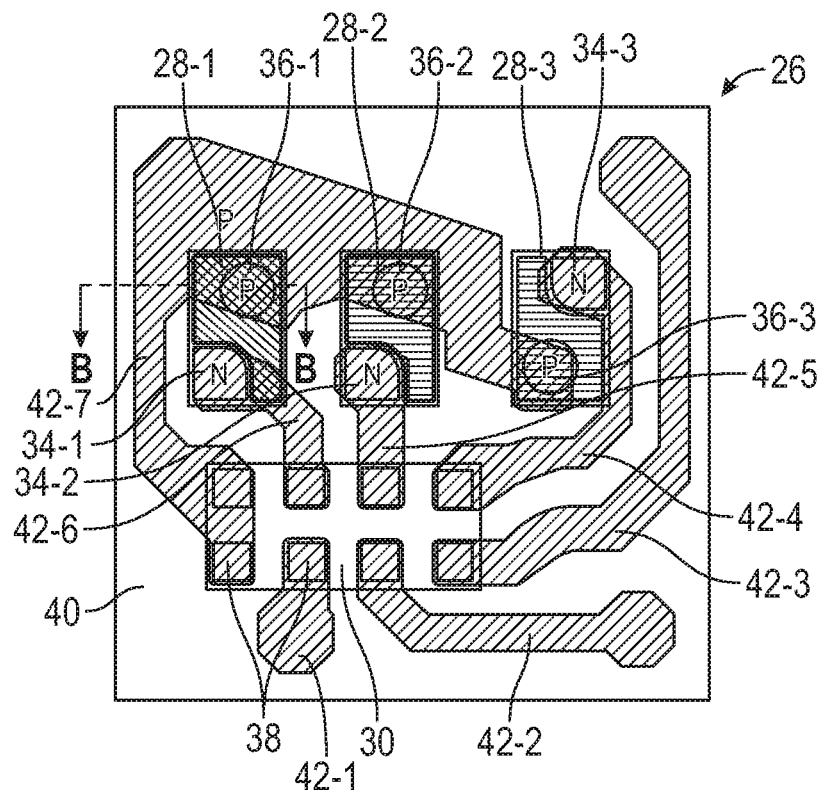
FIG. 2C is a bottom view of the LED package of FIG. 2A at a subsequent state of fabrication where an encapsulant layer and a plurality of electrically conductive traces have been formed.
Figure 2D:
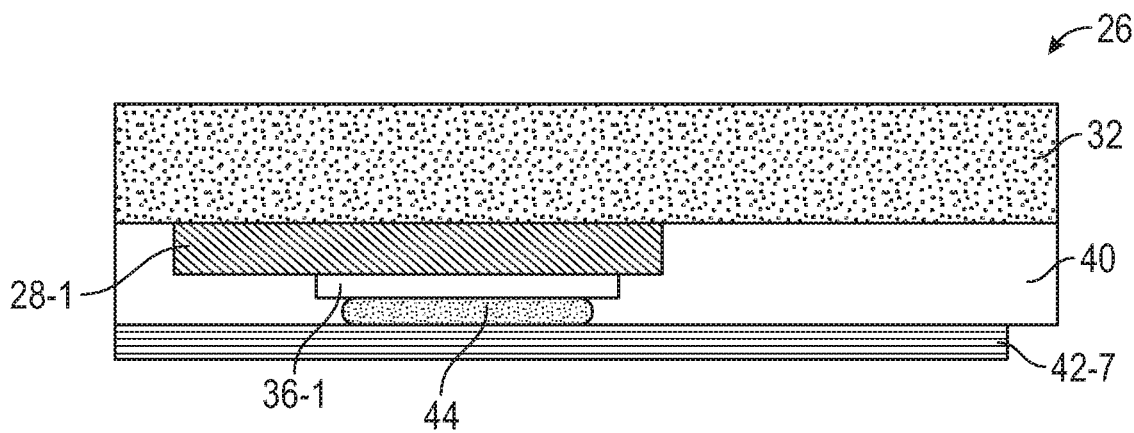
FIG. 2D is a cross-sectional view taken along the section line B-B of FIG. 2C.

FIG. 2C is a bottom view of the LED package 26 of FIG. 2A at a subsequent state of fabrication where an encapsulant layer 40 and a plurality of electrically conductive traces 42-1 to 42-7 have been formed. FIG. 2D is a cross-sectional view taken along the section line B-B of FIG. 2C where an electrical connector 44 is visible. Before formation of the encapsulant layer 40 and the plurality of electrically conductive traces 42-1 to 42-7, a plurality of electrical connectors 44 may be formed over the cathode contacts 34-1 to 34-3 and the anode contacts 36-1 to 36-3 of each of the plurality of LEDs 28-1 to 28-3. The plurality of electrical connectors 44 may also be formed over the plurality of contact pads 38 of the active electrical element 30. In certain embodiments, the plurality of electrical connectors 44 may include at least one of a metal bump bond, a metal pad, a metal wire, a metal interconnect, and a metal pedestal, among others. The plurality of electrical connectors 44 may be formed by a variety of methods, including but not limited to, wire bump bonding, solder bumping, plating, laser drilling of vias that are subsequently filled with metal, or other metallization formation techniques. Electrical connectors 44 may be formed at the wafer-level, before component assembly, after die attach of the LEDs 28-1 to 28-3, or at other fabrication steps depending upon various process configurations. After formation of the plurality of electrical connectors 44, the encapsulant layer 40 may be blanket deposited to cover the plurality of LEDs 28-1 to 28-3 and the active electrical element 30. In certain embodiments, the encapsulant layer 40 may further cover the plurality of electrical connectors 44. The encapsulant layer 40 may be configured to surround perimeter or lateral edges of each LED of the plurality of LEDs 28-1 to 28-3. As illustrated in FIG. 2D, the encapsulant layer 40 may cover at least a portion of a bottom surface of each LED of the plurality of LEDs 28-1 to 28-3. The encapsulant layer 40 may also be configured to surround perimeter or lateral edges of the active electrical element 30. In such embodiments, a removal step may be subsequently applied to the encapsulant layer 40 such that a portion of the encapsulant layer 40 is removed to form exposed surfaces of the plurality of electrical connectors 44. The removal step may comprise a planarizing process, such as grinding, lapping, or polishing the encapsulant layer 40 to expose the plurality of electrical connectors 44. For embodiments, where the plurality of electrical connectors 44 comprise laser drilled vias or microvias, the removal step may not be required.

The encapsulant layer 40 may be applied or deposited by a coating or dispensing process. In certain embodiments, the encapsulant layer 40 may comprise one or more of a silicone, an epoxy, and a thermoplastic such as polycarbonate, aliphatic urethane, or polyester, among others. The encapsulant layer 40 may be configured to alter or control light output from the plurality of LEDs 28-1 to 28-3. For example, the encapsulant layer 40 may comprise an opaque or non-reflective material, such as a grey, dark, or black material that may absorb some light that travels between the plurality of LEDs 28-1 to 28-3, thereby improving contrast between emissions of the plurality of LEDs 28-1 to 28-3 that pass through the submount 32. In certain embodiments, the encapsulant layer 40 may include light-absorbing particles suspended in a binder such as silicone or epoxy. The light-absorbing particles may include at least one of carbon, silicon, or metal particles or nanoparticles. In certain embodiments, the light-absorbing particles comprise a predominantly black color that when suspended in the binder, provide a predominantly black or dark color for the encapsulant layer 40. Depending on the desired application, the encapsulant layer 40 may be configured as clear or light-transmissive, or the encapsulant layer 40 may comprise a light-reflecting or light-redirecting material such as fused silica, fumed silica, or titanium dioxide ($TiO_2$) particles that form a predominantly white color for the encapsulant layer 40. Other particles or fillers may be used to enhance mechanical, thermal, optical, or electrical properties of the encapsulant layer 40. In certain embodiments, the encapsulant layer 40 may include multiple layers with varying mechanical, thermal, optical, or electrical properties.

After surfaces of the electrical connectors 44 are exposed through the encapsulant layer 40, the plurality of electrically conductive traces 42-1 to 42-7 are formed on the encapsulant layer 40 (e.g., on a bottom surface of the encapsulant layer 40 for the orientation illustrated in FIG. 2D) and certain ones of the electrically conductive traces 42-4 to 42-7 are electrically connected to the plurality of LEDs 28-1 to 28-3 by way of exposed surfaces of certain electrical connectors 44. Certain ones of the plurality of electrically conductive traces 42-1 to 42-7 may be configured to provide electrically conductive paths between the plurality of contact pads 38 of the active electrical element 30 and the cathode contacts 34-1 to 34-3 and the anode contacts 36-1 to 36-3 of each LED 28-1 to 28-3. As illustrated in FIG. 2C, the electrically conductive traces 42-1, 42-2, and 42-3 are electrically connected to the active electrical element 30, but are not electrically connected to any of the plurality of LEDs 28-1 to 28-3. In this regard, the electrically conductive traces 42-1, 42-2, and 42-3 may be configured to supply signals to the active electrical element 30 from an external source (such as the control element 18 of FIG. 1B). Notably, the electrically conductive trace 42-7 in FIG. 2C is configured to provide an electrically conductive path between the active electrical element 30 and the anode contacts 36-1 to 36-3 of each of the plurality of LEDs 28-1 to 28-3. In this regard, the plurality of LEDs 28-1 to 28-3 may be configured for common anode control. In other embodiments, the plurality of electrically conductive traces 42-1 to 42-7 and the plurality of LEDs 28-1 to 28-3 may be configured for common cathode control.

Figure 2E:
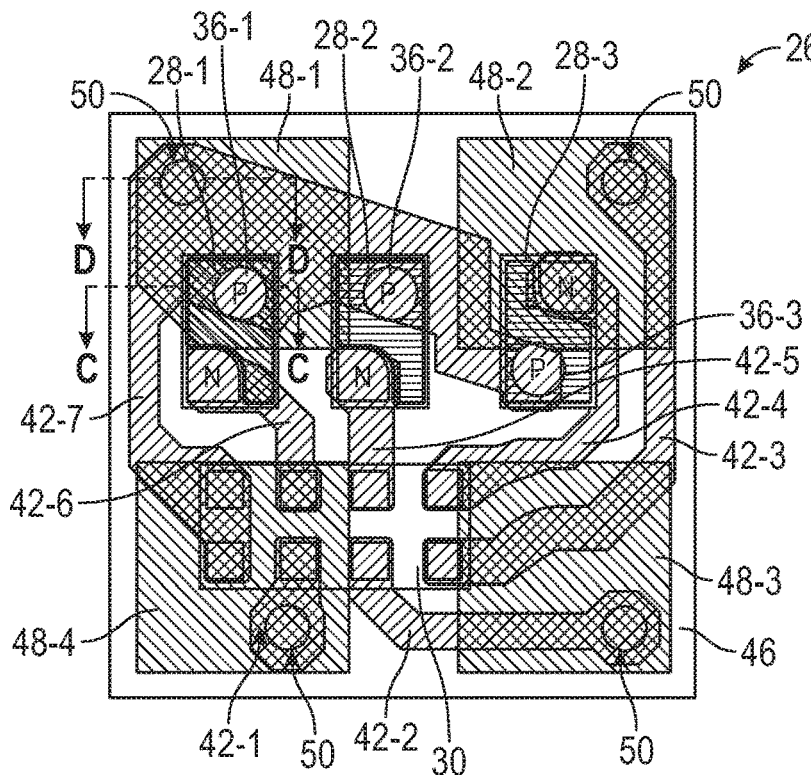
FIG. 2E is a bottom view of the LED package of FIG. 2C at a subsequent state of fabrication where an additional encapsulant layer and a plurality of package bond pads have been formed.
Figure 2F:
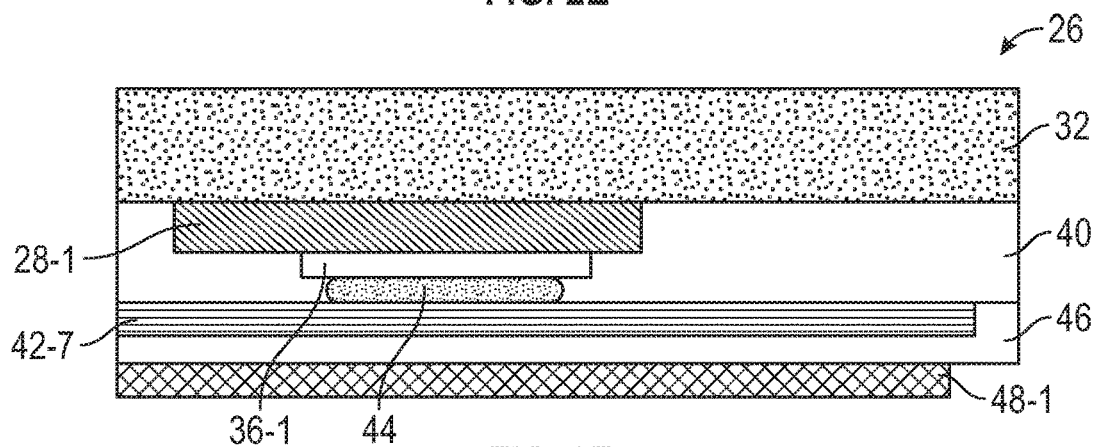
FIG. 2F is a cross-sectional view taken along the section line C-C of FIG. 2E.
Figure 2G:
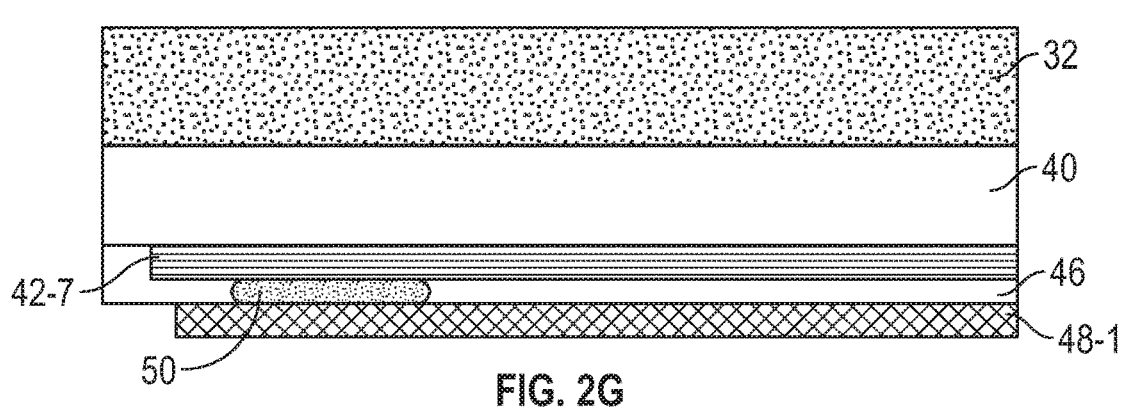
FIG. 2G is a cross-sectional view taken along the section line D-D of FIG. 2E.

FIG. 2E is a bottom view of the LED package 26 of FIG. 2C at a subsequent state of fabrication where an additional encapsulant layer 46 and a plurality of package bond pads 48-1 to 48-4 have been formed. FIG. 2F is a cross-sectional view taken along the section line C-C of FIG. 2E. FIG. 2G is a cross-sectional view taken along the section line D-D of FIG. 2E where an additional electrical connector 50 is visible. Before formation of the additional encapsulant layer 46 and the plurality of package bond pads 48-1 to 48-4, a plurality of additional electrical connectors 50 may be formed on and in electrical connection with the electrically conductive traces 42-1, 42-2, 42-3, and 42-7. The additional electrical connectors 50 may be configured and formed in a similar manner to the previously described electrical connectors 44. In certain embodiments, the additional electrical connectors 50 may be formed on the electrical connectors 44 without an intervening electrically conductive trace. Alternatively, the additional encapsulant layer 46 may be applied first and vias or openings for the additional electrical connectors 50 may be formed subsequently by a selective removal step such as laser drilling. In a similar manner, a selective removal step may also be used to form openings for the previously described electrical connectors 44. The additional encapsulant layer 46 may then be blanket deposited to cover bottom surfaces of the plurality of electrically conductive traces 42-1 to 42-7 as well as the additional electrical connectors 50. The additional encapsulant layer 46 may be configured and formed in a similar manner to the previously described encapsulant layer 40. Notably, the additional encapsulant layer 46 may also be formed on portions of the encapsulant layer 40 that are uncovered by the plurality of electrically conductive traces 42-1 to 42-7. In this regard, the encapsulant layer 40 and the additional encapsulant layer 46 may together form an encapsulant layer 40, 46 that is continuous such that at least some portions of the plurality of electrically conductive traces 42-1 to 42-7 are embedded within the encapsulant layer 40, 46. After formation of the additional encapsulant layer 46, a removal step (e.g., planarization) as previously described may be applied to form exposed surfaces of the plurality of additional electrical connectors 50. The plurality of package bond pads 48-1 to 48-4 may then be formed on the bottom surface of the additional encapsulant layer 46 and in electrical communication with the additional electrical connectors 50. In this regard, the package bond pads 48-1 to 48-4 are configured to receive signals that are external to the LED package 26. In certain embodiments, the package bond pads 48-1 to 48-4 are configured to be mounted and bonded to another surface (e.g., a mounting surface of an LED panel that includes electrical traces or other types of signal lines) to receive external signals (e.g., from the control element 18 of FIG. 1B). As illustrated, the package bond pad 48-4 is electrically connected to the active electrical element 30 by an electrical path that includes a certain additional electrical connector 50 and the electrically conductive trace 42-1. In a similar manner, the package bond pad 48-3 is electrically connected to the active electrical element 30 by a different electrical path that includes a different additional electrical connector 50 and the electrically conductive trace 42-2. The package bond pad 48-2 is electrically connected to the active electrical element 30 by a different electrical path that includes a different additional electrical connector 50 and the electrically conductive trace 42-3. Notably, the package bond pad 48-1 is electrically connected to the anode contacts 36-1 to 36-3 of each of the LEDs 28-1 to 28-3 by a different additional electrical connector 50 and the electrically conductive trace 42-7 in a configuration for common anode control. As previously described, the LED package 26 could be configured for common cathode control be rearranging the routing of the plurality of electrically conductive traces 42-1 to 42-7. Additional layers, such as a solder mask or other insulating layers or materials may be applied on selected areas of the additional encapsulant layer 46 and the package bond pads 48-1 to 48-4 to further delineate the footprint of the package bond pads 48-1 to 48-4 and prevent shorting of solder material when assembled or mounted on a PCB. In certain embodiments, a plurality of additional encapsulant layers 46 and at least one additional electrical trace may be formed in a similar manner before the package bond pads 48-1 to 48-4 are formed. In this manner, additional layers of electrical traces may be laminated or alternating with the plurality of additional encapsulant layers 46 to provide more electrically conductive paths and connections for the LED package 26.

Figure 2H:
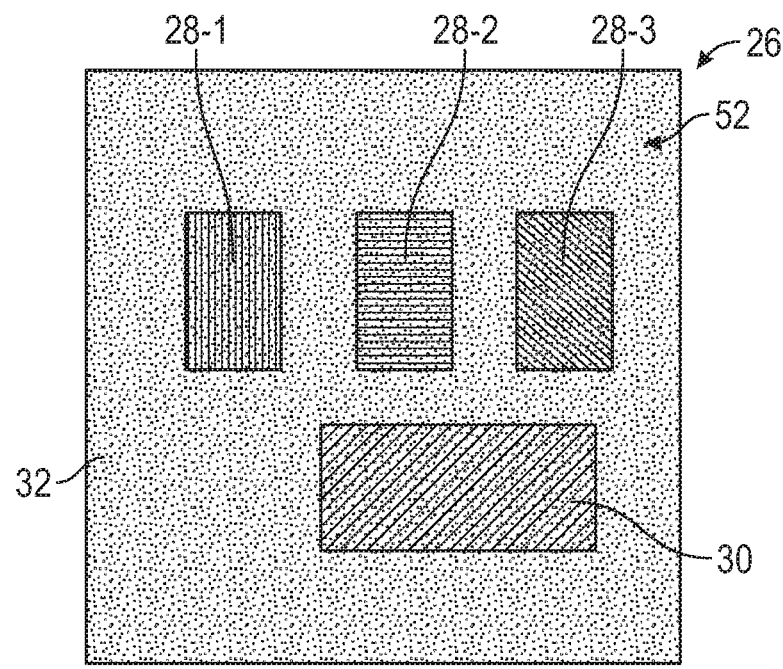
FIG. 2H is a simplified top view of the LED package of FIG. 2E.

FIG. 2H is a simplified top view of the LED package 26 of FIG. 2E. In operation, the view illustrated by FIG. 2H represents a primary emission face 52 of the LED package 26. The plurality of LEDs 28-1 to 28-3 are accordingly configured below the submount 32 to provide light emissions that pass through submount 32 (e.g., a light-transmissive submount or light-transmissive superstrate). The active electrical element 30 is also configured below the submount 32 and all electrical connections and electrically conductive paths as previously described are accordingly arranged below the active electrical element 30 and below the plurality of LEDs 28-1 to 28-3 relative to the primary emission face 52. Accordingly, light generated from the plurality of LEDs 28-1 to 28-3 may pass through the submount 32 and out of the primary emission face 52 with reduced losses or absorption to electrical connections, electrically conductive paths, or other elements within the LED package 26. In certain embodiments, the plurality of LEDs 28-1 to 28-3 form an LED pixel for the LED package 26 that can be combined with other LED packages to form an LED pixel array for video display applications.

Figure 2I:
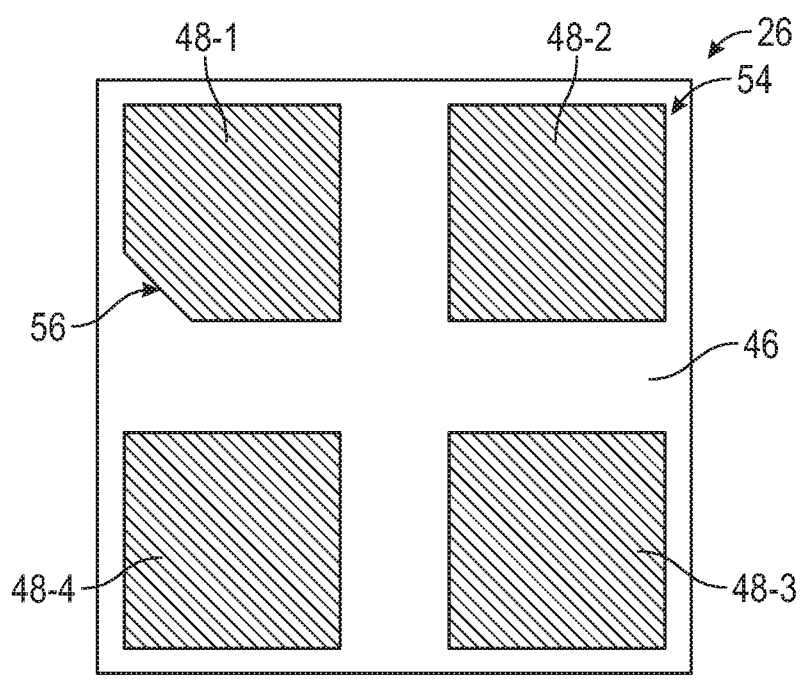
FIG. 2I is a simplified bottom view of the LED package of FIG. 2E.

FIG. 2I is a simplified bottom view of the LED package 26 of FIG. 2E. In operation, the bottom view illustrated by FIG. 2I represents a primary mounting face 54 of the LED package 26. In this regard, the LED package 26 is configured to be mounted to an external surface (e.g., a panel or PCB of a video display) such that the package bond pads 48-1 to 48-4 are bonded or soldered to electrical communication lines provided on the external surface. In certain embodiments, at least one package bond pad 48-1 may comprise an identifier 56, such as a notch, a different shape, or other form of identifier that is configured to convey the polarity and mounting position of the LED package 26 on the external surface.

Figure 3A:
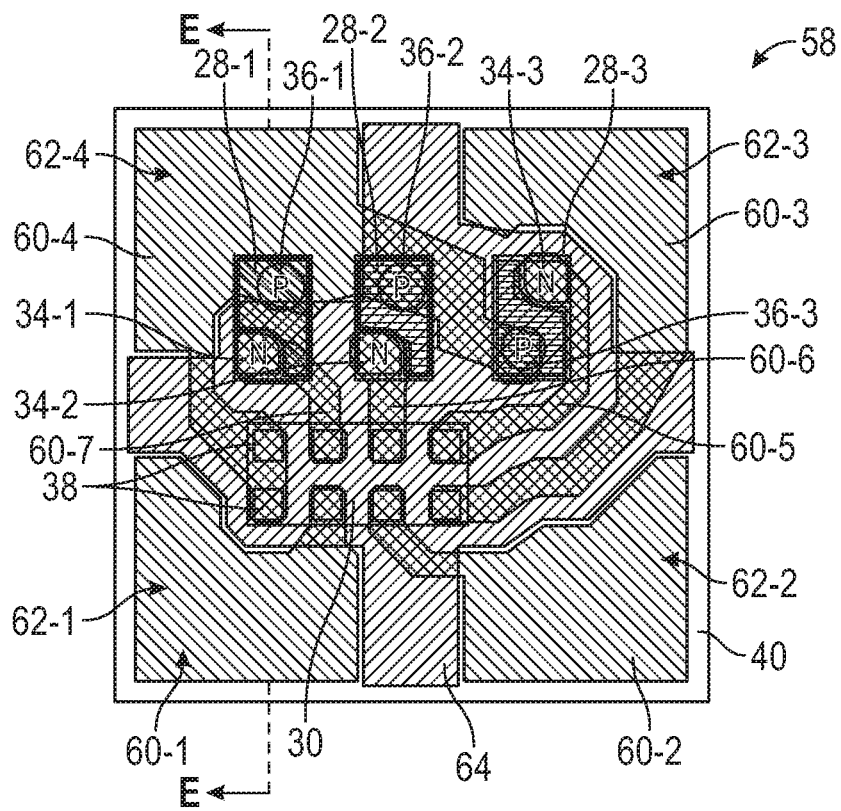
FIG. 3A is a bottom view of a representative LED package that includes a plurality of electrically conductive traces where portions of certain ones of the electrically conductive traces form package bond pads for the LED package.
Figure 3B:
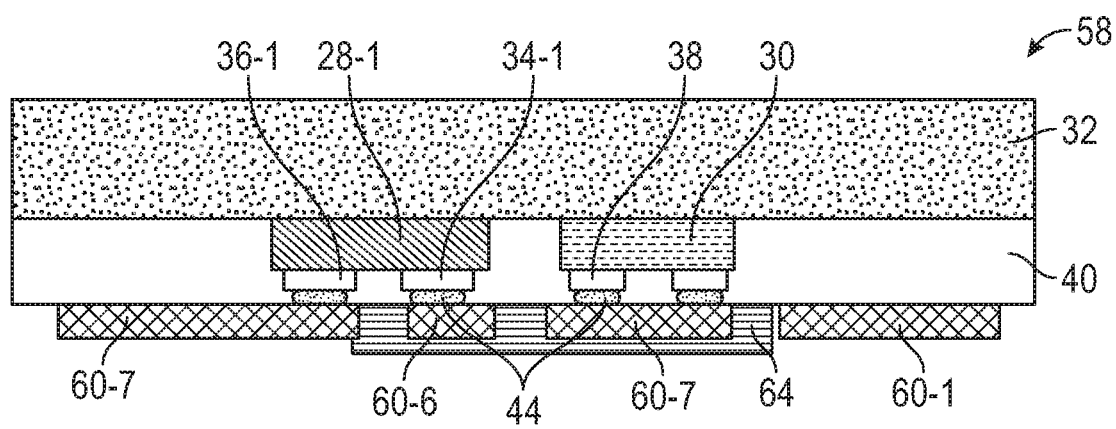
FIG. 3B is a cross-sectional view taken along the section line E-E of FIG. 3A.

FIG. 3A is a bottom view of a representative LED package 58 that includes a plurality of electrically conductive traces 60-1 to 60-7 where portions of the electrically conductive traces 60-1 to 60-4 form package bond pads 62-1 to 62-4 for the LED package 58. FIG. 3B is a cross-sectional view taken along the section line E-E of FIG. 3A. The LED package 58 may include the submount 32, the encapsulant layer 40, the plurality of LEDs 28-1 to 28-3 with the cathode contacts 34-1 to 34-3 and the anode contacts 36-1 to 36-3, and the active electrical element 30 with contact pads 38 as previously described. After planarizing the encapsulant layer 40 to expose the cathode contacts 34-1 to 34-3, the anode contacts 36-1 to 36-3, and the contact pads 38 as previously described, the plurality of electrically conductive traces 60-1 to 60-7 are formed on the encapsulant layer 40 in a similar manner to the plurality of electrically conductive traces 42-1 to 42-7 of FIG. 2C. As illustrated in FIG. 3A, portions of certain electrically conductive traces 60-1 to 60-4 are configured with wider areas across the LED package 58. An insulating material 64, such as a solder mask, is then formed over portions of the electrically conductive traces 60-1 to 60-7. Notably, the insulating material 64 does not extend entirely over all of the electrically conductive traces 60-1 to 60-7. In particular, portions of the electrically conductive traces 60-1 to 60-4 are uncovered by the insulating material 64 to form the package bond pads 62-1 to 62-4 of the LED package 58. In this regard, the package bond pads 62-1 to 62-4 may be bonded or soldered to another surface and the insulating material 64 may prevent electrical shorting between different ones of the electrically conductive traces 60-1 to 60-7.

Figure 4:
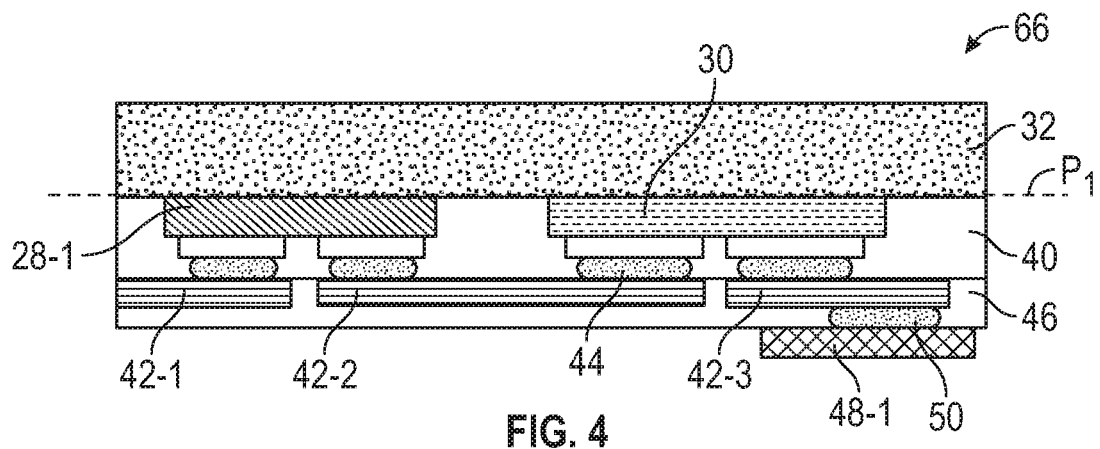
FIG. 4 is a cross-sectional view of an LED package illustrating configurations where one or more LED chips and an active electrical element are mounted along a same horizontal plane.

FIG. 4 is a cross-sectional view of an LED package 66 illustrating configurations where one or more LEDs 28-1 and the active electrical element 30 are mounted along a first horizontal plane $P_1$ of the LED package 66. In FIG. 4, only the LED 28-1 is illustrated, but it is understood the LED package 66 may include a plurality of LEDs that are mounted in a similar manner to the LED 28-1 of FIG. 4. As illustrated, the LED 28-1 and the active electrical element 30 are mounted or bonded along the first horizontal plane $P_1$ that is defined by a mounting surface of the submount 32. In some embodiments, the LED 28-1 and the active electrical element 30 may comprise different dimensions, such as different thicknesses or heights relative to the submount 32. Additionally, different thicknesses of bonding layers may be provided to respectively bond the LED 28-1 and the active electrical element 30 to the submount 32. After bonding the LED 28-1 and the active electrical element 30 along the first horizontal plane $P_1$, the electrical connectors 44, the encapsulant layer 40, the additional electrical connectors 50, the electrically conductive traces 42-1 to 42-3, the additional encapsulant layer 46, and the package bond pad 48-1 may be formed as previously described.

Figure 5:
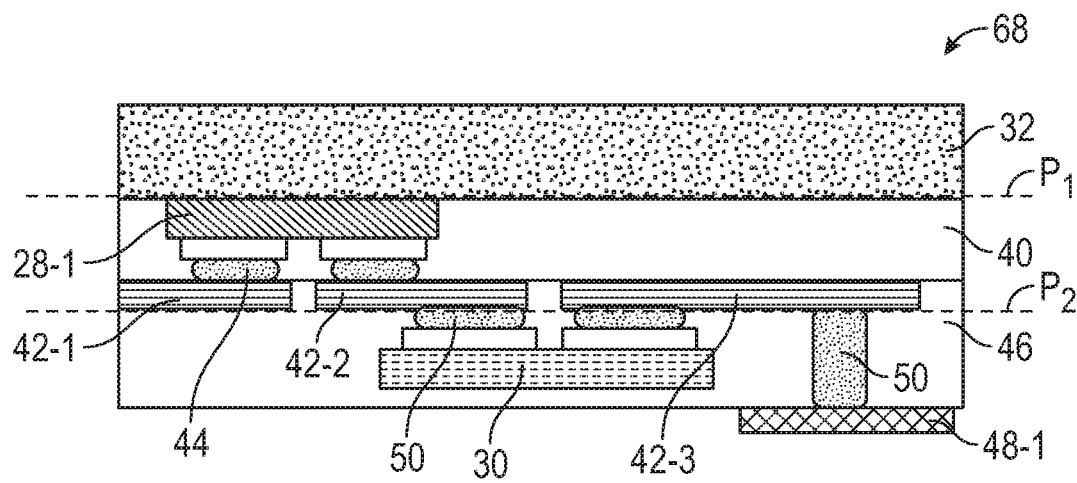
FIG. 5 is a cross-sectional view of an LED package illustrating configurations where one or more LED chips are mounted along a first horizontal plane and an active electrical element is mounted along a second horizontal plane that is different than the first horizontal plane.

FIG. 5 is a cross-sectional view of an LED package 68 illustrating configurations where one or more LEDs 28-1 are mounted along the first horizontal plane $P_1$ and the active electrical element 30 is mounted along a second horizontal plane $P_2$ that is different than the first horizontal plane $P_1$ of the LED package 68. In FIG. 5, only the LED 28-1 is illustrated, but it is understood the LED package 68 may include a plurality of LEDs that are mounted in a similar manner to the LED 28-1 of FIG. 5. As illustrated, the LED 28-1 is mounted or bonded along the first horizontal plane $P_1$ that is defined by a mounting surface of the submount 32. The electrical connectors 44, the encapsulant layer 40, and the plurality of electrically conductive traces 42-1 to 42-3 are then formed as previously described. The active electrical element 30 is then mounted along the second horizontal plane $P_2$ that is defined by a face of the plurality of electrically conductive traces 42-1 to 42-3 that is opposite to the LED 28-1. In this manner, the plurality of electrically conductive traces 42-1 to 42-2 are thereby arranged between the LED 28-1 and the active electrical element 30. The additional electrical connectors 50, the additional encapsulant layer 46, and the package bond pad 48-1 may be subsequently formed as previously described. Notably, the active electrical element 30 may be at least partially embedded in the additional encapsulant layer 46 in this configuration. Accordingly, the additional encapsulant layer 46 and at least one of the additional electrical connectors 50 may comprise greater thicknesses than in previously described embodiments. In certain embodiments, the additional encapsulant layer 46 may comprise a second submount and the active electrical element 30 is either embedded within or mounted to the second submount. Such an arrangement may be referred to as a chip-scale configuration.

Figure 6:
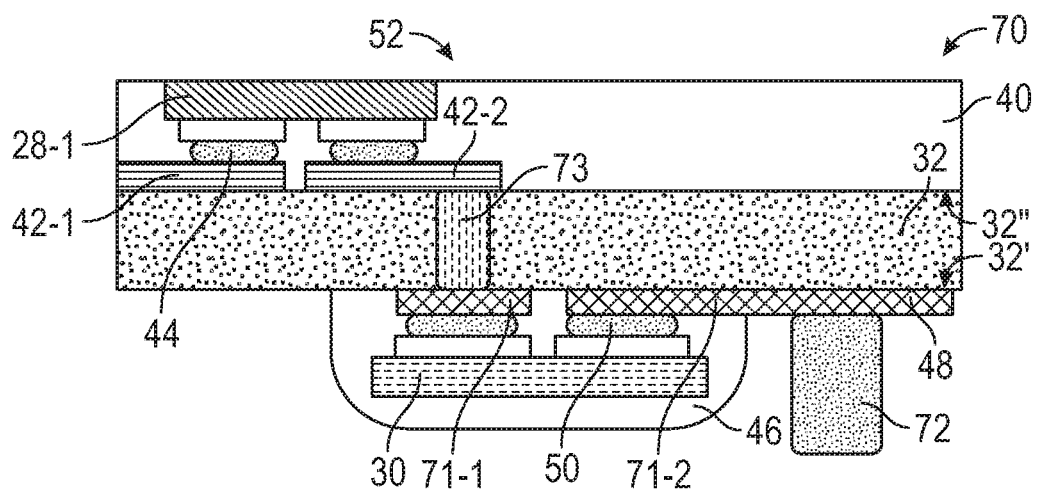
FIG. 6 is a cross-sectional view of an LED package illustrating configurations where one or more LED chips and an active electrical element are mounted to opposing faces of the submount.

FIG. 6 is a cross-sectional view of an LED package 70 illustrating configurations where one or more LEDs 28-1 and the active electrical element 30 are mounted to opposing faces of the submount 32. In FIG. 6, only the LED 28-1 is illustrated, but it is understood the LED package 70 may include a plurality of LEDs that are mounted in a similar manner to the LED 28-1 of FIG. 6. As illustrated, the plurality of electrically conductive traces 42-1, 42-2 are formed on the second face 32" of the submount 32 and additional electrical traces 71-1, 71-2 are formed on the first face 32' of the submount 32. The LED 28-1 is mounted or bonded to the electrically conductive traces 42-1, 42-2 by way of the electrical connectors 44 and the active electrical element 30 is mounted or bonded to the additional electrical traces 71-1, 71-2 by way of the additional electrical connectors 50. The encapsulant layer 40 is formed over the LED 28-1 and the second face 32" of the submount 32. In certain embodiments, part of the encapsulant layer 40 forms the primary emission face 52 of the LED package 70. As previously described, the encapsulant layer 40 may include a black material to provide improved contrast between the LED 28-1 and other LEDs that may be mounted in the LED package 70. In certain embodiments, another layer or an extension of the encapsulant layer 40 may extend above the LED 28-1 to provide encapsulation for the LED 28-1. In such embodiments, the other layer or the extension of the encapsulant layer 40 above the LED 28-1 may comprise a light-transmissive materials, additional layers, or textures. The additional encapsulant layer 46 may be formed on the first face 32' of the submount 32 to provide encapsulation for the active electrical element 30. In this regard, the additional encapsulant layer 46 may or may not extend across the entire first face 32' of the submount 32. Notably, portions of the additional electrically conductive trace 71-2 that are uncovered by the additional encapsulant layer 46 may form the package bond pad 48 as previously described. In order to facilitate bonding to an external surface, a conductive bonding material 72 may comprise a thickness relative to the submount 32 that is greater than or almost as thick as the active electrical element 30 and the additional encapsulant material 46. In order to provide electrical communication between the electrically conductive trace 42-2 and the additional electrically conductive trace 71-1, one or more conductive interconnects 73, such as metal slugs, vias, or traces may be provided either through the submount 32 as illustrated in FIG. 6, or the conductive interconnects 73 may wrap around lateral edges of the submount 32.

Figure 7:
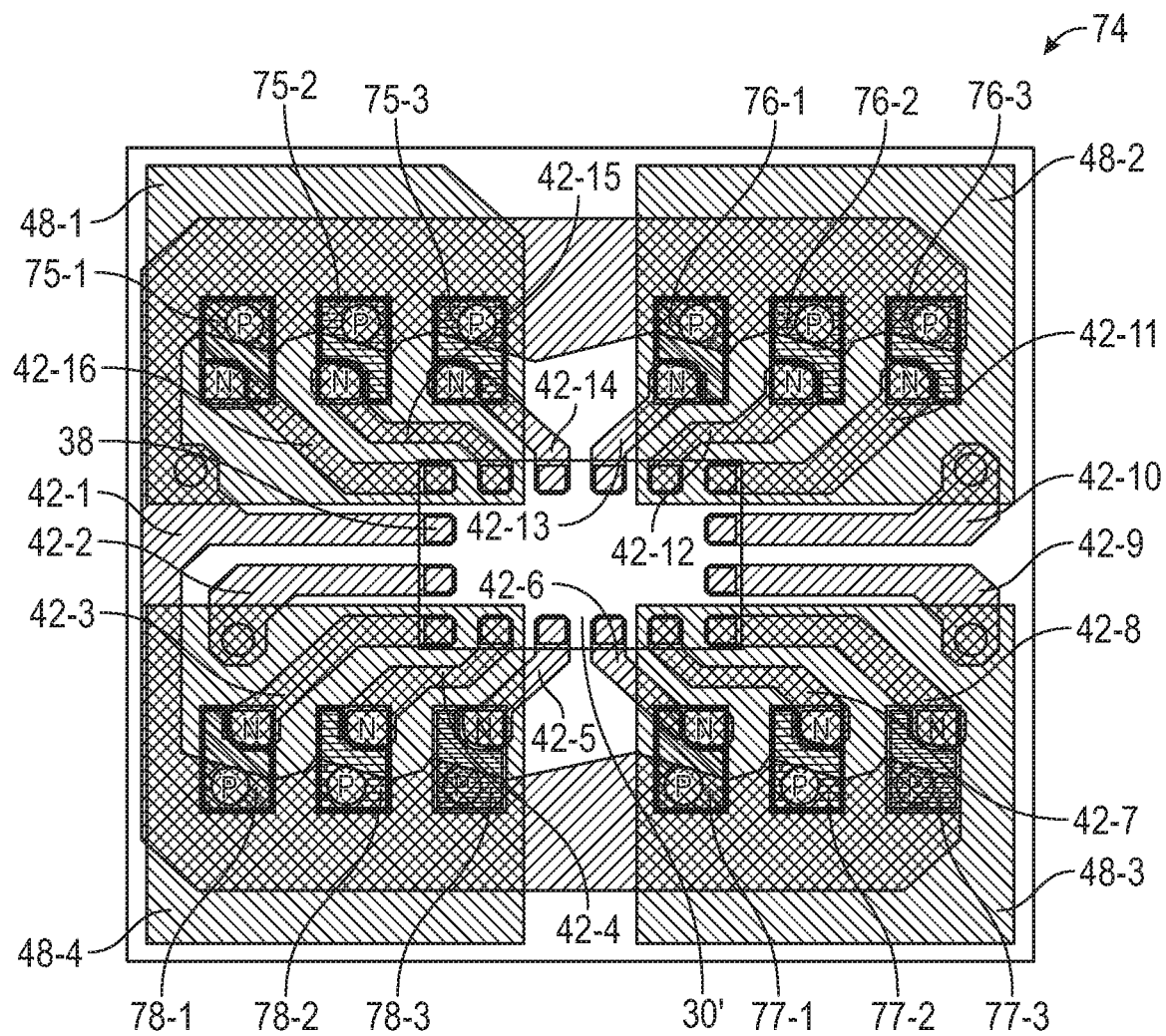
FIG. 7 is a bottom view of an LED package that includes a plurality of LED pixels according to embodiments disclosed herein.

FIG. 7 is a bottom view of an LED package 74 that includes a plurality of LED pixels according to embodiments disclosed herein. The LED package 74 is similar to the LED package 26 of FIG. 2E, but includes a plurality of LED chips 75-1 to 75-3, 76-1 to 76-3, 77-1 to 77-3, and 78-1 to 78-3 that respectively form a plurality of LED pixels that are spaced apart from one another and packaged together in the same LED package 74. As illustrated, the LED chips 75-1 to 75-3 form a first LED pixel, the LED chips 76-1 to 76-3 form a second LED pixel, the LED chips 77-1 to 77-3 form a third LED pixel, and the LED chips 78-1 to 78-3 form a fourth LED pixel. In certain embodiments, each LED pixel comprises a red LED chip, a blue LED chip, and a green LED chip. The LED package 74 further includes an active electrical element 30' that is configured to electrically connect with the plurality of pixels, a plurality of electrically conductive traces 42-1 to 42-16, and the plurality of package bond pads 48-1 to 48-4 as previously described. Notably, the LED package 74 may be configured with the same number of package bond pads 48-1 to 48-4 as previously described for single pixel LED packages (e.g., the LED package 26 of FIG. 2H). As illustrated, the LED package 74 comprises four package bond pads 48-1 to 48-4 that are configured for receiving various combinations of input signals or connections as will be later described in more detail, such as a supply voltage ($V_{dd}$), a ground ($V_{ss}$), color select signals, brightness level (or grey level) signals, analog signals, encoded color select signals, encoded brightness level select signals, digital signals, clock signals, and asynchronous data signals. The active electrical element 30' thereby comprises four input/output and power connections; however, the active electrical element 30', as will be later described, is configured to independently alter a driving condition of each LED chip of the plurality of LED chips 75-1 to 75-3, 76-1 to 76-3, 77-1 to 77-3, and 78-1 to 78-3. Notably, the electrically conductive trace 42-1 may be electrically connected to an anode of each of the LED chips 75-1 to 75-3, 76-1 to 76-3, 77-1 to 77-3, and 78-1 to 78-3 for common-anode control. The electrically conductive trace 42-1 is also electrically connected between the package bond pad 48-1 and the active electrical element 30'. The electrically conductive trace 42-2 is electrically connected between the package bond pad 48-4 and the active electrical element 30', the electrically conductive trace 42-9 is electrically connected between the package bond pad 48-3 and the active electrical element 30', and the electrically conductive trace 42-10 is electrically connected between the package bond pad 48-2 and the active electrical element 30'. In other embodiments, the LED package 74 may be configured for common-cathode control as previously described. In order to provide electrical communication with the increased number of LED pixels within the LED package 74, the active electrical element 30' may comprise an increased number of the contact pads 38 for communication with an increased number of the electrically conductive traces 42-1 to 42-16. Four of the contact pads 38 are electrically connected to the package bond pads 48-1 to 48-4 as previously described, and the remaining contact pads 38 are electrically connected to different ones of the LED chips 75-1 to 75-3, 76-1 to 76-3, 77-1 to 77-3 and 78-1 to 78-3. In order for the LED package 74 to control multiple LED pixels with a reduced number of input signal connections, the active electrical element 30 may include circuitry configured to receive an input communication signal and perform a subpixel select function to independently communicate an operating state separately to each of the LED chips 75-1 to 75-3, 76-1 to 76-3, 77-1 to 77-3, and 78-1 to 78-3 of each of the LED pixels. In this regard, when a plurality of LED packages 74 are arranged together to form an array of LED pixels for a display application, the resulting display will have a reduced number of LED packages 74 compared to a similar-sized display where each LED package comprises only a single LED pixel. In this regard, a total number of communication signals between an external source (e.g., the control element 18 of FIG. 1B) and the LED pixels may be reduced. As with the single-pixel embodiments (e.g., FIG. 2E), almost infinite combinations of routing for communication signals are within the scope of this disclosure, including simple variations where one or more metal traces are configured along the same plane as previously described for FIGS. 3A and 3B.

Figure 8:
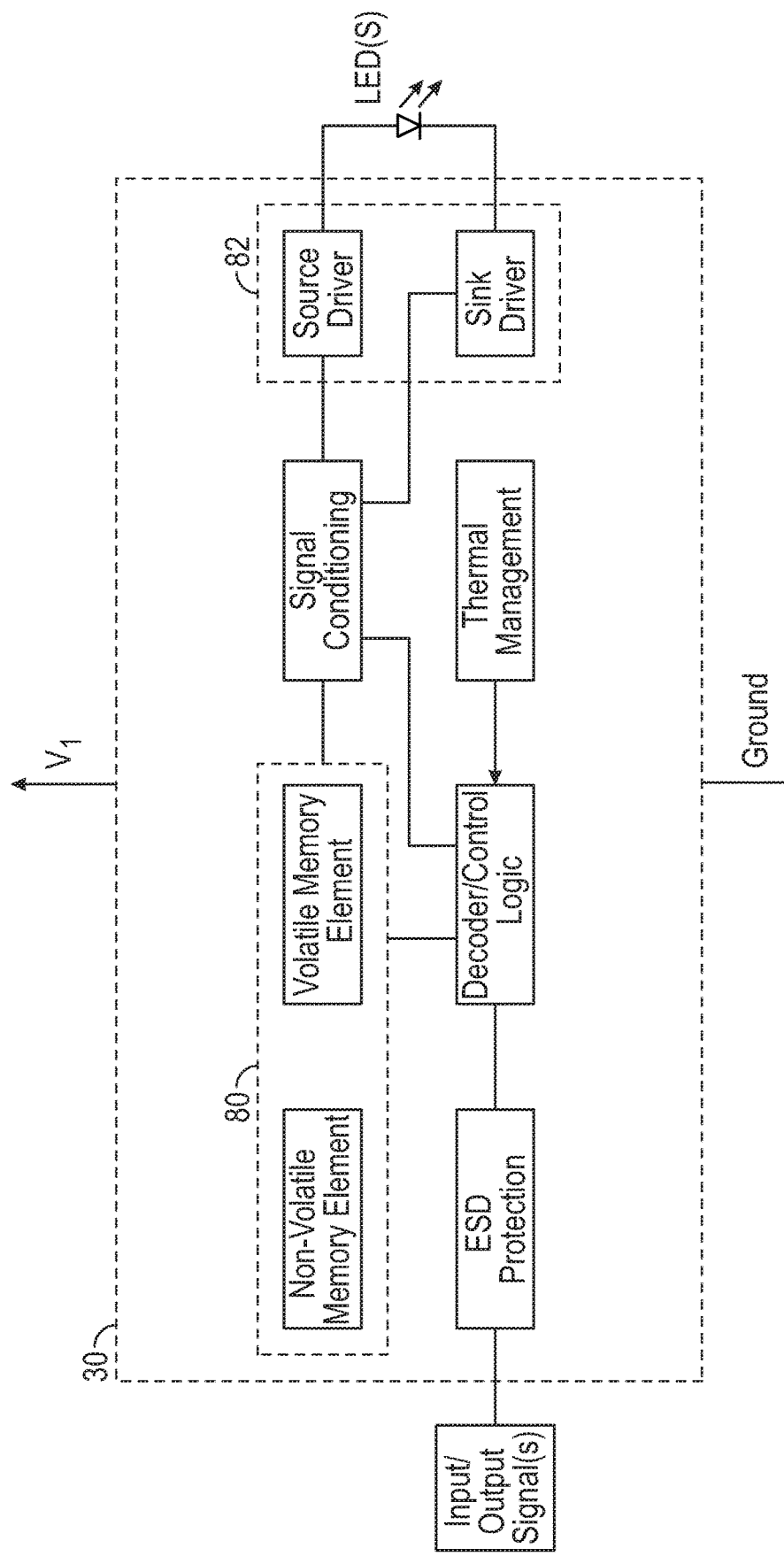
FIG. 8 is a block diagram schematic illustrating components of an active electrical element according to embodiments disclosed herein.

FIG. 8 is a block diagram schematic illustrating components of the active electrical element 30 (or the active electrical element 30' of FIG. 7) according to embodiments disclosed herein. As previously described, the active electrical element 30 may be incorporated into an LED package to enable active matrix addressing for a corresponding LED display. The active electrical element 30 is configured to receive an input signal from an external source, (e.g., the control element 18 of FIG. 1B) and independently hold and/or alter a driving condition for one or more LEDs within the LED package. As will be later described in more detail, the input signal may comprise a single communication line or a plurality of communication lines in analog, digital, or combinations of analog and digital formats. In certain embodiments, the active electrical element 30 comprises a memory element 80, which may include one or more of a volatile and a non-volatile memory element. The memory element 80 may comprise one or more of a bipolar transistor, a field effect transistor, an inverter, a logic gate, dynamic random-access memory (DRAM), static random-access memory (SRAM), programmable read-only memory (PROM), erasable programmable read-only memory (EPROM), electrically erasable programmable read-only memory (EEPROM), flash memory, an operational amplifier, a capacitor, and a lookup table, among others. In certain embodiments, the memory element 80 comprises at least one of a sample and hold circuit, a latch circuit, and a flip-flop circuit. In certain embodiments, the memory element 80 comprises a volatile memory element that is configured to store an operating state for the one or more LEDs based on the input signal. In operation, each time an updated input signal is received by the active electrical element 30, the volatile memory element is updated with a new operating state for the one or more LEDs and the one or more LEDs are accordingly activated and held according to the new operating state. In this regard, the volatile memory element may be configured to store a temporary operating state and the active electrical element 30 is thereby configured to alter a driving condition of the one or more LEDs in accordance to the temporarily stored operating state. In certain embodiments, the volatile memory element may additionally be configured to store other states or conditions that may not be considered temporary, such as a calibration factor, or an electronic transfer function such as gain. In this regard, one or more of the temporary operating states and the non-temporary states or conditions may collectively be used to produce driving conditions for the one or more LEDs. In certain embodiments, the memory element 80 comprises a non-volatile memory element that is configured to store preset data or information that may also be used to alter operating states of the one or more LEDs. The non-volatile memory element, such as a lookup table or a hash table, may be provided to alter the operating states based on an operating condition or environment of the LED package. For example, a thermal management element as shown in FIG. 8 may be incorporated within the active electrical element 30 that monitors an operating temperature of the LED package, and an operating state of the one or more LEDs may accordingly be adjusted based on a comparison of the operating temperature to a value stored by the non-volatile memory element. In certain embodiments, the thermal management element comprises a temperature sensor or a temperature sensor input from an external temperature sensor. In other embodiments, ambient light level information from a light sensor may be compared to values stored in the non-volatile memory element to alter a brightness level of the one or more LEDs. In further embodiments, the non-volatile memory element may be programmed to store position setting data, including pre-determined position setting data or position setting data that is later programmed, for the LEDs or LED pixels of a display. The position setting may be programmed before or after installation of an LED display. The position setting may include position settings for individual LED chips, individual LED packages that include LED pixels, and individual LED panels that may collectively form an LED display. In this regard, common control lines may be connected to more than one LED, LED pixel, or LED package and the position setting may be used to interpret input signals and drive only the intended LEDs that are connected by a common control line.

The active electrical element 30 may additionally comprise one or more ESD protection elements that are configured between the input signal and other components within the active electrical element 30. In certain embodiments, a decoder or control logic element is provided within the active electrical element 30 to receive and convert one or more of the input signals into unique combinations of output signals that are in turn used alter different operating states of the one or more LEDs. In particular, the decoder or control logic element may output the combinations of output signals that may be stored and periodically updated in the volatile memory element. Each time the volatile memory element is updated, the operating state of the one or more LEDs is altered or updated via a driver element 82. In certain embodiments, the decoder element is configured to provide row or column select information for the one or more LEDs or brightness or grey levels for each of the LEDs. For an LED package configuration that includes a plurality of LED pixels, the decoder element may be configured to provide pixel or sub-pixel selection within the LED package to the memory element 80. The decoder element may be configured to provide programming, set point information, or calibration information to the memory element 80. In certain embodiments, the decoder element may be configured to select certain pixels that share a control line by decoding pre-determined position settings for certain pixels on a shared control line so only a particular pixel will respond to a control signal. The pre-determined position settings may be programmed and stored in the memory element 80, such as the non-volatile memory element. In certain embodiments, the driver element 82 (or buffer element) comprises a source driver element, a sink driver element, or both a source driver element and a sink driver element. The source driver element is typically used when the LEDs are configured for common-cathode control, and the sink driver is typically used when the LEDs are configured for common-anode control. In certain embodiments, the source driver and the sink driver may be included within the active electrical element 30 and, accordingly, the source driver and the sink driver may be configured to provide a differential voltage output to control the one or more LEDs. In certain embodiments, the active electrical element 30 may also include one or more signal conditioning elements that are configured to convert, manipulate, or otherwise transform control signals before they are received by the source driver or the sink driver. The signal conditioning element may be configured to transform analog signals or digital signals for applications such as gamma correction or apply other nonlinear transfer functions. In certain embodiments, the decoder/control logic directly communicates to the signal conditioning element, and in other embodiments, the decoder/control logic assumes the tasks or function of the signal conditioning element in the digital domain. In such embodiments, the signal conditioning element could simply comprise a wire when the decoder/control logic assumes the tasks. The signal conditioning element may be configured or electrically connected between the memory element 80 and the driver element 82 such that a signal leaving the memory element 80 may be converted or manipulated before reaching the driver element 82. The signal conditioning element may be configured or electrically connected between the input signal and the memory element 80 such that the input signal may be converted or manipulated before reaching the memory element 80. Various other arrangements are contemplated as the divisions of the various elements of the active electrical element 30 can be made in other ways. For example, the decoder/control logic could be considered as a single processor unit along with the signal conditioning and memory elements. Additionally, the active electrical element 30 may comprise a plurality of ESD elements, and/or a plurality of decoder/control logic elements, and/or a plurality of memory elements 80, and/or a plurality of signal conditioning elements, and/or a plurality of thermal management elements, and/or a plurality of driver elements 82 depending on the particular application. Each of the decoder/control logic elements, memory elements 80, signal conditioning elements, thermal management elements, and driver elements can be configured as analog elements, digital elements, and combinations of analog and digital elements, including software and firmware and the like.

Figure 9:
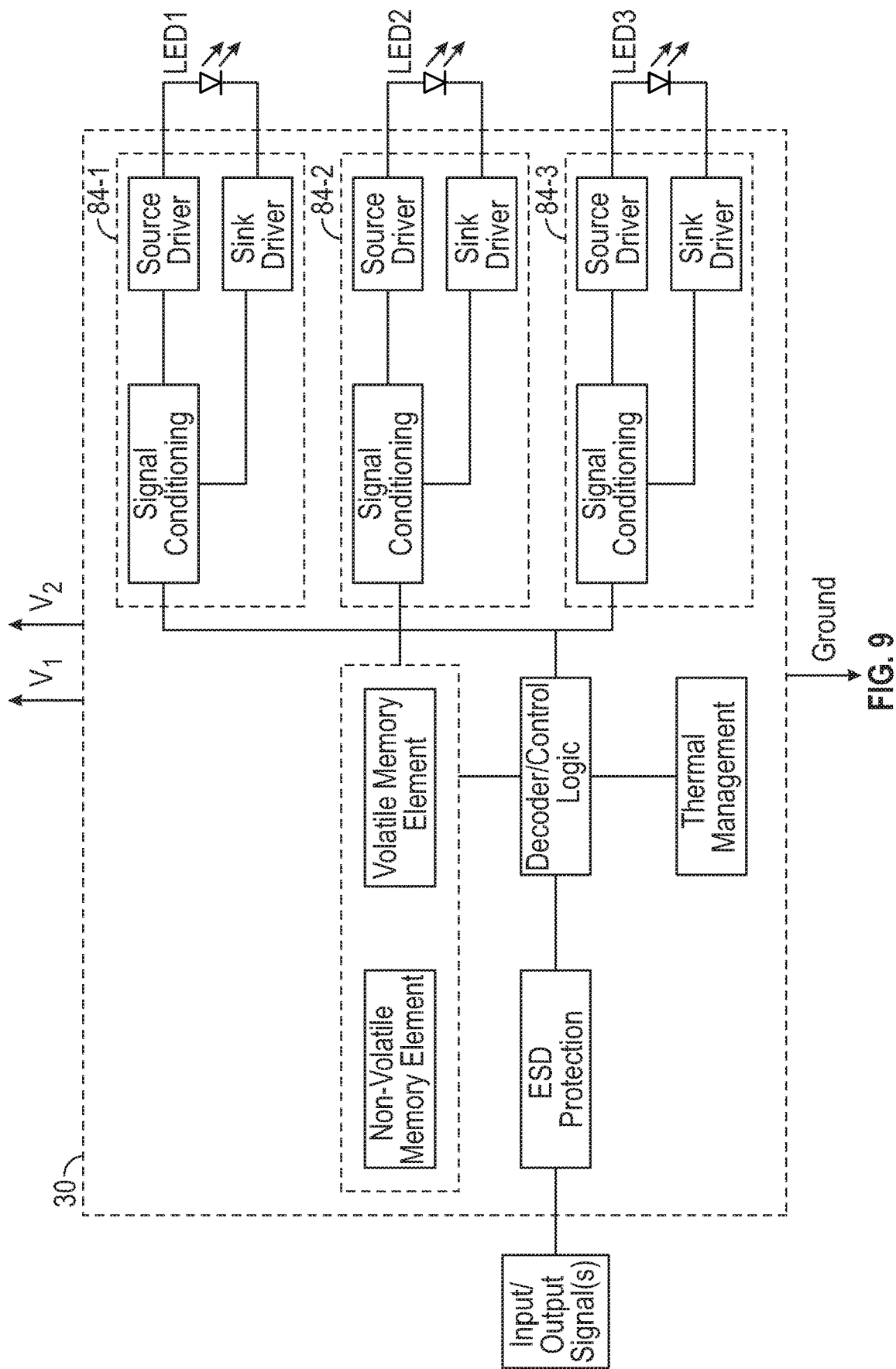
FIG. 9 is a block diagram schematic illustrating components of an active electrical element according to embodiments disclosed herein.

FIG. 9 is a block diagram schematic illustrating components of the active electrical element 30 according to embodiments disclosed herein. In FIG. 9, the active electrical element 30 may include many of the same components as previously described for FIG. 8, including the ESD protection element, the decoder/control logic, the volatile memory element, the non-volatile memory element, and the thermal management element. As further shown in FIG. 9, the output of the volatile memory element may split into separate signal lines 84-1 to 84-3 for each of the LEDs (LED1 to LED3). Each of the separate signal lines 84-1 to 84-3 may include a different one of the signal conditioning element, the source driver element, and the sink driver element as previously described. In this regard, each of the LEDs (LED1 to LED3) may be independently driven and altered based on one or more control signals entering the active electrical element 30. Additionally, in the case of differently colored LEDs, it may be desirable for different LEDs to be configured on different power supply lines or supply voltage inputs $V_1$, $V_2$. For example, red LEDs typically have a lower turn-on or forward voltage (e.g., 1.8-2.4 volts (V)) compared with blue or green LEDs (e.g., 3-3.3 V) due to the lower bandgap of different material systems typically used to form red LEDs (e.g., GaAs, AlGaInP, GaP-based) compared with blue or green LEDs (e.g., GaN-based). In this regard, the active control element 30 may be configured with separate connections (e.g., the contact pads 38 of FIG. 2A) that are configured to receive a separate power supply line or input (e.g., $V_1$ between about 1.8-2.4 V) for the red LED and a common power supply line or input (e.g., $V_2$ between about 3-3.3 V) for both the blue LED and the green LED.

Figure 10:
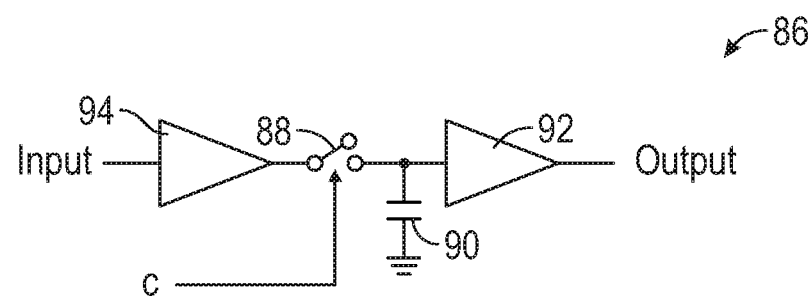
FIG. 10 is a schematic diagram illustrating an exemplary structure for volatile memory elements that may be included within active electrical elements according to embodiments disclosed herein.

In addition to various digital memory elements, analog memory elements may be used. FIG. 10 is a schematic diagram illustrating an exemplary structure that includes an analog volatile memory element that may be included within active electrical elements according to embodiments disclosed herein. In FIG. 10, an exemplary sample and hold circuit 86 is shown that includes a switching device 88, a capacitor 90, an operational amplifier 92, and an optional operational amplifier buffer 94 between an input and the capacitor 90. To sample the input signal, the switching device 88 connects the input signal to the capacitor 90 via the operational amplifier buffer 94, and the capacitor 90 stores an electric charge. After sampling the input signal, the switching device 88 disconnects the capacitor 90, and the stored electric charge of the capacitor 90 discharges through the operational amplifier 92 to provide an operational state for a particular LED that is held until the input signal is sampled again. In this manner, the optional operational amplifier buffer 94 and the switching device 88 may be considered components of the decoder/control logic (FIGS. 8 and 9), the capacitor 90 may be considered a component of the memory element (FIGS. 8 and 9), and the operational amplifier 92 may be considered a component of the signal conditioning element (FIGS. 8 and 9) which may be linear or non-linear depending on the system configurations.

Figure 11A:
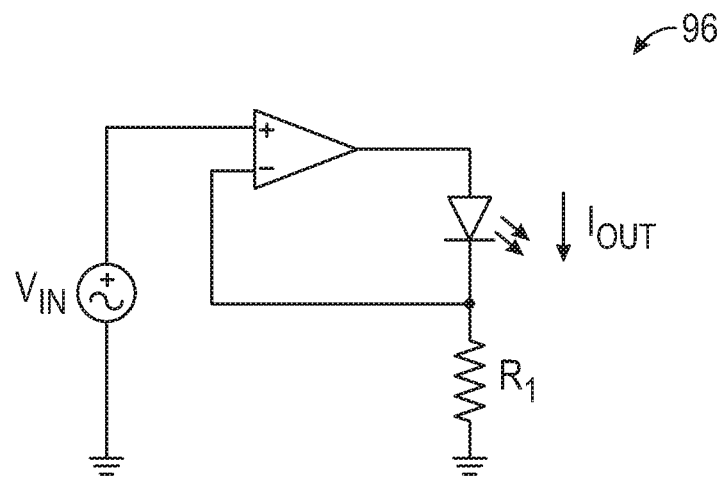
FIG. 11A is a schematic diagram illustrating a driver element that includes a voltage controlled current source circuit.
Figure 11B:
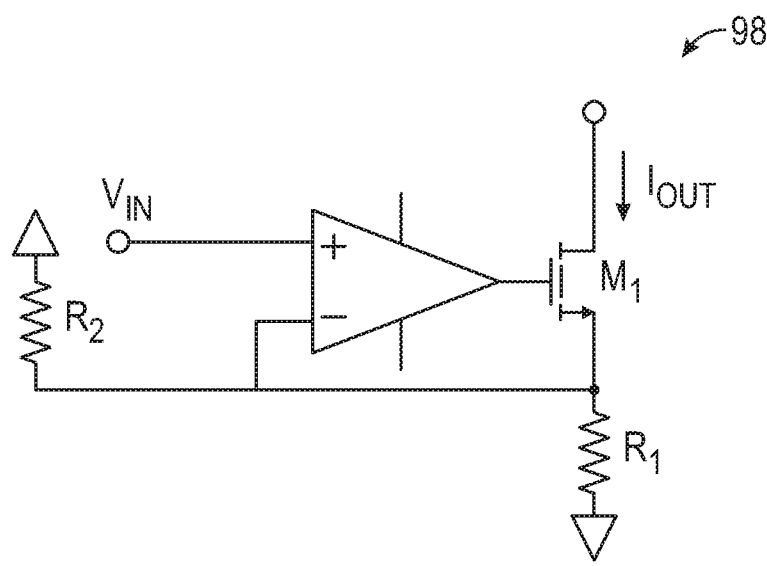
FIG. 11B is a schematic diagram illustrating a driver element that includes a transconductance amplifier arranged with an active cascode configuration

FIGS. 11A-11F are schematic diagrams illustrating exemplary structures for driver elements that may be included within active electrical elements according to embodiments disclosed herein. For video display applications, it may be desirable for a driver element to comprise a non-inverting circuit that is configured to drive each LED in a linear manner from a completely off state of about 0 microamps (μA) or about 0 V to about 1 milliamp (mA) or about 3 V with low power consumption. FIG. 11A represents an embodiment where a driver element 96 comprises a voltage controlled current source circuit, such as transconductance amplifier. For a transconductance amplifier, a differential input voltage is converted to an output current for driving an LED. In the simplified schematic of FIG. 11A, the driver element 96 comprises a non-inverting circuit, but the driver element 96 requires connections to both terminals of the LED for operation leading to a more complex device layout. Accordingly, the driver element 96 is not a sinking driver element for common-anode control or a source driver element for common-cathode control. Additionally, a resistor $R_1$ needs to be large to reduce the input voltage sensitivity, which can reduce the efficiency of the driver element 96. Additionally, when the LED is required to turn off, the output current may have difficulty reaching a low enough value (0 µA) to achieve turn off. FIG. 11B represents an embodiment where a driver element 98 comprises a transconductance amplifier arranged with an active cascode configuration that includes a transistor, such as a metal-oxide-semiconductor field-effect transistor (MOSFET) $M_1$ and an additional resistor $R_2$, which may facilitate complete turn off of the LED. As previously described for FIG. 11A, the voltage sensitivity of the driver element 98 can be too high. At full turn on for the LED, or about 1 mA, the driver element 98 may result in a low voltage input, e.g., about 0.05 V, and, accordingly, the active cascode configuration may experience an undesirable signal to noise ratio.

Figure 11C:
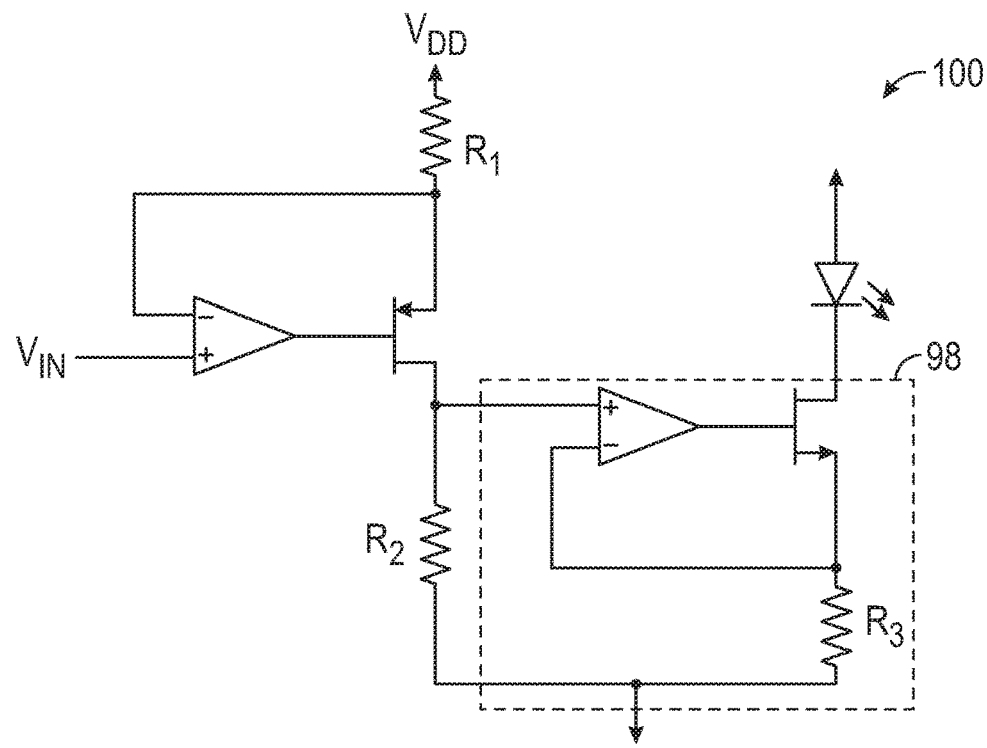
FIG. 11C is a schematic diagram illustrating a driver element that includes an input amplifier added to the driver element of FIG. 11B.
Figure 11D:
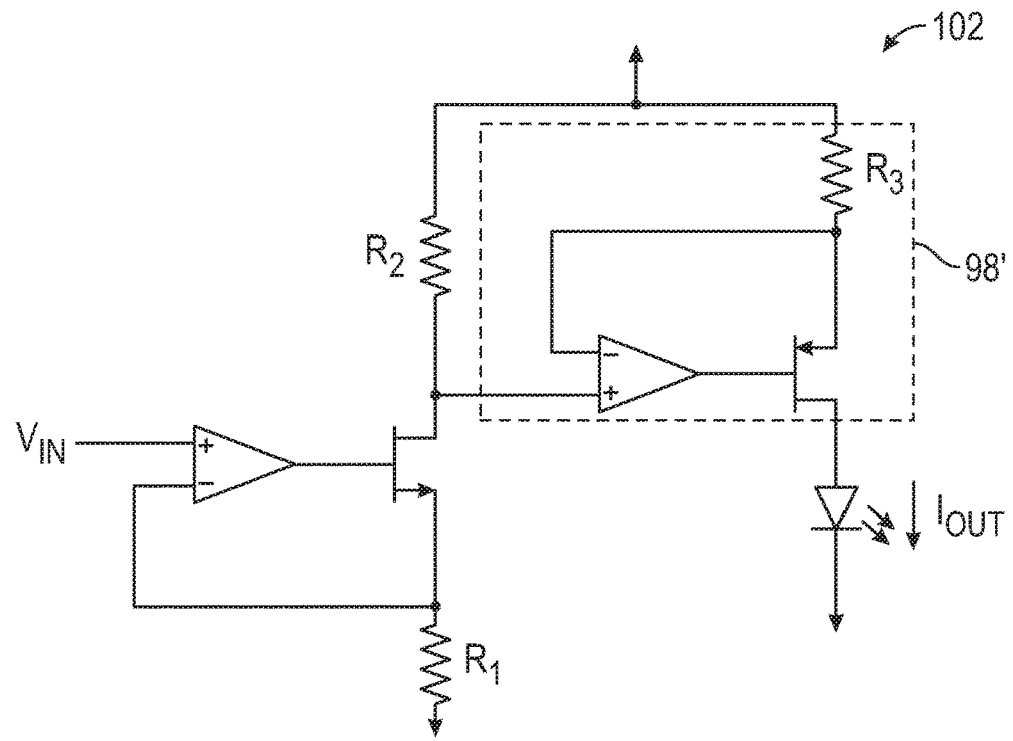
FIG. 11D is a schematic diagram illustrating a driver element that is similar to the driver element of FIG. 11C, but with flipped polarity connections.
Figure 11E:
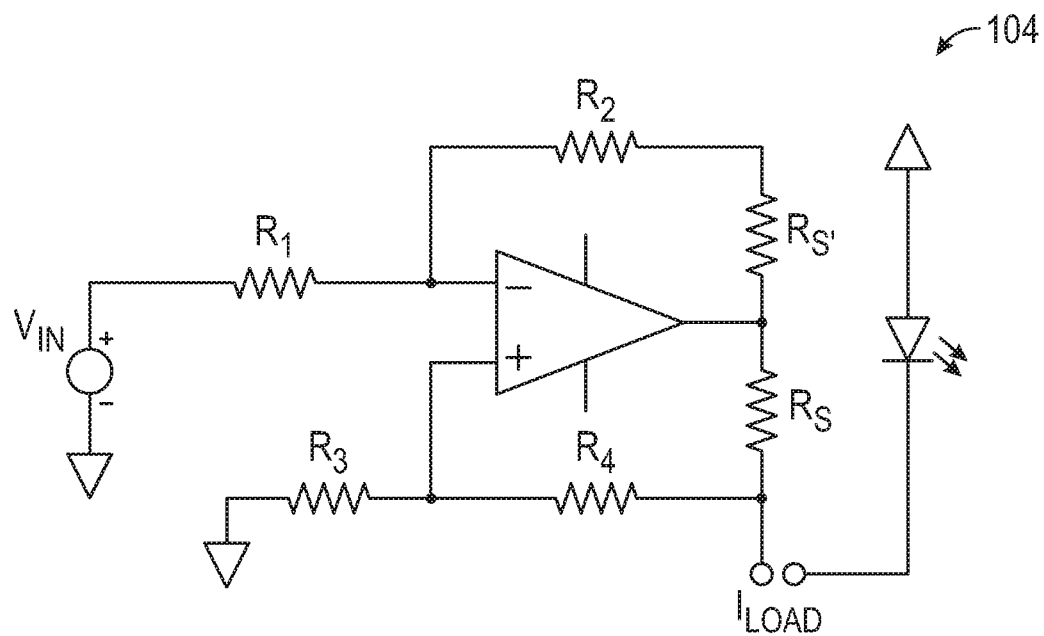
FIG. 11E is a schematic diagram illustrating a driver element that includes a Howland current pump.
Figure 11F:
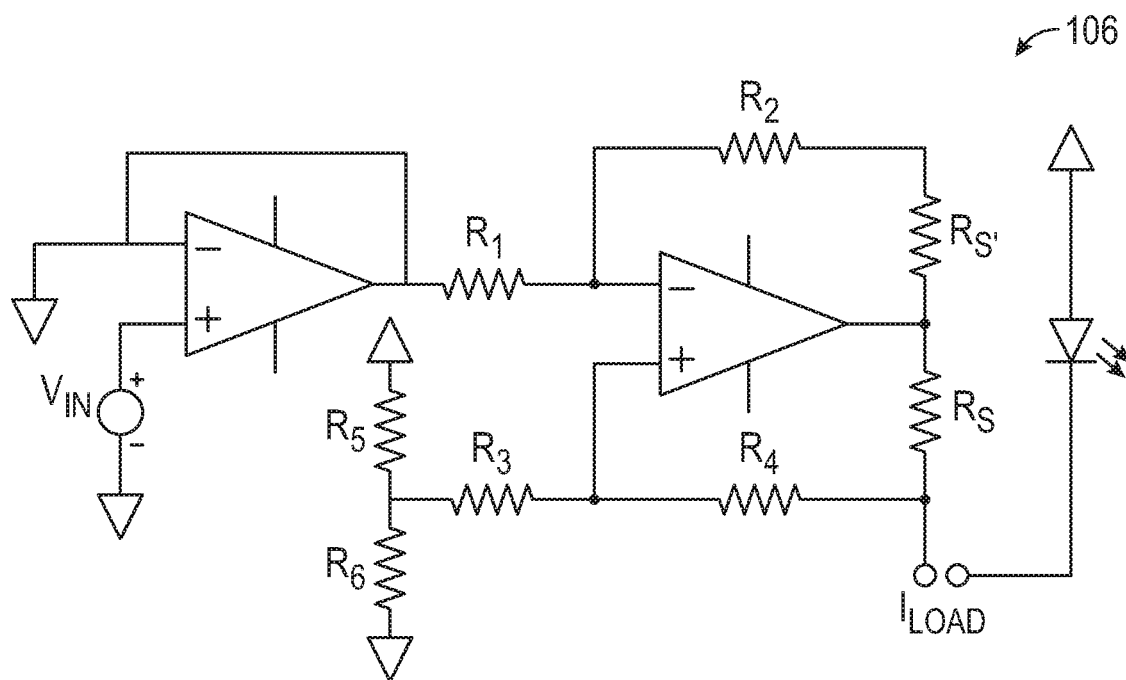
FIG. 11F is a schematic diagram illustrating a driver element that is similar to the driver element of FIG. 11E and adds a voltage divider and an additional operational amplifier.

FIG. 11C represents an embodiment for a driver element 100 that adds an input amplifier to the driver element 98 that includes the transconductance amplifier with the active cascode configuration of FIG. 11B. The added input amplifier may serve to de-amplify the voltage for less signal sensitivity and provide improved signal to noise ratio. Additionally, the driver element 100 provides a sinking, or common anode configuration, for the LED; however, the input voltage becomes inverted. FIG. 11D represents an embodiment for a driver element 102 that is similar to the embodiment of FIG. 11C, but with flipped polarity connections. In this regard, the driver element 102 includes an input amplifier between an input voltage and a driver element 98', which is a reversed polarity version of the driver element 98, that includes the transconductance amplifier with the active cascode configuration of FIG. 11B. As illustrated, the driver element 102 represented in FIG. 11D provides the advantage of being non-inverting; however, it does result in sourcing, or common cathode configuration for the LED. Other driver element arrangements are possible, such as Howland current pump configurations 104, 106 illustrated in FIGS. 11E and 11F. In FIG. 11E, the Howland current pump 104 includes an operational amplifier and a resistor bridge configured to drive the LED. In FIG. 11F, the Howland current pump 106 additionally includes a voltage divider that includes resistors $R_5$ and $R_6$ that is added to the Howland current pump 104 of FIG. 11E to improve performance when little to no current is flowing. Additionally, an additional operational amplifier is provided at the voltage input to form a non-inverting voltage follower (e.g., a pre-amplifier) to provide high input resistance which is needed for the output buffer of the sample and hold circuit to ensure adequate hold times.

When a plurality of LED packages as disclosed herein are arranged to form LED pixel arrays for LED display applications, it may be advantageous if the location of each individual LED package is known within the corresponding active electrical element of each LED package or that each LED package have a specific address associated with it. In certain embodiments, each active electrical element within each LED package is configured to store location or address specific information, such as the particular row and column in which the LED package is registered. In this regard, display control units may send signals across the LED pixel array that are encoded for specific locations within the LED pixel array, and each active electrical element of each individual LED package is thereby configured to interpret the signals and determine whether to respond or ignore a certain signal based on the location or address information. In certain embodiments, the active electrical element of each LED package comprises a detector element that is configured to detect the location of the LED package within an array of LED packages in a display and working in conjunction with a master controller (e.g., the control element 18 of FIG. 1B along with other hardware/software configurations), relay that information for memory storage within the active electrical element. This task may be performed after PCB assembly when a special configuration program is run to properly set and store the address and calibration information into non-volatile memory of the active electrical element, in one or more remote memory devices, or in both the active electrical element and one or more remote memory devices.

Figure 12A:
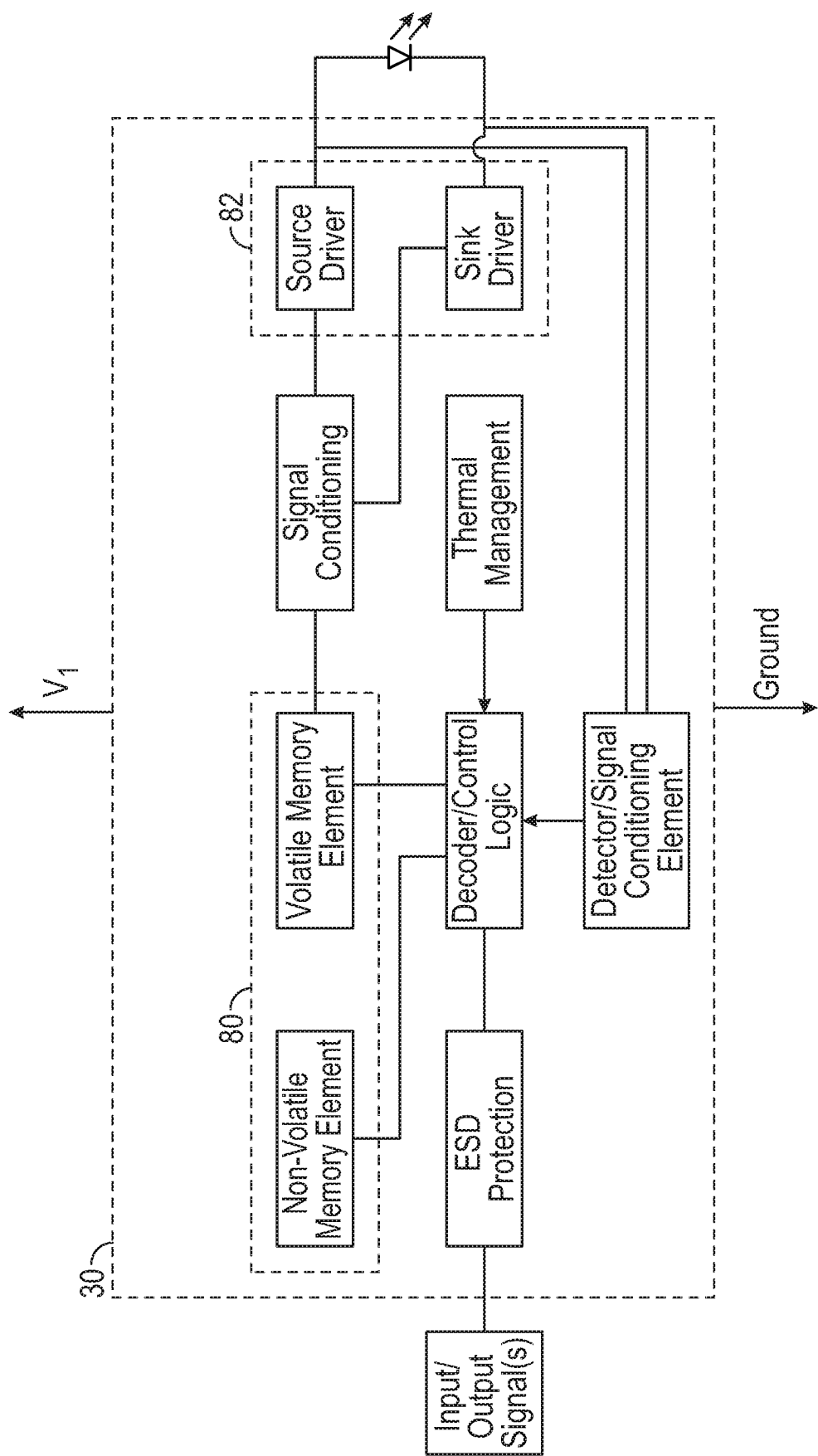
FIG. 12A is a block diagram schematic illustrating an embodiment of an active electrical element that includes a detector element.

FIG. 12A is a block diagram schematic illustrating an embodiment of the active electrical element 30 that includes a detector/signal conditional element. As previously described, the active electrical element 30 may be incorporated into an LED package to enable an LED display that is configured for active matrix addressing. The active electrical element 30 is configured to receive an input signal from an external source, (e.g., the control element 18 of FIG. 1B) and independently alter a driving condition for one or more LEDs within the LED package. The block diagram of FIG. 12A is similar to the block diagram of FIG. 8 and includes the memory element 80 and the driver element 82 as previously described. As illustrated, the ESD protection element, the decoder/control logic element, the thermal management element, and the signal conditioning element may also be included as previously described. In certain embodiments, one or more of the LEDs may be used as a light detector to generate a signal that is received by the detector/signal conditioning element. For example, after installation of a plurality of LED packages in an LED pixel array, all LED packages that are connected to a common data bus may lack individual unique addresses. In this regard, an initial setup procedure (or location setup procedure) may be performed where each of the LED packages may be scanned with a light beam and at least one LED within each of the LED packages may serve as a photodiode that provides a corresponding voltage and/or current signal that corresponds with the particular location of the LED package. In this manner at least one of the LEDs may operate in a photovoltaic or photoconductive mode during the initial setup procedure. The signal produced by the light beam is used in conjunction with electrical signals from the master controller (e.g., the control element 18 of FIG. 1B along with other hardware/software configurations) provided over the data bus to cause the component to record its address. When encoded signals for each pixel location are sent across the LED pixel array, each LED package may therefore be configured to know which signal the LED package is supposed to respond to. For such embodiments, the LED driver element 82 may be configured with a high impedance output to support a light detector mode of the one or more LEDs during the initial setup procedure. In certain embodiments, the detector/signal conditioning element may comprise a voltage detector, a current sensor, or even a wire that delivers the location signal to the decoder/control logic element. In this manner, the active electrical element 30 may be configured to be addressed and an operating state of the at least one of the LEDs may be altered in a way dependent on information such as an address stored in local memory. In certain embodiments, a separate photodiode that is not one of the LEDs within the LED package may be configured within the LED package to provide the location signal to the active electrical element 30. In certain embodiments, the detector/signal conditioning element may be configured to monitor operation voltages or currents of the LEDs and store such information in the memory element. In this regard, the active electrical element 30 is configured to store monitoring information that includes operating temperature from the thermal management element, positional information, or voltage or current information from the LEDs via the detector/signal conditioning element. In certain embodiments, the active electrical element 30 may be configured to communicate such monitoring information with an external source (e.g., the control element 18 of FIG. 1B or a separate device) so that the LED display may be configured to self-monitor various operating conditions and generate reports or visual indications if any of the monitored operating conditions are outside of target windows. In this regard, the active electrical element 30 may be configured for bi-directional communication with the external source.

Figure 12B:
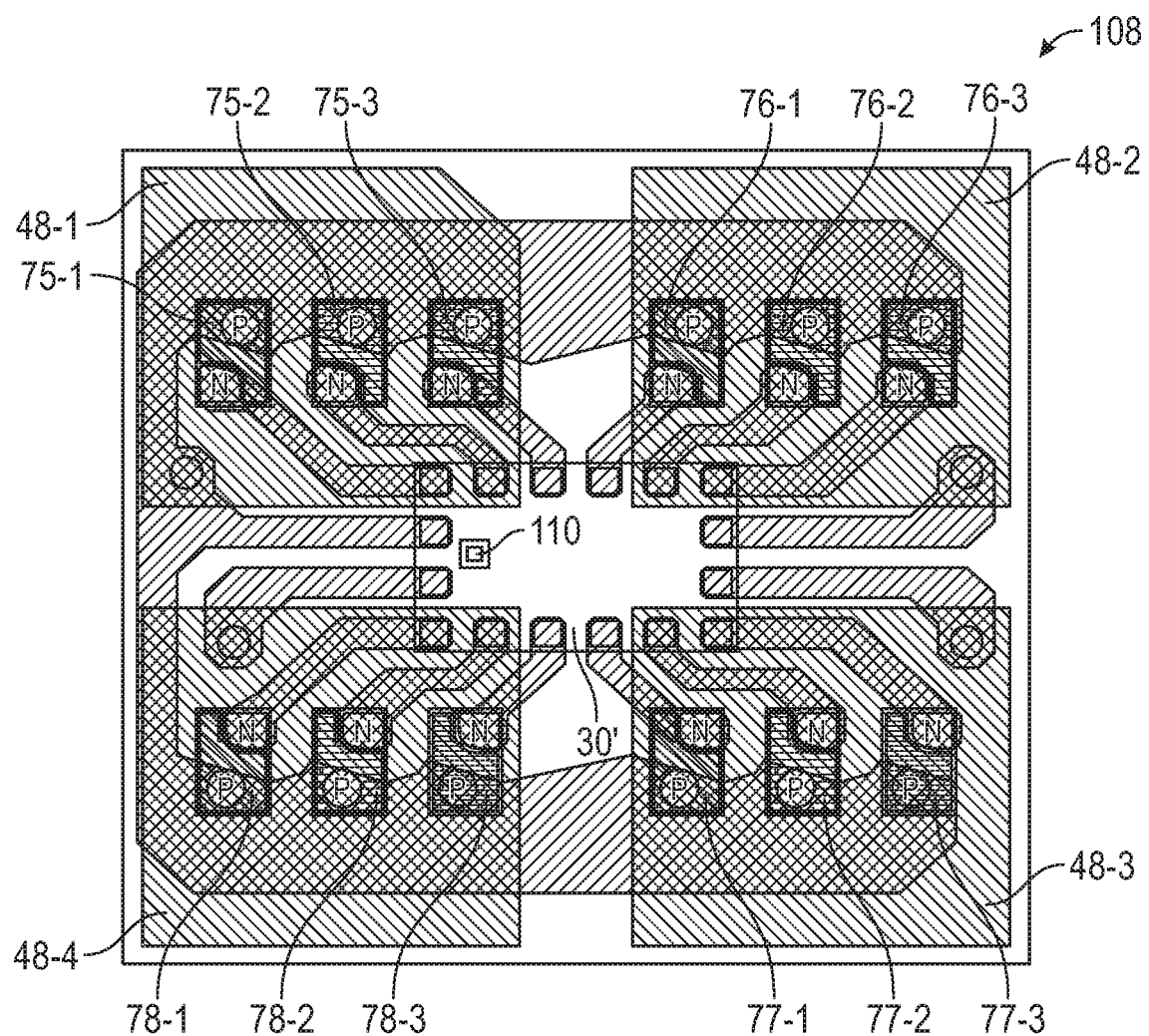
FIG. 12B is a bottom view of an LED package that includes a photodiode according to embodiments disclosed herein.

FIG. 12B is a bottom view of an LED package 108 that includes a photodiode 110 according to embodiments disclosed herein. The LED package 108 is similar to the LED package 74 of FIG. 7, and includes the plurality of LED chips 75-1 to 75-3, 76-1 to 76-3, 77-1 to 77-3, and 78-1 to 78-3 that respectively form a plurality of LED pixels and the active electrical element 30' as previously described. The LED package 108 may also include the package bond pads 48-1 to 48-4 and the electrically conductive traces (42-1 to 42-16 of FIG. 7). As illustrated, the LED package 108 comprises the photodiode 110 that is configured to detect and communicate a light signal to other components of the active electrical element 30' as described in FIG. 12A. In certain embodiments, the active electrical element 30' comprises the photodiode 110. In certain embodiments, the photodiode 110 is arranged on the active electrical element 30. In other embodiments, the photodiode 110 is arranged outside of the active electrical element 30'. For example, in certain embodiments, the LED package 108 includes black encapsulant materials that cover the LED package 108 except for areas registered with each of the LED chips 75-1 to 75-3, 76-1 to 76-3, 77-1 to 77-3, and 78-1 to 78-3. In this regard, the photodiode 110 may be arranged adjacent to one of the LED chips 75-1 to 75-3, 76-1 to 76-3, 77-1 to 77-3, and 78-1 to 78-3 such that an adequate amount of a light signal may reach the photodiode 110 without being absorbed by the black encapsulant materials. In other embodiments, the photodiode may be incorporated within other LED packages, including the LED package 26 of FIG. 2H, the LED package 58 of FIG. 3A, the LED package 66 of FIG. 4, the LED package 68 of FIG. 5, and the LED package 70 of FIG. 6, among others. As previously described, the photodiode 110 may be omitted in certain embodiments and one or more of the LED chips 75-1 to 75-3, 76-1 to 76-3, 77-1 to 77-3, and 78-1 to 78-3 may serve as a photodiode when scanned with a light beam during an initial setup procedure.

Figure 13:
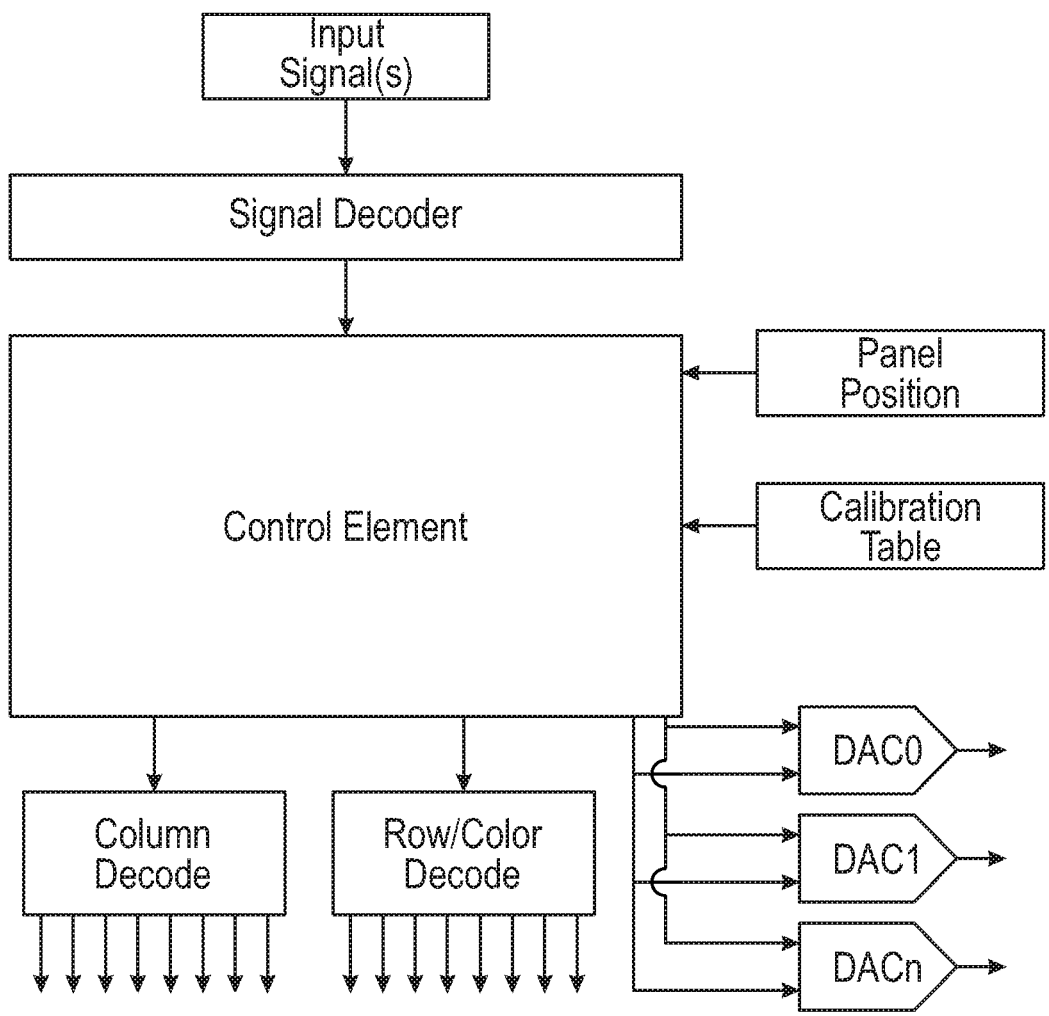
FIG. 13 is block diagram schematic illustrating various components that may be included in a system level control scheme for an LED display panel according to embodiments disclosed herein.

FIG. 13 is block diagram schematic illustrating various components that may be included in a system level control scheme for an LED display panel according to embodiments disclosed herein. In certain embodiments, the components of the system level control scheme may be included on a backside of a display panel as previously illustrated in FIG. 1B. In operation, input signals are received by the LED display panel from an external video source. As previously described, a video source such as a VGA, DVI, HDMI, HUB75, USB, among others, is provided through an appropriate electrical connector. A signal decoder, such as a DVI/HDMI decoder may be configured to provide conversion of the input signals to other formats, such as 24-bit transistor-to-transistor logic (TTL) or complementary metal-oxide-semiconductor (CMOS) color pixel data. For example, the signal decoder may convert the input signal into a 24-line data bus along with other control signals, such as the pixel clock, vertical sync, and horizontal sync that is then routed to the control element. As previously described, the control element may comprise one or more of an ASIC, a microcontroller, a programmable control element, and a field-programmable gate array FPGA. For example, the control element may comprise a FPGA that is programmed to scale, offset, or otherwise transform the converted data from the signal decoder and provide buffering of the data for control lines that will ultimately deliver various signals to the LED packages and corresponding LED pixels of the LED display panel. In certain embodiments, the control element is also configured to receive additional inputs that are used to transform the input signals. For example, the additional inputs may include horizontal and vertical panel position information of the LED display panel within a larger LED display. When multiple LED display panels are assembled together to form the larger LED display, each of the LED display panels may be configured with a unique position identifier that is relayed to the control element. The unique identifier, such as a serial number or position coordinates, may be pre-assigned before or during installation or the unique identifier may be assigned simply by the order of which they are connected when the LED display panels are assembled. In the latter configuration, each of the LED display panels may be configured to communicate with each other via shift registers or the like such that during installation, as the LED display panels are arranged next to each other in a daisy chain configuration, position information is relayed to from one LED display panel to the next LED display panel in the order they are installed, in a similar manner to HUB75 compatible panels. The additional inputs may also include a calibration table, such as a hash table, that provides information so that the control element may transform the input signals in a manner that compensates for any uneven performance characteristics between LED chips of the LED display panel. For example, after assembly of the LED display panel, the intensity of every LED pixel may be measured and the calibration table may then be configured to provide information to the control element to scale drive signals differently to different LED pixels based on their initial measured brightness levels.

The control element may thereby be configured to receive input signals via the signal decoder as well as additional inputs including panel position or calibration information. As previously described, the control element may comprise one or more integrated circuits of various types. In certain embodiments, the control element comprises an ASIC that is pre-configured for application in the LED display panel. In other embodiments, the control element comprises an FPGA that provides the ability to be programmed and reprogrammed after installation. As such, other supporting devices such as power input and conditioners, a programming interface, volatile and non-volatile memory elements and the like are implied. The control element is configured to process the input signals as well as any of the additional inputs and output control signals that are sent to the active electrical elements of each of the LED pixels. In certain embodiments, a plurality of DACs may be arranged to convert signals from the control element before routing the signals to the LED pixels. The control element may also be configured to output column, row, and LED color select information to the LED pixels that determines when each LED pixel and each LED chip within each LED pixel responds to the control signals from the plurality of DACs. In certain embodiments, one or more column, row, or color select decoders may be configured to receive and transform the output column, row, and/or LED color select information from the control element before routing to the LED pixels. For example, the control element may comprise an FPGA that outputs a digital signal code of 0's and 1's for the column, row, or color select information. In turn, the column, row, or color select decoders may be configured to receive and decode the digital signal so that the active control element of a particular LED pixel within the LED display panel may be activated.

For display applications, an LED display panel may include a plurality of LED packages arranged in columns and rows to form an LED pixel array. Each of the LED packages may include one or more LED pixels that include a first LED chip (e.g., a red LED chip), a second LED chip (e.g., a blue LED chip), and third LED chip (e.g., a green LED chip) and an active electrical element as previously described. Depending on the driving configuration between the control element and the LED packages, the number of control lines and the number of row, column, color select lines that are connected between the control element and each LED package may be varied.

Figure 14:
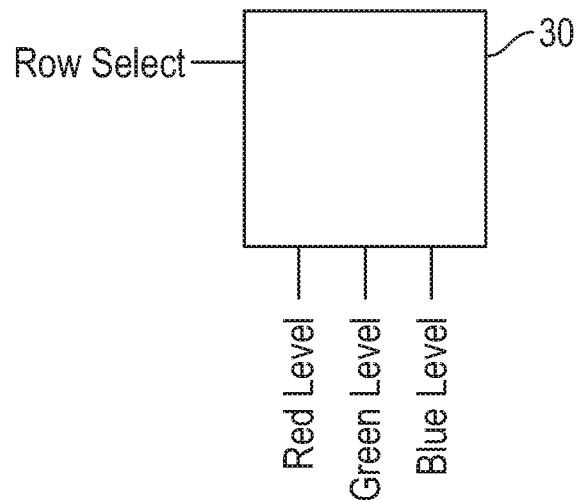
FIG. 14 is a schematic illustration representing a configuration where an active electrical element corresponding to a particular LED pixel is configured to receive a row select signal line as well as separate control signals for each red, green, and blue LED chips that are included within the LED pixel.

FIG. 14 is a schematic illustration representing a configuration where the active electrical element 30 corresponding to a particular LED pixel is configured to receive a row select signal line as well as separate control signals for each of the red, green, and blue LED chips that are included within the LED pixel. In this regard, the row select signal activates each active electrical element 30 of a particular row of LED pixels, and each column of LED pixels is configured to receive the three separate control signals for each of the red, green and blue LED chips. The three separate control signals may correspond to three separate DACs per column, or analog control signals. The control signals may control a brightness level, or grey level, for each of the red, green and blue LED chips within a particular LED pixel. Accordingly, when the control signals are passed along a particular column, the row select signal determines which of the LED pixels responds to the signal. As previously described, the active electrical element 30 corresponding to each LED pixel is configured to store the red, green, and blue level signal information and accordingly drive the LED chips in a constant manner until the next time the active electrical element 30 is activated to refresh or update the signal information. Accordingly, for the configuration of FIG. 14, the active electrical element 30 is configured with connections to receive four different signal lines (Row Select, Red Level, Green Level, Blue Level) in addition to ground and voltage input connections. Accordingly, this configuration requires at least six connections with increased PCB routing complexity. In certain embodiments, it may be desirable to have fewer connections, such as the 4-connection embodiments shown in previous embodiments (e.g., FIG. 2E).

Figure 15:
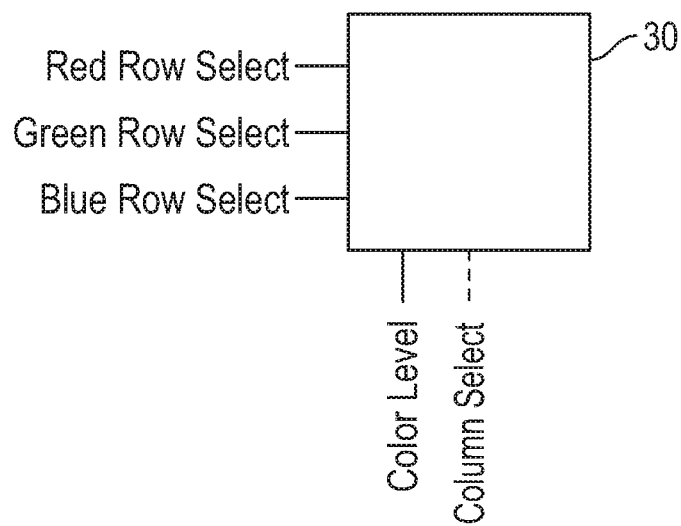
FIG. 15 is a schematic illustration representing a configuration where an active electrical element corresponding with a particular LED pixel is configured to receive a separate row select signal line for each LED chip of the LED pixel and a single color level signal line for all of the LED chips within the LED pixel.

FIG. 15 is a schematic illustration representing a configuration where the active electrical element 30 corresponding with a particular LED pixel is configured to receive a separate row select signal line for each LED chip of the LED pixel and a single color level signal line for all of the LED chips within the LED pixel. In FIG. 15, three separate row select signals (Red Row Select, Green Row Select, Blue Row Select) are to separately activate each of the red, green, and blue LED chips within the LED pixel. Accordingly, a single color level (e.g., brightness level or grey level) may be provided for each of the red, green, and blue LED chips within the LED pixel. In this regard, each column may be configured with a single DAC as previously described. In other embodiments, the active electrical element 30 may be configured to receive an optional column select line, thereby allowing a single DAC to provide color level signals for multiple columns of LED pixels. In operation, a particular row select signal activates a particular LED chip for responding to the color level signal at a particular time. As with previous embodiments, the active electrical element 30 is configured to store the color level signal information and accordingly drive each of the LED chips until the next time the active electrical element 30 is activated to refresh or update the color level information. Accordingly, for the configuration of FIG. 15, the active electrical element 30 is configured with connections to receive four to five different signal lines (Red Row Select, Blue Row Select, Green Row Select, Color Level, and optional Column Select) in addition to ground and voltage input connections. Although the overall system complexity is reduced by the reduction of DACs, the requirement of at least six connections may be undesirable for some applications.

Figure 16:
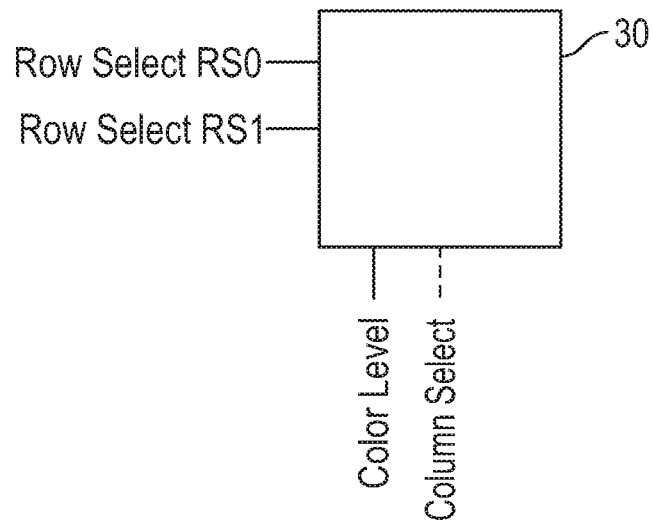
FIG. 16 is a schematic illustration representing a configuration where an active electrical element corresponding with a particular LED pixel is configured to receive encoded row select signals for each LED chip of the LED pixel and a single color level signal line for all of the LED chips within the LED pixel.

FIG. 16 is a schematic illustration representing a configuration where the active electrical element 30 corresponding with a particular LED pixel is configured to receive encoded row select signals for each LED chip of the LED pixel and a single color level signal line for all of the LED chips within the LED pixel. In FIG. 16, the color level and optional column select lines may be configured the same as previously described for FIG. 15; however, the row select signals are reduced to two row select lines (Row Select RS0, Row Select RS1). In this regard, the row select lines are configured to provide an encoded digital signal (combinations of 0's and 1's) that determine which LED chip should respond to a particular color level signal. By way of a non-limiting example, the two row select lines could provide a "00" digital signal corresponding to an operating state where none of the LED chips should respond, a "01" digital signal corresponding to activation of the red LED chip, a "10" signal corresponding to activation of the blue LED chip, and a "11" signal corresponding to activation of the green LED chip. As with previous embodiments, the active electrical element 30 is configured to store the color level signal information and accordingly drive each of the LED chips in a constant manner until the next time the active electrical element 30 is activated to refresh or update the color level information. Accordingly, for the configuration of FIG. 16, the active electrical element 30 is configured with connections to receive three to four different signal lines (Row Select RS0, Row Select RS1, Color Level, and optional Column Select) in addition to ground and voltage input connections. Accordingly, the reduction of at least one connection represents an improvement in reduced PCB complexity compared with the embodiments of FIGS. 14 and 15.

Figure 17:
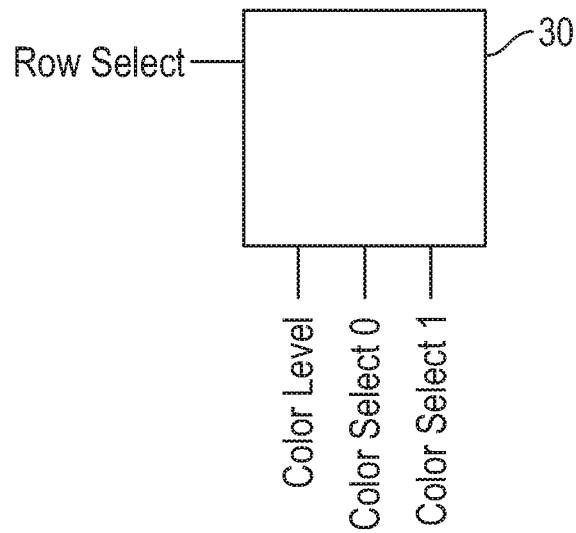
FIG. 17 is a schematic illustration representing a configuration where an active electrical element of a particular LED package is configured to receive a row select signal, a color level signal, and one or more color select signals for red, green, and blue LED chips that are included within the LED package.

FIG. 17 is a schematic illustration representing a configuration where the active electrical element 30 of a particular LED pixel is configured to receive a row select signal, a color level signal, and one or more color select signals for the red, green, and blue LED chips that are included within the LED pixel. In FIG. 17, the row select signal is configured the same as the configuration of FIG. 14; however, the signal for color level (e.g., the brightness or grey level) of each of the LED chips is controlled by a single signal line. In this regard, each column may be configured with a single DAC as previously described. In other embodiments, a single DAC may be configured to provide signals for color level to multiple columns of LED pixels. In order to determine which of the LED chips within the LED pixel should respond to a particular color level signal, two color select lines (Color Select 0, Color Select 1) are configured to provide an encoded digital signal (combinations of 0's and 1's) that determine which LED chip should respond to a particular color level signal. By way of a non-limiting example, the two color select lines could provide a "00" digital signal corresponding to an operating state where none of the LED chips should respond, a "01" digital signal corresponding to activation of the red LED chip, a "10" signal corresponding to activation of the blue LED chip, and a "11" signal corresponding to activation of the green LED chip. Accordingly, for the configuration of FIG. 17, the active electrical element 30 is configured with connections to receive four different signal lines (Row Select, Color Level, Color Select 0, Color Select 1) in addition to ground and voltage input connections.

Figure 18:
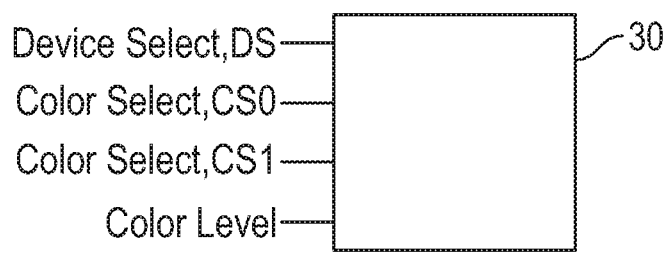
FIG. 18 is a schematic illustration representing an independent notation configuration that is similar to both the configurations of FIG. 16 and FIG. 17.

FIG. 18 is a schematic illustration representing a configuration similar to both the configurations of FIG. 16 and FIG. 17. In particular, FIG. 18 represents a configuration independent notation that could represent either of the configurations of FIG. 16 or FIG. 17. In FIG. 18, the active electrical element 30 includes a color level line which is the same as the color level lines in FIG. 16 and FIG. 17. The active electrical element 30 of FIG. 18 additionally includes a device select (DS) line and two color select lines (CS0 and CS1). The DS line is configured to provide a device select signal that may include at least one of a row select signal and a column select signal. The CS0 and CS1 lines are configured to provide encoded signals that could correspond to either the Row Select RS0 and Row Select RS1 lines of FIG. 16 or the Color Select 0 and Color Select 1 lines of FIG. 17. In this regard, the active electrical element 30 may be configured to control a certain number of operating conditions with a few number of connections. The DS line corresponds with either the Column Select line of FIG. 16 or the Row Select line of FIG. 17.

Figure 19:
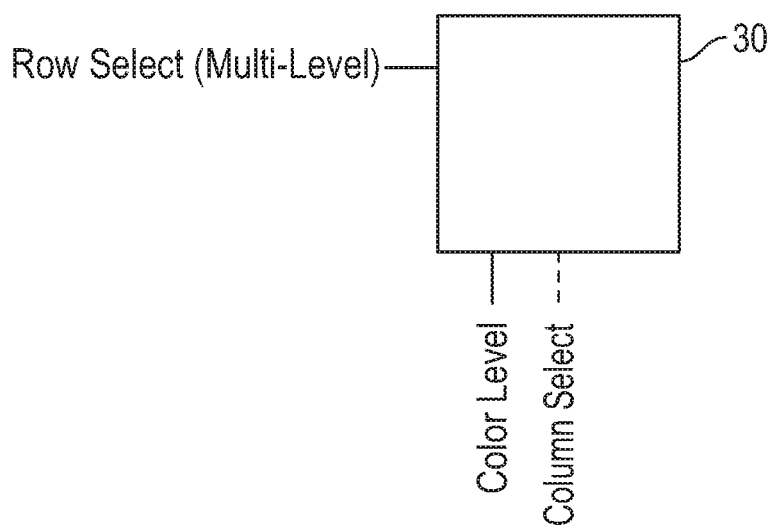
FIG. 19 is a schematic illustration representing a configuration where an active electrical element corresponding with a particular LED pixel is configured to receive a single row select signal line and a single color level signal line for all LED chips of the LED pixel.

FIG. 19 is a schematic illustration representing a configuration where the active electrical element 30 corresponding with a particular LED pixel is configured to receive a single row select signal line and a single color level signal line for all LED chips of the LED pixel. In FIG. 19, the color level and optional column select lines may be configured the same as previously described for FIG. 15; however, the row select signals are combined into a signal row select line. In this regard, the single row select line may be configured to send an encoded signal that separately corresponds to each of the LED chips within the LED pixel. The encoded signal may comprise an analog signal that comprises at least one of a variable amplitude signal, a variable frequency signal, or a variable phase signal. The encoded signal may also comprise a multiplexed or multiple level logic signal. In certain embodiments, the row select line may be configured to provide a signal with different voltage states that correspond to different ones of the LED chips. For example, the row select line may be configured as a four-level signal line where each of the four signal levels corresponds to one of the following operational conditions: no LED chips selected, red LED select, blue LED select, and green LED select. In certain embodiments, an additional active electrical element may be provided to further facilitate processing of the four-level signal line. The additional active electrical element may be provided within each LED package or separately from each LED package. As with previous embodiments, the active electrical element 30 is configured to store the color level signal information and accordingly drive each of the LED chips in a constant manner until the next time the active electrical element 30 is activated to refresh or update the color level information. Accordingly, for the configuration of FIG. 19, the active electrical element 30 is configured with connections to receive two to three different signal lines (Row Select (multi-Level), Color Level, and optional Column Select) in addition to ground and voltage input connections. This configuration is desirable for applications with reduced-complexity, such as the 4-connection configurations previously described (e.g., FIG. 2E).

Figure 20:
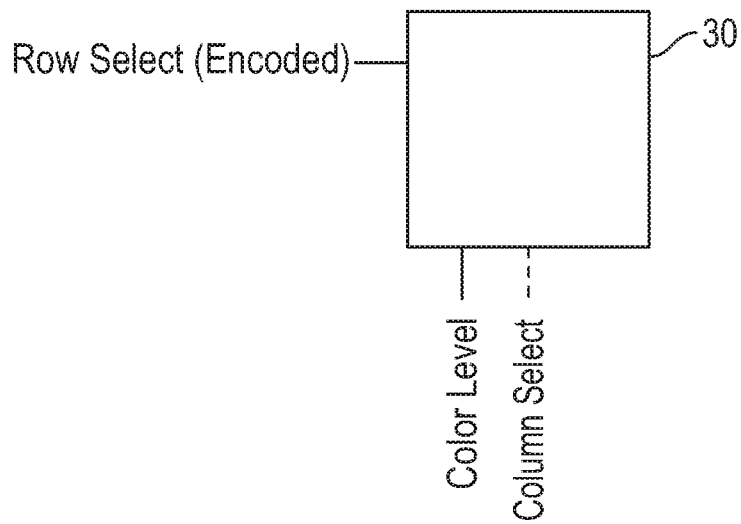
FIG. 20 is a schematic illustration representing a configuration where an active electrical element corresponding with a particular LED pixel is configured to receive a single row select signal line and a single color level signal line for all LED chips of the LED pixel.

FIG. 20 is a schematic illustration representing a configuration where the active electrical element 30 corresponding with a particular LED pixel is configured to receive a single row select signal line and a single color level signal line for all LED chips of the LED pixel. FIG. 20 is similar to the configuration of FIG. 19 and includes the color level and optional column select lines as previously described. In FIG. 20, the row select signal line may be configured to send an encoded signal, such as an encoded digital signal that is asynchronous, portions of which separately correspond to each of the LED chips within the LED pixel. In certain embodiments, the encoded signal comprises different pulses that correspond to each of the red LED select, blue LED select, green LED select, and no LED select operational conditions. Other operational states may be addressed as well by extending the coding schemes. In this manner, the active electrical element 30 may comprise a shift register that cycles through each of the operational states (e.g., no select, red select, blue select, green select) sequentially with each pulse of the encoded signal. In order to prevent the shift register from getting out of sync, the encoded signal may also comprise a pulse code at the end of each cycle to reset the shift register to the beginning of the next cycle. In addition to sequential pulses, the row select line may comprise other encoded signals that identify and correspond to different ones of the four or more operational states mentioned above. Accordingly, for the configuration of FIG. 20, the active electrical element 30 is configured with connections (e.g., the contact pads 38 of FIG. 2A) to receive two to three different signal lines (Row Select (encoded), Color Level, and optional Column Select) in addition to ground and voltage input connections. As with the configuration of FIG. 19, the configuration of FIG. 20 is desirable for applications with reduced-complexity, such as the 4-connection configurations previously described (e.g., FIG. 2E).

Figure 21:
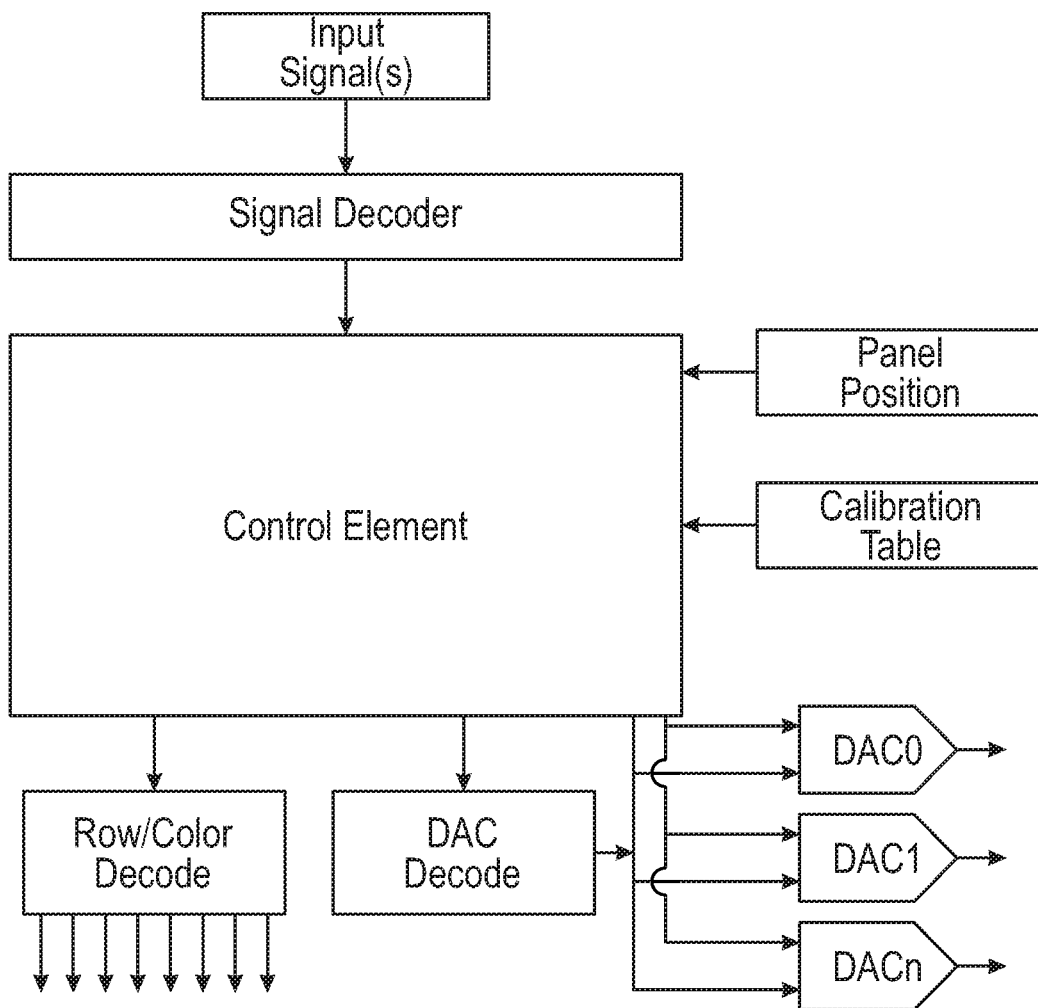
FIG. 21 is a block diagram schematic illustrating a system level control scheme for an LED display panel where each active electrical element of an LED pixel array is configured to receive signal lines according to the embodiment of FIG. 20.

FIG. 21 is a block diagram schematic illustrating a system level control scheme for an LED display panel where each active electrical element of an LED pixel array is configured to receive signal lines according to the embodiment of FIG. 20. In FIG. 21, input signals, the signal decoder, the control element, the row/column decoder, the panel position input, the calibration table input, and the plurality of DACs may be provided as previously described for FIG. 13. In FIG. 21, no column select lines are included and an optional DAC decoder element is arranged to allow selection of the proper DAC element to receive data provided by a common data bus. In other embodiments, the control element may be configured to include DAC decoding capabilities and, accordingly, the DAC decoder element may not be required. Depending on the number of output pins available on a particular FPGA or other control element, a separate row/color decoder may also not be required.

Figure 22:
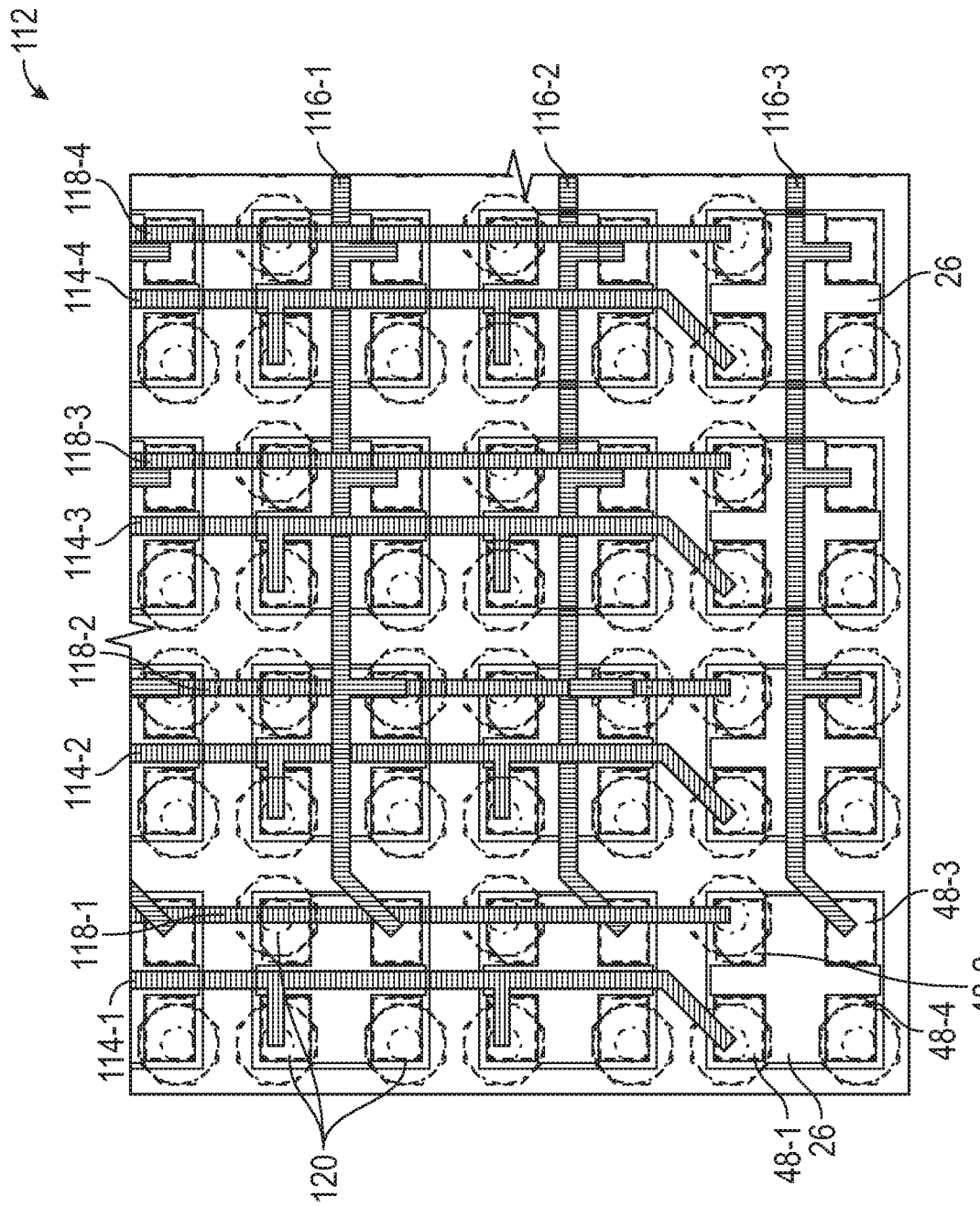
FIG. 22 is a partial plan view illustrating a routing configuration for an LED display panel that is configured for operation according to the configurations of FIG. 20 and FIG. 21.

FIG. 22 is a partial plan view illustrating a routing configuration for an LED panel 112 that is configured for operation according to the configuration of FIG. 20 and FIG. 21. In FIG. 22, a plurality of LED packages 26 are arranged in rows and columns to form an LED pixel array. Each LED package 26 may include the plurality of LEDs (e.g., 28-1 to 28-3 of FIG. 2) that form an LED pixel, the active electrical element (30 of FIG. 2), and the plurality of package bond pads 48-1 to 48-4 as previously described. As illustrated in FIG. 22, the plurality of LED packages 26 are connected to a plurality of color level control lines 114-1 to 114-4 that correspond to the color level select line of FIG. 20 and a plurality of row select control lines 116-1 to 116-3 that correspond to the row select line of FIG. 20. For the LED package 26 that is labeled in FIG. 22, the package bond pad 48-1 is connected to the color level control line 114-1, and the package bond pad 48-3 is connected to the row select control line 116-3. The package bond pad 48-2 is connected to a voltage input line 118-1 of a plurality of voltage input lines 118-1 to 118-4 and the package bond pad 48-4 is connected to a ground connection plane (not shown). In certain embodiments, the plurality of color level control lines 114-1 to 114-4 and the plurality of row select control lines 116-1 to 116-3 may be arranged on different levels or planes of a multiple-layer connector interface with one or more dielectric layers arranged therebetween for electrical insulation. For example, the row select control lines 116-1 to 116-3 may be arranged along a first plane that is closest to the plurality of LED packages 26. The plurality of color level control lines 114-1 to 114-4 and the plurality of voltage input lines 118-1 to 118-4 may be arranged along a different plane at a greater distance away from the plurality of LED packages 26. Finally, a ground connection plane (not shown) may be arranged along another different plane at a greater distance away from the plurality of LED packages 26 than the plurality of color level control lines 114-1 to 114-4 and the plurality of voltage input lines 118-1 to 118-4. A plurality of vias 120 may be arranged through the multiple-layer connector interface to provide corresponding connections with the package bond pads 48-1 to 48-4. FIG. 22 illustrates only one of many configurations for a routing configuration of the LED panel 112. In other embodiments, the various lines 114-1 to 114-4, 116-1 to 116-3, and 118-1 to 118-4 may be provided in different arrangements of vertical and horizontal configurations, including but not limited to, all vertical and all horizontal configurations.

Figure 23:
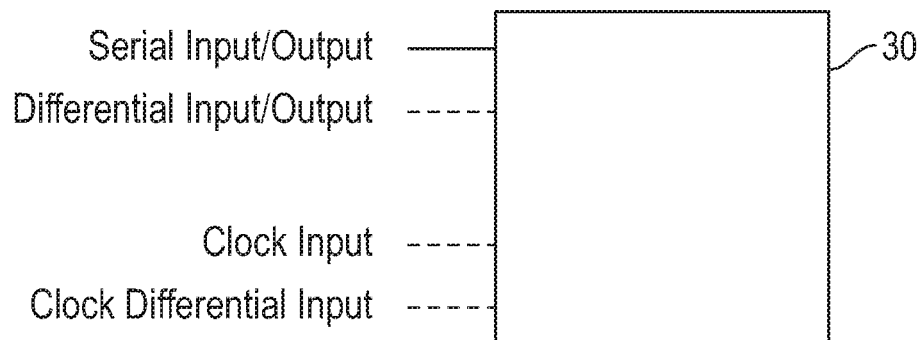
FIG. 23 is a schematic illustration representing a configuration where an active electrical element corresponding with a particular LED pixel is configured to receive all-digital communication for row, column, and/or color select signals.

FIG. 23 is a schematic illustration representing a configuration where the active electrical element 30 corresponding with a particular LED pixel is configured to receive all-digital communication for row, column, and/or color select signals. In addition, two-way communication may be achieved by one of many standard or custom protocols. As such, many additional tasks are enabled such as communication handshaking, addressing, status reporting, and a more extensive command structure. Stated differently, the active electrical element comprises a serial communication element. In this manner, a serial input/output line is configured to provide digital signals to the active electrical element 30 according to one of various serial communication link techniques. Serial communication techniques typically involve sending or streaming data in single bits sequentially over time. An optional clock input may be configured to receive a clock signal that provides cycling information for the LED pixel. In certain embodiments, serial communication (e.g., sending or receiving) may comprise high bit rates with differential signaling, including but not limited to low voltage differential signaling (LVDS), transition-minimized differential signaling (TDMS), current mode logic (CML), and source-coupled logic (SCL). In this regard, the active electrical element 30 may be configured to receive an optional differential input/output line and an optional clock differential input/output line. Certain serial communication techniques may be configured with self-clocking configurations or configurations for receiving self-clocking signals, and, accordingly, the clock input may not be required. Such self-clocking configurations may comprise a decoder element within the active electrical element that includes various decoding capabilities for clock recovery, such as 8b/10b encoding, Manchester coding, phase coding, pulse counting with or without a timed reset, isochronous signal coding, or anisochronous signal coding. Other communication techniques may include inter-integrated circuit ($I^2C$) protocol, I3C protocol, serial peripheral interface (SPI), ethernet, Fibre Channel (FC), universal serial bus (USB), IEEE 1394 or FireWire, HyperTransport (HT), InfiniBand (IB), digital multiplex (DMX), DC-BUS or other power line communication protocols, avionics digital video bus (ADVB), serial input/output (S10), controller area network (CAN), ccTalk protocol, CoaXPress (CXP), musical instrument digital interface (MIDI), MIL-STD-1553, peripheral component interconnect express (PCI Express), profibus, RS-232, RS-422, RS-423, RS-485, serial digital interface (SDI), serial AT attachment (Serial ATA), serial attached SCSI (SAS), synchronous optical networking (SONET), synchronous digital hierarchy (SDH), SpaceWire, UNI/O bus, and 1-Wire, among others. For some configurations, the active control element 30 is configured to operate (e.g., send or receive) with at least a subset of signals that are compatible with one of the above protocols, including but not limited to the $I^2C$ protocol. When arranged for all-digital communication, the active electrical element 30 is configured to latch input data, implement other logic, and provide the color level, or grey level, to LED pixels of a display. In certain embodiments, the active electrical element 30 may comprise a DAC-controlled current driver where one or more DACs are included within the active electrical element 30 with current driving output. In certain embodiments, the active electrical element 30 comprises a PWM driver or current source that is configured to independently drive each LED of an LED pixel based on digital input signals. When the active electrical element 30 is arranged for all digital communication, routing for an LED pixel array may be simplified. In this regard, each active electrical element 30 may only need to be configured to receive as little as one communication or signal line, such as the serial input/output line illustrated in FIG. 23, in certain embodiments.

Figure 24:
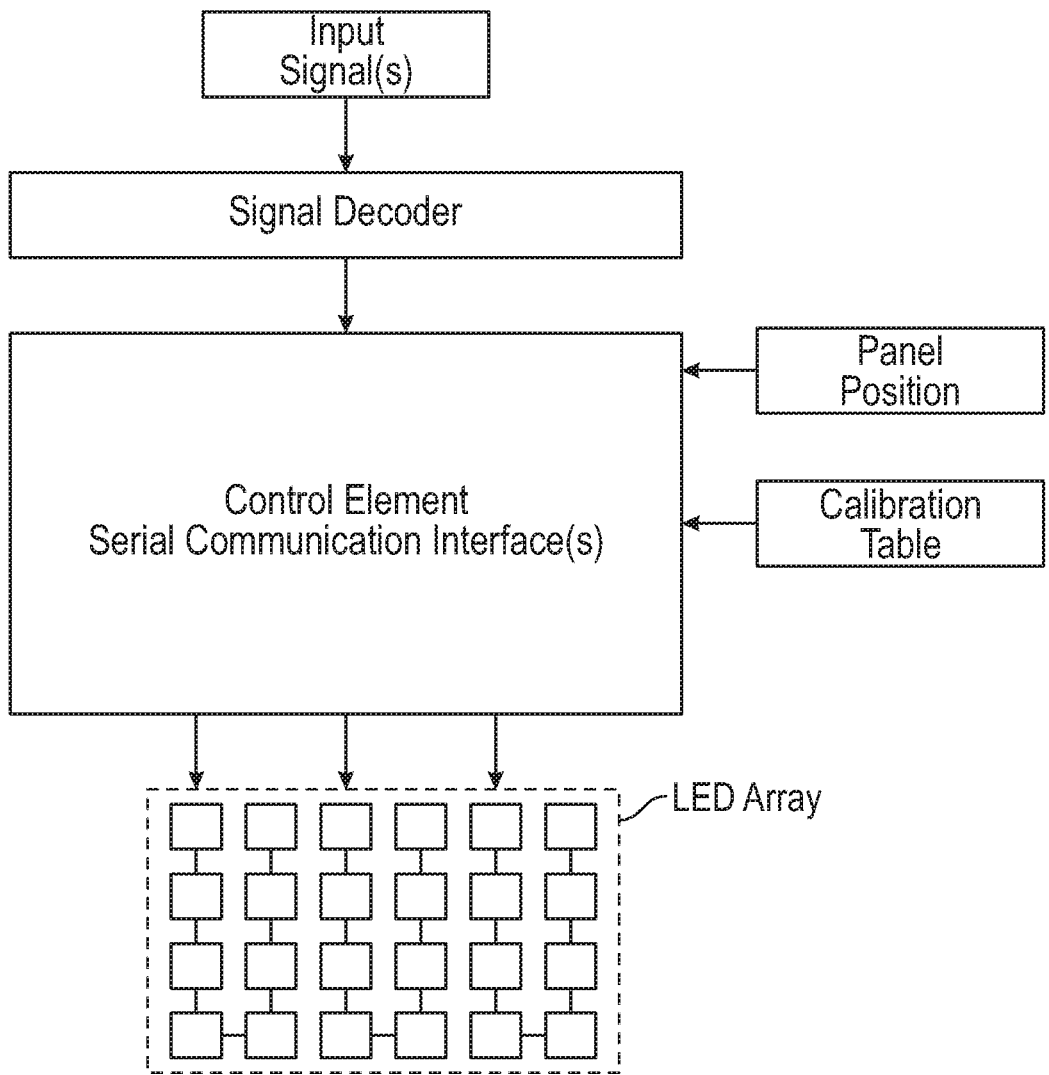
FIG. 24 is a block diagram schematic illustrating a system level control scheme for an LED display panel where each active electrical element of an LED pixel array is configured to receive signal lines according to the embodiment of FIG. 23.

FIG. 24 is a block diagram schematic illustrating a system level control scheme for an LED display panel where each active electrical element of an LED pixel array is configured to receive signal lines according to the embodiment of FIG. 23. In FIG. 24, input signals, the signal decoder, the panel position input, and the calibration table input may be provided as previously described for FIG. 13. In certain embodiments, the control element comprises one or more a serial communication interfaces or serial communication elements as previously described. Accordingly, no DAC elements are needed, thereby providing a simplified configuration compared with the block diagram of FIG. 21. Depending on the number of output pins available on a particular FPGA or other control element, a separate row/color decoder may also not be required. As illustrated, the output of the control element may communicate directly to the LED array with a plurality of serial outputs in communication with a plurality of serial lines or strings of LEDs of the LED array. In FIG. 24, each string of LEDs is shown with two columns for illustrative purposes. In practice, the strings of LEDs may be arranged in rows and columns of different sizes and numbers, or the electrical connections for each string may not follow the rows and columns as shown.

Figure 25:
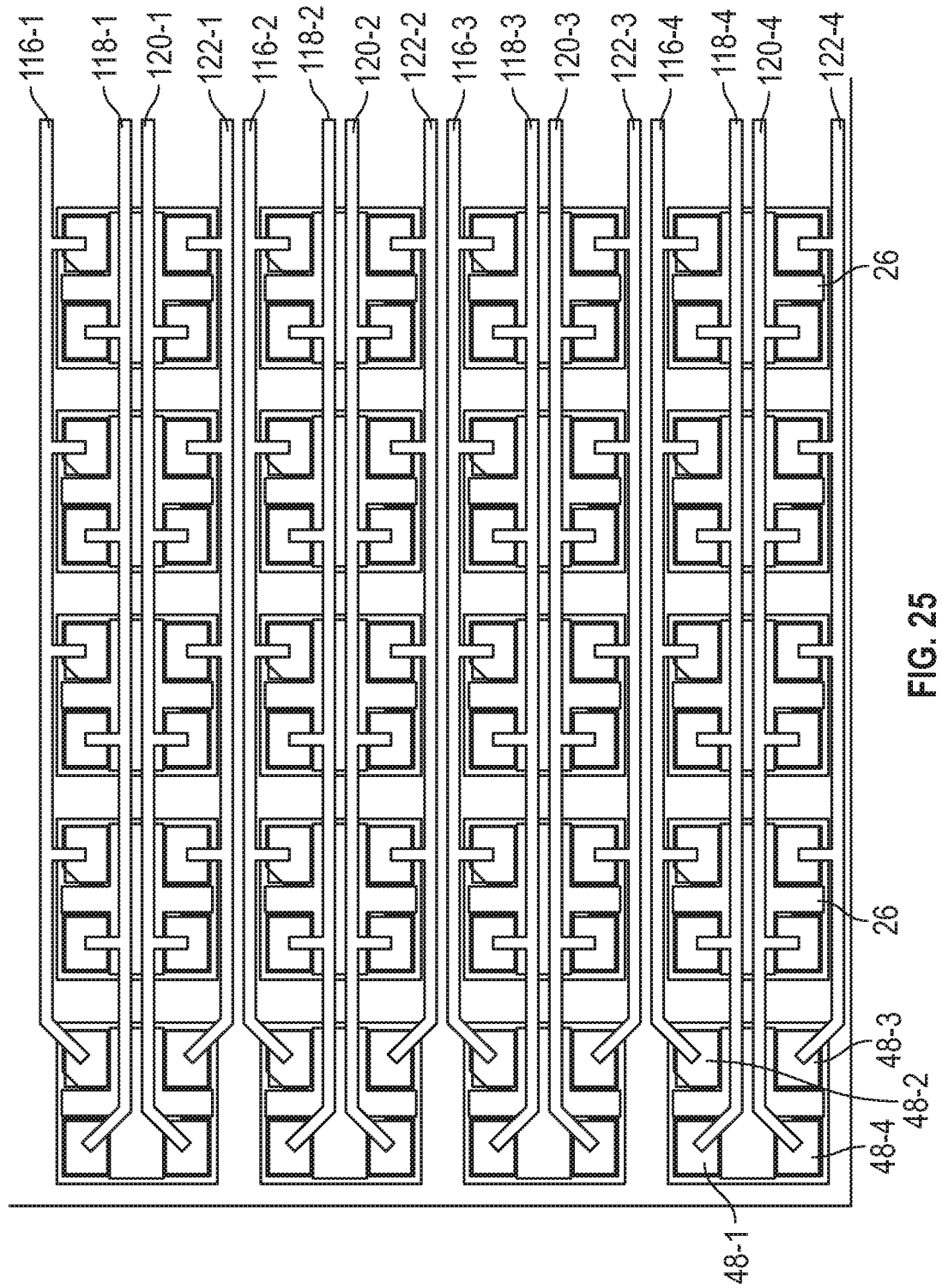
FIG. 25 is a partial plan view illustrating a routing configuration for an LED display panel that is configured for operation according to the configuration of FIG. 23.

FIG. 25 is a partial plan view illustrating a routing configuration for an LED panel that is configured for operation according to the configuration of FIG. 23. In FIG. 25, a plurality of LED packages 26 are arranged in rows and columns to form an LED pixel array. Each LED package 26 may include the plurality of LEDs (e.g., 28-1 to 28-3 of FIG. 2) that form an LED pixel, the active electrical element (e.g., 30 of FIG. 2), and the plurality of package bond pads 48-1 to 48-4 as previously described. In this configuration, the control lines 116-1 to 116-4 correspond to the serial input/output line of FIG. 23, the first and second voltage input lines 118-1 to 118-4 and 120-1 to 120-4, and the ground connection lines 122-1 to 122-4 illustrated. As illustrated, no color level control lines from DACs (e.g., 114-1 to 114-4 of FIG. 22) are required, thereby providing a simplified PCB routing configuration. In FIG. 25 input electrical connections that include the control lines 116-1 to 116-4, the voltage lines 118-1 to 118-4, 120-1 to 120-4, and the ground lines 122-1 to 122-4 are all arranged along the same plane or layer of the LED panel. This configuration provides a more simple structure and fabrication process, as well as reduced costs. In other embodiments, the control lines 116-1 to 116-4, voltage lines 118-1 to 118-4, 120-1 to 120-4, and the ground lines 122-1 to 122-4 may be configured on different planes with different arrangements of dielectric layers and vias to make the various connections to each LED package 26. In FIG. 25, the control lines 116-1 to 116-4, voltage lines 118-1 to 118-4, 120-1 to 120-4, and the ground lines 122-1 to 122-4 are illustrated with long linear segments across the LED panel. In certain embodiments, the control lines 116-1 to 116-4, voltage lines 118-1 to 118-4, 120-1 to 120-4, and the ground lines 122-1 to 122-4 may be arranged in other configurations, such as comb routing or other chain configurations that may reduce crosstalk between various lines. In certain embodiments, the control lines 116-1 to 116-4, voltage lines 118-1 to 118-4, 120-1 to 120-4, and the ground lines 122-1 to 122-4 may not be registered with particular rows and columns of LED packages 26. For example, the control lines 116-1 to 116-4, voltage lines 118-1 to 118-4, 120-1 to 120-4, and the ground lines 122-1 to 122-4 may be configured to connect and communicate with subgroups of the LED packages 26 that are arranged in blocks or other shapes across the LED panel.

In certain embodiments, signal communication between a control element and LED packages of an LED display may comprise sending a control signal from the control element that includes a plurality of data packets. A particular data packet may include control information such as color select data and brightness level data for an individual LED package of an array. In certain embodiments, a data packet may comprise a file size that includes a range including as low as a single bit of data to much larger file sizes (e.g., large video files). Each data packet may also include a command code that is configured as an identifier or a series of identifiers that enables each LED package of the array to receive the command code and either respond to the data packet or pass the data packet along to the next LED package. In this manner, the LED packages may be arranged to receive different data packets from the control signal in a cascading manner.

Figure 26A:
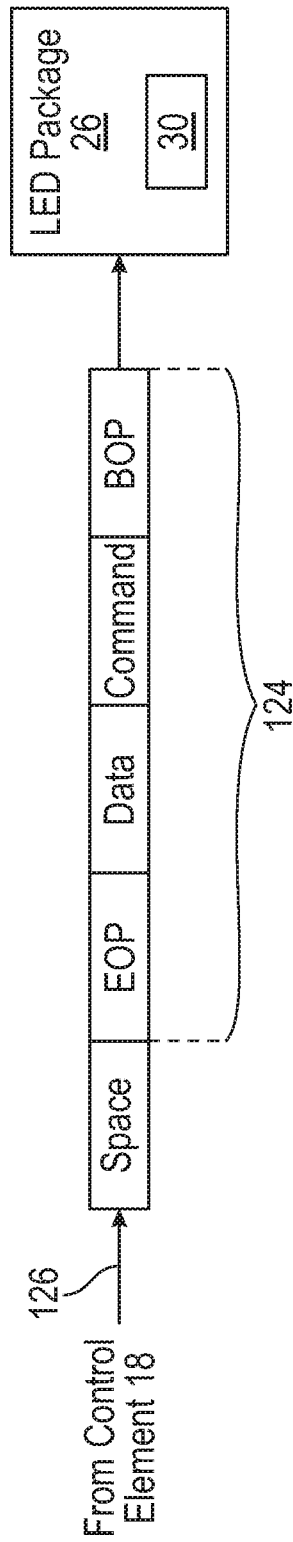
FIGS. 26A and 26B are schematic diagrams illustrating arrangements of an exemplary data packet according to embodiments disclosed herein.
Figure 26B:
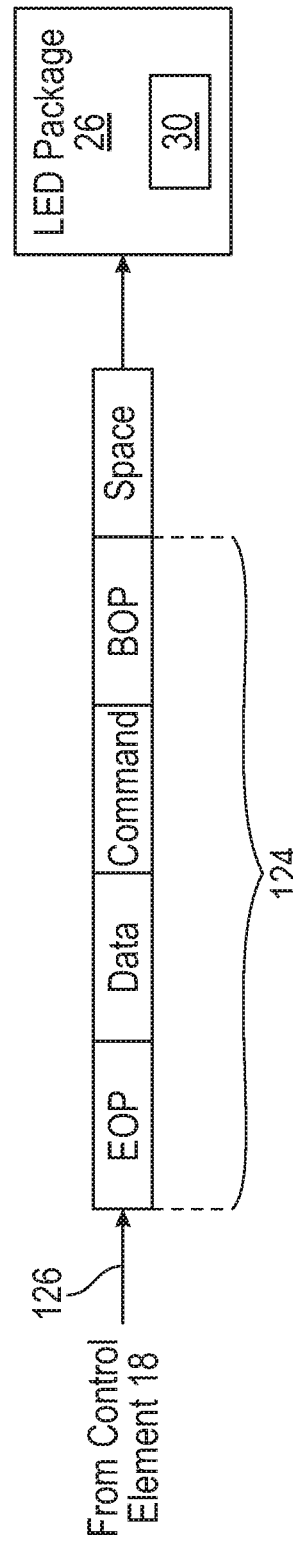

FIGS. 26A and 26B are schematic diagrams illustrating arrangements of an exemplary data packet 124 according to embodiments disclosed herein. The data packet 124 is included in a data stream 126 that is sent via a control line from the control element 18 to the active electrical element 30 of the LED package 26. In certain embodiments, the data stream 126 may include a plurality of data streams, including a cascade approach where the data stream 126 comprises a plurality of sub-data streams. In certain embodiments, the LED package 26 forms one or more pixels (e.g., 12 of FIG. 1A) as previously described. There may be additional LED packages arranged before or after the LED package 26 that are configured to receive the data stream 126. In this manner, the LED package 26 may receive the data packet 124 directly from the control element 18 or through another LED package that is arranged in the data stream 126 and between the control element 18 and the LED package 26. The data packet 124 may include an information or data section (indicated as "Data") for selecting and operating one or more LED chips of the LED package 26, including separate color select and brightness level data for each LED chip that is arranged within the LED package 26. The information or data may also include setup data, calibration data, temperature compensation data, and option select data, among others. Additionally, the data packet 124 may include instructions for turning on or off one or more LED chips of the LED package 26. In certain embodiments, at least some of the information or data from the data packet 124 may be stored in a register within the LED package 26 for later use. For applications where the LED package 26 forms one or more LED pixels that include multiple LED chips (e.g., red, green, and blue LED chips), the information or data may comprise data subsets that correspond to individual ones of the LED chips. The data packet 124 may also include a section that comprises a command code (indicated as "Command") that is configured as an identifier or a series of identifiers for the data packet 124 that identifies how the active electrical element 30 should respond to the data packet 124. In particular, the command code is configured to identify an action for the active electrical element 30 to take. In certain embodiments, the action comprises passing the data packet 124 through the LED package 26, or transmitting or retransmitting the data packet 124 through an output port of the LED package 26. In certain embodiments, the action comprises performing an internal action within the LED package 26 such as driving one or more of the LED chips within the LED package 26 and transmitting the data packet 124 through the LED package 26. As used herein, an internal action to the LED package 26 may include setting up or changing of a persistent state for a time frame defined by the data packet 124 or any other associated data packets for the given time frame. The persistent state may include one or more of turning one or more LED chips on or off, changing color or brightness levels of the LED chips, or setting up or updating calibration data, among others. In certain embodiments, the action comprises driving one or more of the LED chips within the LED package 26 without transmitting the data packet 124 through the LED package 26. In certain embodiments, the action comprises transmitting the data packet 124 without performing any other actions internal to the LED package 26. Such actions may at least be partially based one or more other data packets previously received by the LED package 26. In further embodiments, another data packet, or a second data packet, that is received by the LED package 26 may comprise a second command code that identifies a second action to take, the second action comprising transmitting the second data packet through the LED package 26. In other embodiments, the second action comprises driving one or more of the LED chips within the LED package 26 and transmitting the second data packet through the LED package 26. In this manner, the data packet 124 is configured with self-identification. In certain embodiments, the data packet 124 may comprise information that is configured to provide data handshaking with another LED package in the data stream 126. Data handshaking capabilities may include a beginning of packet section (indicated as "BOP") and/or an end of packet section (indicated as "EOP") of the data packet 124 such that the LED package 26 can acknowledge receipt and/or transfer of the data packet 124. In certain embodiments, the data steam 126 may comprise an empty space section (indicated as "Space") that is a period of no data or an empty transmission period that is arranged before or after the data packet 124 in the data stream 126. The period of no data transmission may be configured to control communication speed and prevent buffer overrun of the control signal for the LED package 26. For example, if multiple LED packages 26 with different communication speeds or clocking configurations are arranged to receive different data packets from the data stream 126 in a cascading manner, data overrun can occur. Accordingly, the period of no data transmission may be provided to ensure communication effectively runs at a controlled or slower speeds to avoid or reduce buffer overrun. The period of no data transmission may also be configured to signal a reset or restart condition, or signal a next frame condition. The period of no data transmission may be configured at different locations relative to the data packet 124, such as after the data packet 124 as illustrated in FIG. 26A, or before the data packet 124 as illustrated in FIG. 26B. In certain embodiments, the data packet 124 may include other commands, such as basic on or off instruction for the corresponding LED package 26.

Figure 27:
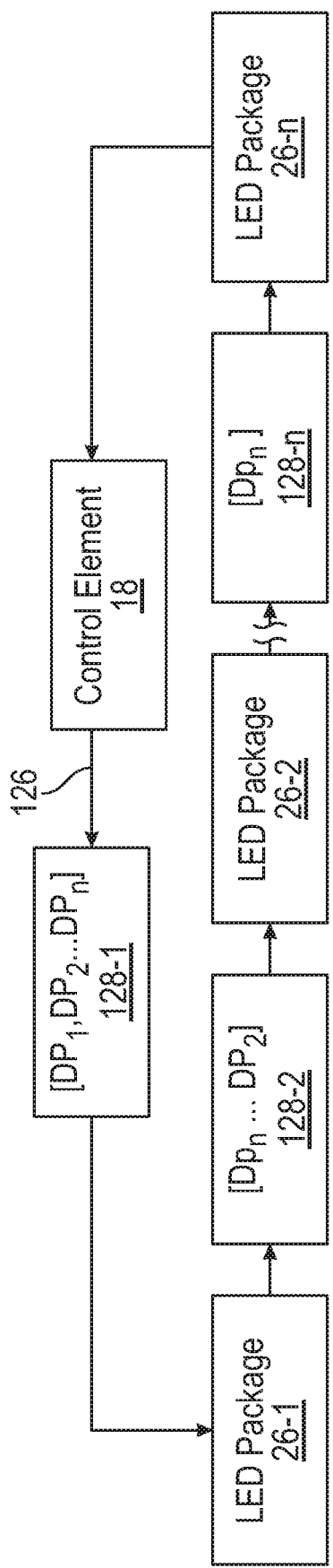
FIG. 27 is a schematic diagram illustrating a cascading flow of data packets from a control element to a plurality of LED packages according to embodiments disclosed herein.

FIG. 27 is a schematic diagram illustrating a cascading flow of a plurality of data packets $DP_1, DP_2 \ldots DP_n$ from the control element 18 to a plurality of LED packages 26-1, 26-2 . . . 26-n. In certain embodiments, any number (n) of LED packages may be provided to form an LED display. As illustrated, the control element 18 is configured to send the plurality of data packets $DP_1, DP_2 \ldots DP_n$ along the data stream 126 to the plurality of LED packages 26-1, 26-2 . . . 26-n. Each of the data packets $DP_1, DP_2 \ldots DP_n$ may be configured, for example, as described for the data packet 124 of FIG. 26A or 26B. A grouping of the data packets (e.g., one or more combinations of $DP_1, DP_2 \ldots DP_n$) may form one of a plurality of data sets 128-1, 128-2 . . . 128-n that correspond to a particular grouping of the data packets $DP_1, DP_2 \ldots DP_n$ that is received by a particular LED package 26-1, 26-2 . . . 26-n. For example, the data set 128-1 corresponds to the grouping of data packets $DP_1, DP_2 \ldots DP_n$ that is received by a first LED package 26-1, the data set 128-2 corresponds to the grouping of data packets $DP_2 \ldots DP_n$ that is received by a second LED package 26-2, and so on. In certain embodiments, a particular data packet (e.g., a first data packet $DP_1$) is configured for a corresponding LED package (e.g., the first LED package 26-1). In this manner, the data packets $DP_1, DP_2 \ldots DP_n$ are received by the first LED package 26-1, which is configured to take an action based on a first command code of the first data packet $DP_1$, remove the first data packet $DP_1$ from the data stream 126, and pass through or retransmit the data packets $DP_2 \ldots DP_n$ to the adjacent LED package 26-2. In a similar manner, the LED package 26-2 is configured to take action and remove the data packet $DP_2$ and pass through or retransmit the remaining data packets $DP_n$. This sequence continues until the remaining data packet $DP_n$ of the data set 128-n is received by the remaining LED package 26-n. For certain display applications, each of the LED packages 26-1, 26-2 . . . 26-n will retain an operating state from their corresponding data packet $DP_1, DP_2 \ldots DP_n$ until the control element 18 sends a new data set 128-1 for the corresponding LED package 26-1, 26-2 . . . 26-n. In certain embodiments, the control element 18 may be configured to provide a portion of the data stream 126, such as a bit pattern/code or a transmission delay, that indicates to the LED package 26-1, 26-2 . . . 26-n that the previous data set 128-1, 128-2 . . . 128-n is complete and to look for a next data set 128-1, 128-2 . . . 128-n. For transmission delays between different data sets 128-1, 128-2 . . . 128-n, a time delay may include a range from 1 microsecond to 0.1 seconds that provides a sufficient timeout for the LED packages 26-1, 26-2 . . . 26-n to begin looking for the next data set 128-1, 128-2 . . . 128-n. For LED display applications, each data set 128-1, 128-2 . . . 128-n may correspond to a data frame or a video frame for the LED display. For other LED applications, each data set 128-1, 128-2 . . . 128-n may correspond to an operating state such as a general illumination color point and/or brightness level, or a static image to be collectively provided by the LED packages 26-1, 26-2 . . . 26-n. In certain embodiments, the first data packet $DP_1$ that is configured for the first LED package 26-1 may comprises a same data length as the second data packet $DP_2$. In other embodiments, the first data packet $DP_1$ may comprise a data length that is larger than a data length of the second data packet $DP_2$ in order to transfer more information, such as color select data, brightness level data, setup data, calibration data, temperature compensation data, and/or option select data to the first LED package 26-1.

Figure 28:
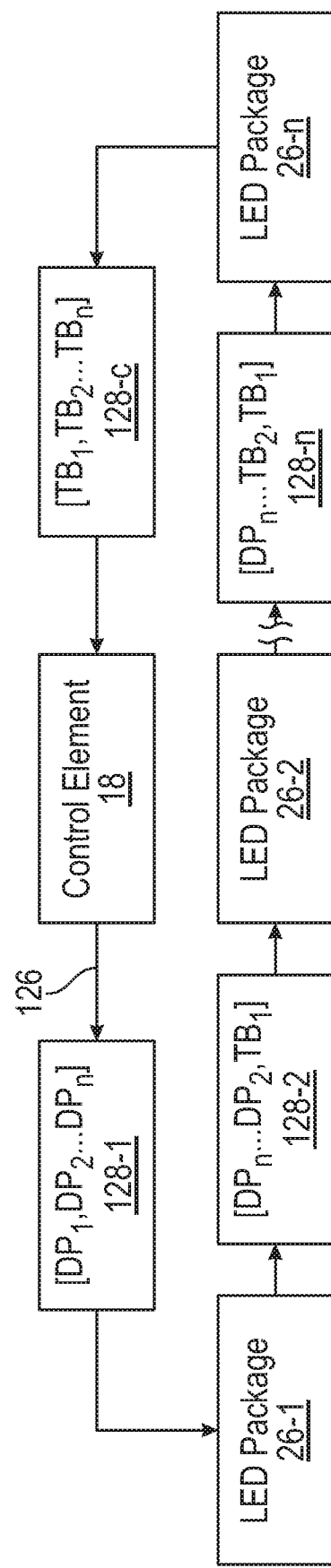
FIG. 28 is a schematic diagram illustrating a cascading flow of data packets from a control element to a plurality of LED packages and a flow of one or more talk-back data packets to the control element according to embodiments disclosed herein.

FIG. 28 is a schematic diagram illustrating a cascading flow of the plurality of data packets $DP_1, DP_2 \ldots DP_n$ from the control element 18 to the plurality of the LED packages 26-1, 26-2 . . . 26-n and a flow of one or more talk-back data packets $TB_1, TB_2 \ldots TB_n$ to the control element 18. The control element 18 and the data stream 126 provide the data sets 128-1, 128-2 . . . 128-n with groupings of the data packets $DP_1, DP_2 \ldots DP_n$ to the LED packages 26-1, 26-2 . . . 26-n as described for FIG. 27. In FIG. 28, the first LED package 26-1 is configured to receive and take an action to remove the first data packet $DP_1$ from the data stream 126 and subsequently replace the first data packet $DP_1$ with a first talk-back data packet $TB_1$ in the data set 128-2 or the data stream 126 exiting the first LED package 26-1. In a similar manner, the remaining LED packages 26-2 . . . 26-n may be configured to receive corresponding data packets $DP_2 \ldots DP_n$ and subsequently replace them with corresponding talk-back data packets $TB_2 \ldots TB_n$. The talk-back data packets $TB_1, TB_2 \ldots TB_n$ may then form a data set 128-c that is configured to communicate information concerning the LED packages 26-1, 26-2 . . . 26-n back to the control element 18 for monitoring. In certain embodiments, the talk-back data packets $TB_1, TB_2 \ldots TB_n$ are configured to communicate one or more states of the LED packages 26-1, 26-2 . . . 26-n, such as one or more of operating temperature, operating current, or other operating states such that the control element 18 may alter or add additional data to subsequent data sets 128-1, 128-2 . . . 128-n based on one or more of the talk-back data packets $TB_1, TB_2 \ldots TB_n$. The talk-back data packets $TB_1, TB_2 \ldots TB_n$ may also be configured to provide data checksum parity, or other data verification to the control element 18. In such embodiments, the command codes of one or more of the data packets $DP_1, DP_2 \ldots DP_n$ may include codes or signals configured to direct or prompt the active electrical element 30 of corresponding LED packages 26-1, 26-2 . . . 26-n to provide the talk-back data packets $TB_1, TB_2 \ldots TB_n$. As such, one or more of the LED packages 26-1, 26-2 . . . 26-n and the corresponding active electrical elements within each of the LED packages 26-1, 26-2 . . . 26-n may be configured to receive input data (e.g., one or more of the data packets $DP_1, DP_2 \ldots DP_n$) and introduce additional data (e.g., one or more of the talk-back data packets $TB_1, TB_2 \ldots TB_n$) to the data stream 126.

Figure 29:
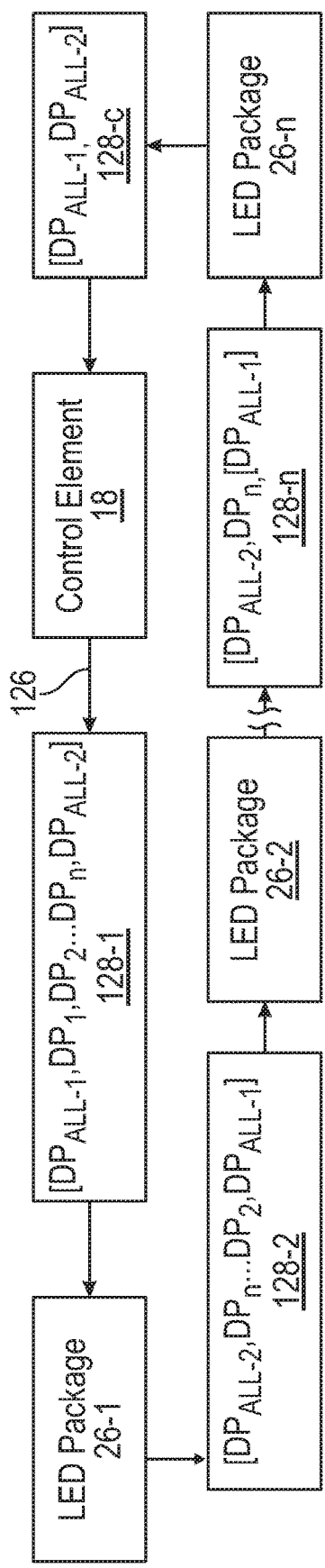
FIG. 29 is a schematic diagram illustrating a cascading flow of data packets from a control element that additionally includes data packets that are configured to provide information to all LED packages according to embodiments disclosed herein.

FIG. 29 is a schematic diagram illustrating a cascading flow of the plurality of data packets $DP_1, DP_2 \ldots DP_n$ from the control element 18 that additionally includes data packets $DP_{ALL-1}$, $DP_{ALL-2}$ that are configured to provide information to all of the LED packages 26-1, 26-2 . . . 26-n that receive the data stream 126. The control element 18 and the data stream 126 provide the data sets 128-1, 128-2 . . . 128-n with groupings of the data packets $DP_1, DP_2 \ldots DP_n$ to the LED packages 26-1, 26-2 . . . 26-n as described for FIG. 27. In certain embodiments, the data sets 128-1, 128-2 . . . 128-n additionally include one or more of the data packets $DP_{ALL-1}$, $DP_{ALL-2}$ that are configured as common or broadcast data packets for all of the LED packages 26-1, 26-2 . . . 26-n. In this regard, the first LED package 26-1 is configured to receive and respond to the data packets $DP_{ALL-1}$, $DP_{ALL-2}$ and additionally pass or retransmit the data packets $DP_{ALL-1}$, $DP_{ALL-2}$ along the data stream 126 so that the remaining LED packages 26-2 . . . 26-n may also receive and respond accordingly. In certain embodiments, one or more of the data packets $DP_{ALL-1}$, $DP_{ALL-2}$ direct all of the LED packages 26-1, 26-2 . . . 26-n to turn on or turn off, or provide a brightness level for all of the LED packages 26-1, 26-2 . . . 26-n in response to user input or ambient light sensing. In other embodiments, one or more of the data packets $DP_{ALL-1}$, $DP_{ALL-2}$ may be configured to direct the LED packages 26-1, 26-2 . . . 26-n to provide the talk-back data packets $TB_1, TB_2 \ldots TB_n$ as described for FIG. 28. In certain embodiments, the same data set 128-1, 128-2 . . . 128-n may include a first data packet $DP_{ALL-1}$ and a second data packet $DP_{ALL-2}$, each of which provides a different common instruction to the LED packages 26-1, 26-2 . . . 26-n, such as $DP_{ALL-1}$ instructing the LED packages 26-1, 26-2 . . . 26-n to turn on and $DP_{ALL-2}$ providing a common brightness setting for the LED packages 26-1, 26-2 . . . 26-n. In FIG. 29, the data packets $DP_{ALL-1}$, $DP_{ALL-2}$ are illustrated at the beginning and the end of the data sets 128-1, 128-2 . . . 128-n; however, in other embodiments, the data packets $DP_{ALL-1}$, $DP_{ALL-2}$ may be arranged in any location within the data sets 128-1, 128-2 . . . 128-n. In certain embodiments, the data packets $DP_{ALL-1}$, $DP_{ALL-2}$ may be retransmitted through the LED package 26-n to form the data set 128-c that is received by the control element 18.

Figure 30:
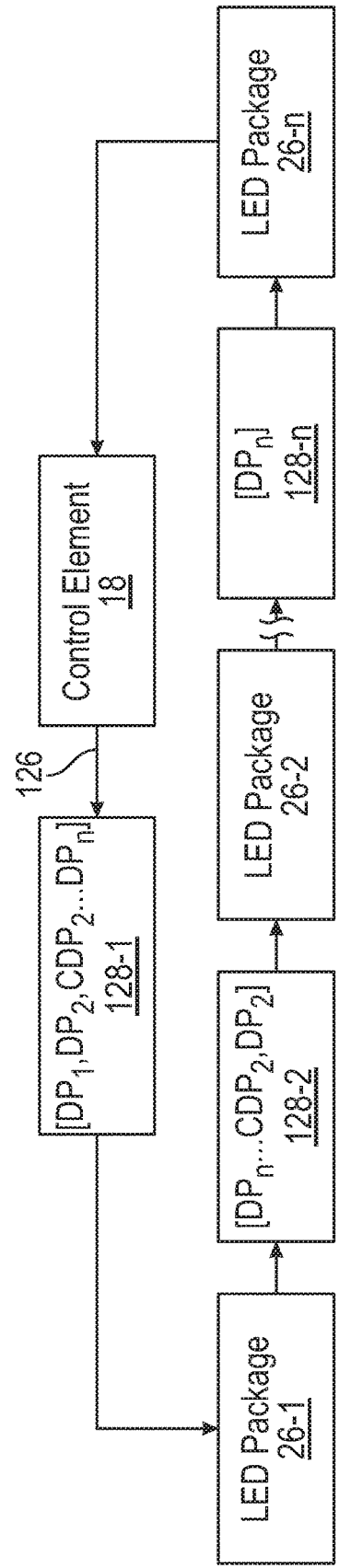
FIG. 30 is a schematic diagram illustrating a cascading flow of data packets from a control element that additionally includes one or more continuation data packets that are configured to provide additional information to at least one LED package according to embodiments disclosed herein.

FIG. 30 is a schematic diagram illustrating a cascading flow of the plurality of data packets $DP_1, DP_2 \ldots DP_n$ from the control element 18 that additionally includes one or more continuation data packets $CDP_2$ that are configured to provide additional information to at least one of the LED packages 26-1, 26-2 . . . 26-n. The control element 18 is configured to provide the data sets 128-1, 128-2 . . . 128-n that include the data packets $DP_1, DP_2 \ldots DP_n$ to the LED packages 26-1, 26-2 . . . 26-n as described for FIG. 27. In certain embodiments, the data sets 128-1, 128-2 . . . 128-n additionally include the continuation data packet $CDP_2$ that is configured to provide additional data or information to at least one of the LED packages 26-1, 26-2 . . . 26-n (e.g., a second LED package 26-2 in FIG. 30). In this regard, the continuation data packet $CDP_2$ is arranged after the data packet $DP_2$ and before the data packet $DP_3$ in the data sets 128-1, 128-2 . . . 128-n of the data stream 126. Additionally, a command code of the continuation data packet $CDP_2$ may be configured such that the first LED package 26-1 passes the continuation data packet $CDP_2$ through and the second LED package 26-2 removes and responds to the continuation data packet $CDP_2$ after removing and responding to the data packet $DP_2$. In certain embodiments, the continuation data packet $CDP_2$ includes color select data and/or brightness level data that may be additional to color select data and/or brightness level data received from the data packet $DP_2$. In certain embodiments, the continuation data packet $CDP_2$ includes at least one of setup data, option select data, and calibration data. For example, in certain embodiments, the active electrical element 30 of one or more of the LED packages 26-1, 26-2 . . . 26-n may be arranged without flash memory and continuation data packets $CDP_2$ as disclosed herein may be configured to provide one or more transfer functions following a reset or an initial start-up condition. The transfer functions may comprise temperature compensation information, gamma functions, and the like.

According to embodiments disclosed herein, a plurality of LED packages may be serially arranged to receive a cascading flow of data packets. The plurality of LED packages may form an array of LED packages that may form at least a portion of an LED display panel, an LED sign panel, or a general lighting panel. In such embodiments, one or more of the LED packages may comprise an active electrical element as previously described that receives and takes actions to one or more of the data packets. In certain embodiments, the array of LED packages may be arranged on a panel in a serpentine arrangement that is configured to provide the cascading flow of data packets while also providing a reduced footprint of electrical routing or traces between the LED packages.

Figure 31:
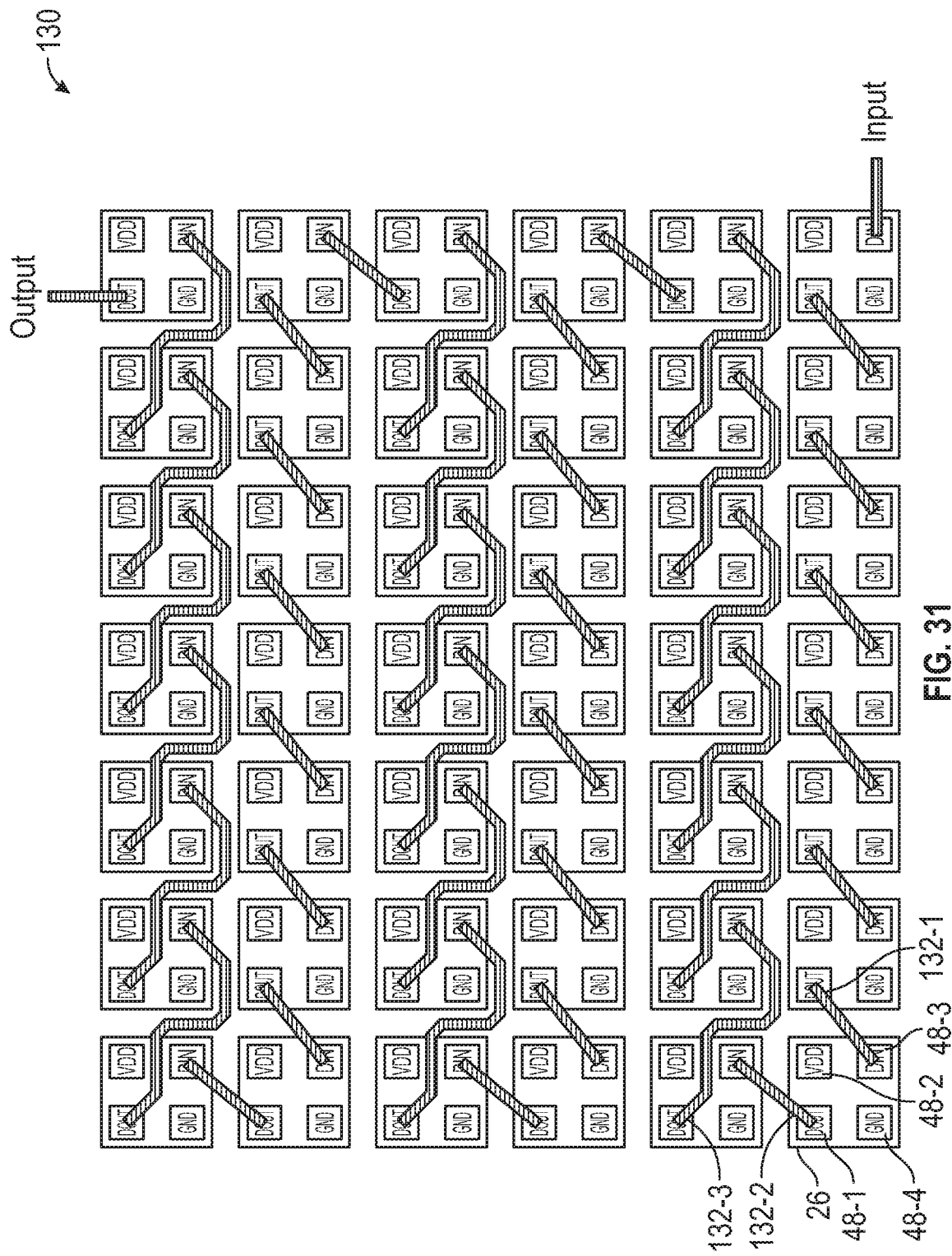
FIG. 31 is a partial plan view illustrating a routing configuration for an LED panel that is configured for operation according to embodiments disclosed herein.

FIG. 31 is a partial plan view illustrating a routing configuration for an LED panel 130 that is configured for operation according to embodiments disclosed herein. In FIG. 31, a plurality of LED packages 26 are arranged in rows and columns to form an LED pixel array. Each LED package 26 may include the plurality of LEDs (e.g., 28-1 to 28-3 of FIG. 2) that form an LED pixel, the active electrical element (e.g., 30 of FIG. 2), and a plurality of package bond pads 48-1 to 48-4 as previously described. In FIG. 31, the package bond pads 48-1, 48-3 of each LED package 26 are configured as communication ports for sending and receiving a cascading flow of data packets of a data stream. In particular, each package bond pad 48-3 is preassigned as an input port (indicated as "DIN" for data-in) for the data stream, and each package bond pad 48-1 is preassigned as an output port (indicated as "DOUT" for data-out) for the data stream. Each package bond pad 48-2 is configured as a voltage port (VDD) and each package bond pad 48-4 is configured as a ground port (GND). In this manner, a data stream may be received at the package bond pad 48-3 of the LED package 26 at the lower right corner of the LED panel 130 (designated as "Input"). At least a portion of the data stream may then exit the LED package 26 via the package bond pad 48-1 to be received by an adjacent LED package 26. A plurality of communication bus lines 132-1 to 132-3 for the data stream are arranged to connect the package bond pad 48-1 of one LED package 26 with the package bond pad 48-3 of the next LED package 26. In certain embodiments, the communication bus lines 132-1 to 132-3 are arranged to serially connect the LED packages 26 in a serpentine manner. In FIG. 31, the communication bus lines 132-1 to 132-3 serially connect the LED packages 26 from right to left across the bottom row of the LED panel 130 and from left to right across the next row up from the bottom row. This sequence repeats for each additional row of the LED panel 130 to form the serpentine arrangement. Depending on the alternating direction of the serial connections from row to row, different ones of the communication bus lines 132-1 to 132-3 may comprise different lengths to make connections between the package bond pads 48-1 and 48-3 of serially connected LED packages 26. For example, the communication bus lines 132-1 may comprise a shorter length and alternate from row to row with the communication bus lines 132-3 that have greater lengths. As illustrated, the communication bus lines 132-2 are arranged to connect one row to another and may comprise a same or similar length as the communication bus line 132-1. In this manner, all of the communication bus lines 132-1 to 132-3 may be arranged on a same layer or plane of the LED panel 130 while providing serial connections for a data stream to the LED packages 26. While not shown, at least some power connections for the LED packages 26 may be arranged on different layers or planes than the communication bus lines 132-1 to 132-3.

Figure 32:
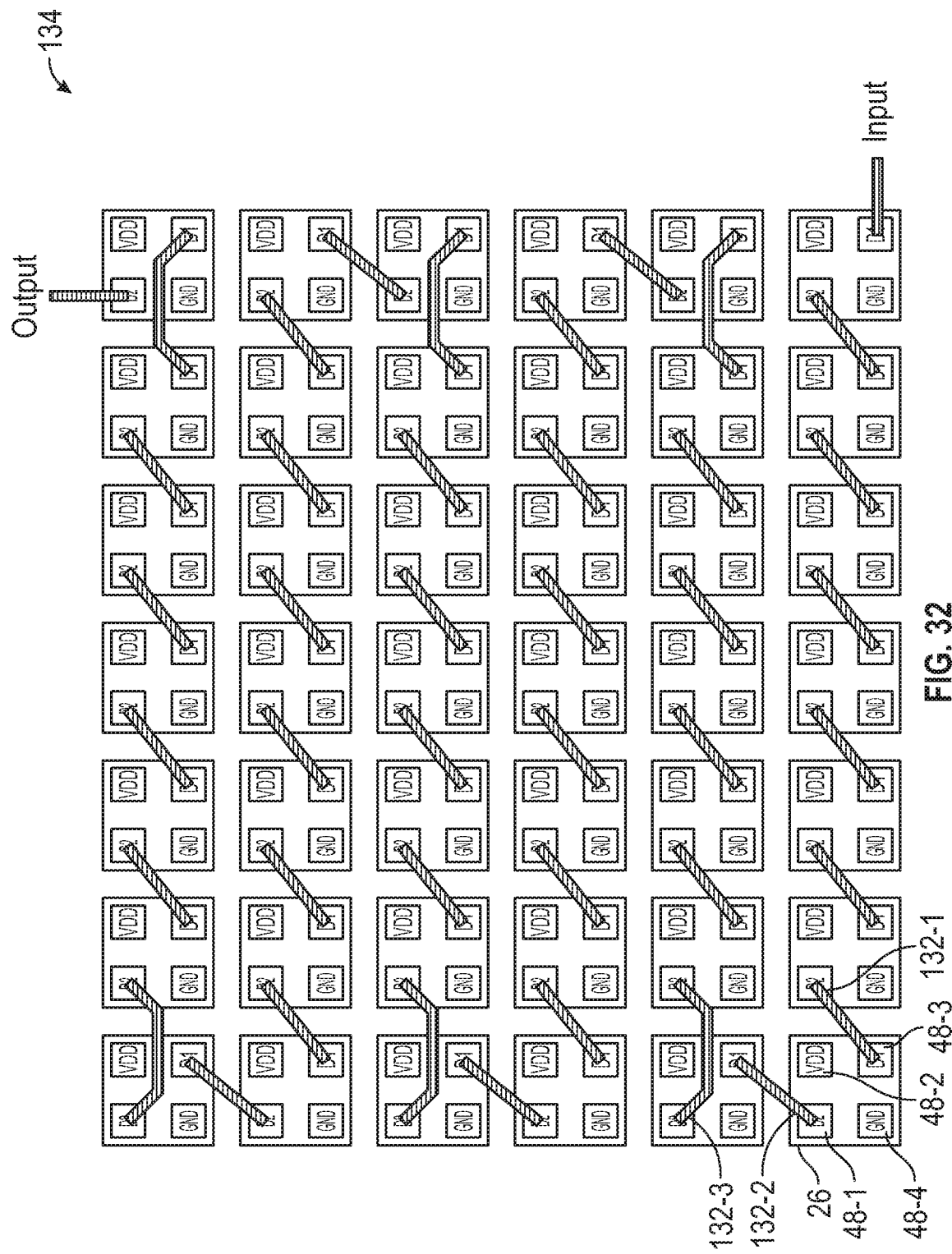
FIG. 32 is a partial plan view illustrating a routing configuration for an LED panel that includes LED packages with selectively assignable communication ports according to embodiments disclosed herein.

FIG. 32 is a partial plan view illustrating a routing configuration for an LED panel 134 that includes a plurality of LED packages 26 with selectively assignable or bidirectional communication ports according to embodiments disclosed herein. In FIG. 32, the plurality of LED packages 26 are arranged and connected in a serpentine manner with rows and columns to form an LED pixel array. Each LED package 26 may include the plurality of LEDs (e.g., 28-1 to 28-3 of FIG. 2) that form an LED pixel, the active electrical element (e.g., 30 of FIG. 2), and the plurality of package bond pads 48-1 to 48-4 as previously described. In FIG. 32, the package bond pads 48-2 (VDD) and the package bond pads 48-4 (GND) are configured in a similar manner to FIG. 32 while the package bond pads 48-1 (D2), 48-3 (D1) of each LED package 26 are configured as communication ports for sending and receiving a cascading flow of data packets of a data stream. As illustrated, each of the package bond pads 48-1 is arranged in an upper left corner of each LED package 26 and each of the package bond pads 48-3 is arranged in a lower right corner of each LED package 26 in a similar manner to FIG. 31. In FIG. 32, the package bond pads 48-1, 48-3 are configured as selectively assignable communications ports based on how the communication bus lines 132-1 to 132-3 are arranged to input and output the data stream through each of the LED packages 26. In this regard, the communication bus lines 132-1 to 132-3 may be arranged to input or output the data stream from either of the package bond pads 48-1, 48-3 of each LED package 26. At start-up or after a reset of the LED panel 134, when a certain LED package 26 initially receives the data stream, the active electrical element of the LED package 26 is thereby configured to identify a first one of first and second communication ports (e.g., one of the package bond pads 48-1, 48-3) that receives an input signal from the data stream, selectively assign the first one of the first and second communication ports as an input port, and selectively assign a second one of the first and second communication ports (e.g., the other of the package bond pads 48-1, 48-3) as the output port. In this manner, the package bond pads 48-1, 48-3 may be configured as bidirectional communication ports within each LED package 26. As such, certain LED packages 26 may have package bond pads 48-1 assigned as input ports, while other LED packages 26 in the same LED panel 134 may have package bond pads 48-1 assigned as output ports. In certain embodiments, the active electrical element of each LED package 26 may comprise circuitry configured to selectively assign the input and output communication portions. For example, the active electrical element may comprise circuitry that includes a tri-state buffer such that the active electrical element may assign an input port and an output port in a register when an input communication signal is received. By providing such selectively assignable communication ports, the routing of the communication bus lines 132-1 to 132-3 between the LED packages 26 may be simplified with reduced lengths, thereby providing lower costs and enabling higher resolution for the LED panel 134.

Figure 33:
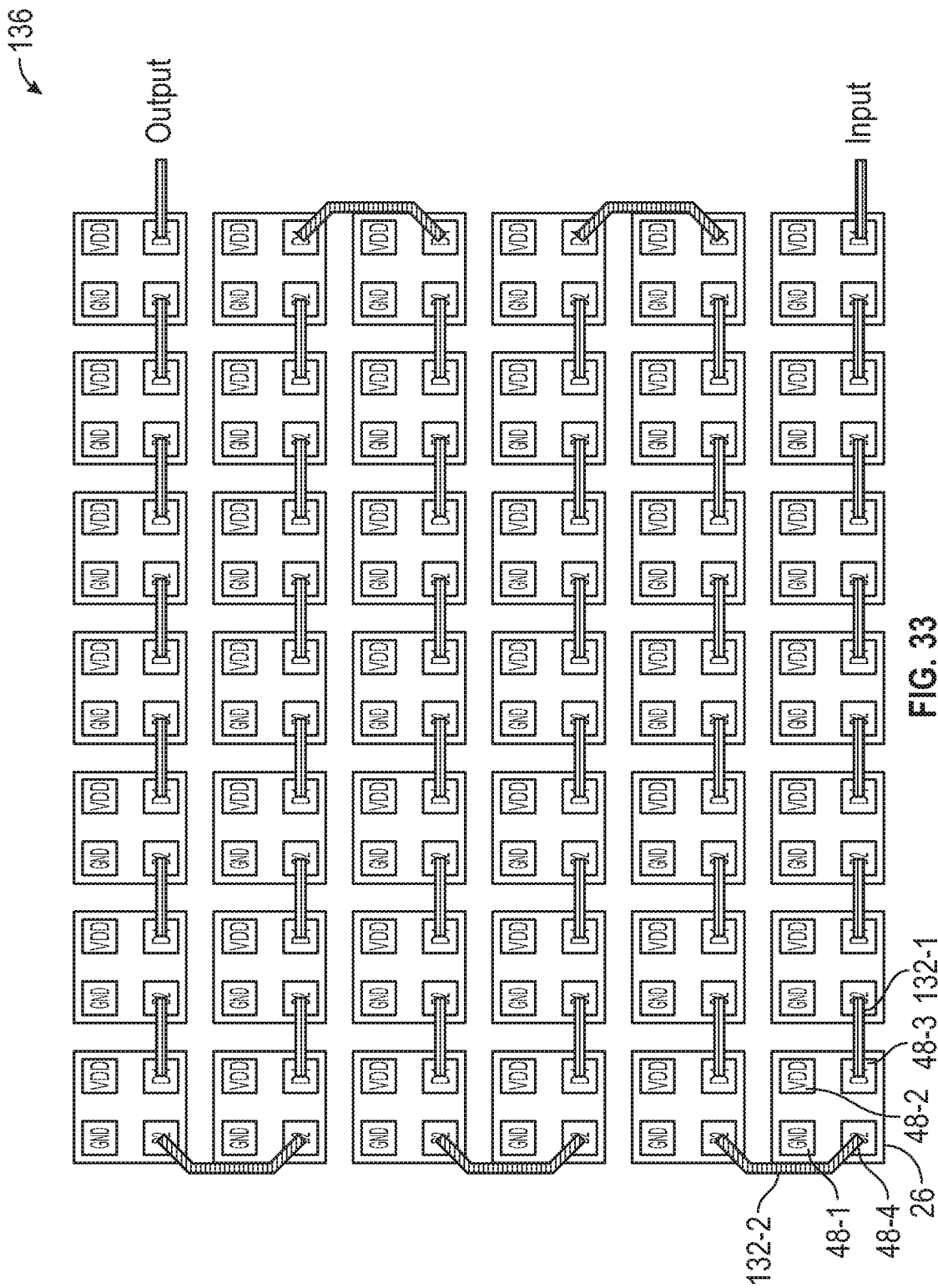
FIG. 33 is a partial plan view illustrating another routing configuration for an LED panel that includes LED packages with selectively assignable communication ports according to embodiments disclosed herein.

FIG. 33 is a partial plan view illustrating another routing configuration for an LED panel 136 that includes the plurality of LED packages 26 with selectively assignable communication ports according to embodiments disclosed herein. In FIG. 33, the plurality of LED packages 26 are arranged and connected in a serpentine manner with rows and columns to form an LED pixel array. Each LED package 26 may include the plurality of LEDs (e.g., 28-1 to 28-3 of FIG. 2) that form an LED pixel, the active electrical element (e.g., 30 of FIG. 2), and the plurality of package bond pads 48-1 to 48-4 as previously described. In FIG. 33, some of the package bond pads 48-1 to 48-4 are provided with a different arrangement than the illustration of FIG. 32. In particular, the package bond pad 48-1 is configured as a ground port (GND) in FIG. 33, the package bond pad 48-2 remains a voltage port (VDD), and the package bond pads 48-3 (D1), 48-4 (D2) are configured as selectively assignable communication ports. In this manner, the selectively assignable communication ports are arranged closer to one another within a same LED package 26 and closer to the selectively assignable communication ports of an adjacent LED package 26. As such, the communication bus lines 132-1, 132-2 may be further simplified with reduced lengths between the LED packages 26. In particular, the communication bus lines 132-1 may form straight lines between adjacent LED packages 26 along each row of the LED panel 136. The longer communication bus lines 132-2 connect one row to another and are arranged about a periphery of the LED panel 136.

Figure 34:
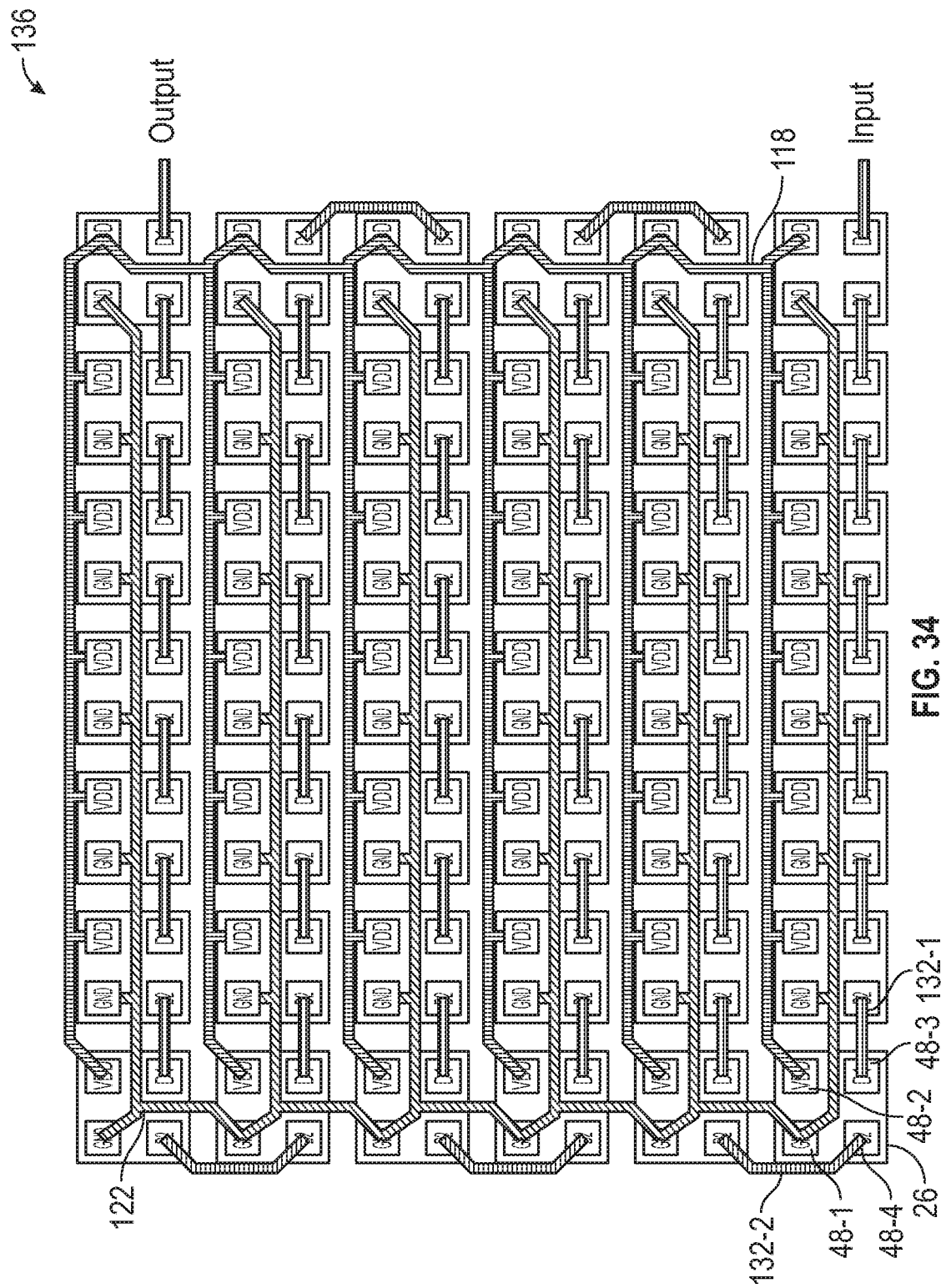
FIG. 34 is a partial plan view illustrating the routing configuration for the LED panel of FIG. 33 with the addition of voltage lines and ground lines according to embodiments disclosed herein.

FIG. 34 is a partial plan view illustrating the routing configuration for the LED panel 136 of FIG. 33 with the addition of voltage lines 118 and ground lines 122 according to embodiments disclosed herein. By having the plurality of LED packages 26 with one or more selectively assignable communication ports (e.g., one or more of the package bond pads 48-1 to 48-4), the simplified routing arrangement of the communication lines 132-1, 132-2 allows a simplified routing arrangement for the voltage lines 118 and the ground lines 122 for the LED panel 136. In particular, such a routing configuration allows the communication lines 132-1, 132-2, the voltage lines 118, and the ground lines 122 to all be arranged on the same layer or plane of the LED panel 136. In certain applications, it may be beneficial to arrange one or more of the voltage lines 118 or the ground lines 122 on different planes than the communication bus lines 132-1, 132-2 to improve power distribution, reduce voltage sagging from trace resistance, and reduce noise from crosstalk and other sources. In certain embodiments, the communication bus lines 132-1, 132-2 and the voltage lines 118 may be arranged on a first layer or plane of the LED panel 136 and the ground lines 122 may be arranged on a second layer or plane of the LED panel 136 with electrical vias connecting the ground lines 122 to the package bond pads 48-1 of each LED package 26. Subset distribution on the second layer or plane of the LED panel 136 may be provided to reduce the number of electrical vias.

In each of the FIGS. 31-34, the LED packages 26 are illustrated with four package bond pads 48-1 to 48-4. It is understood that in certain embodiments, the LED packages 26 illustrated in any of the FIGS. 31-34 may comprise additional numbers of package bond pads. In certain embodiments, the LED packages 26 may have at least two additional package bond pads configured to provide a clock signal in and a clock signal out to provide synchronization or other timing sequences for the LED packages 26. In certain embodiments, serially connected LED packages 26 may be configured with self-clocking configurations or configurations for receiving self-clocking signals, and, accordingly, the clock input may not be required. In certain embodiments, additional package bond pads may be configured to receive additional voltage inputs for power savings. For example, one or more red LED chips within an LED package 26 may run at lower voltages with a different voltage input than one or more blue or green LED chips within the same LED package 26. Additionally, one or more logic circuitry arrangements in the active electrical element 30 may run at lower voltages with a different voltage input.

As disclosed herein, serially connected LED packages 26 may be configured with temperature or other compensation, calibration, correction, or transfer function capabilities. Such capabilities or techniques may include the use of one or more look up tables, calculations based on transfer coefficients, and combinations of look up tables with transfer coefficient calculations that provide piece-wise continuous transfer functions. In certain embodiments, one or more of the data packets DP, the continuation data packets CDP, or the common or broadcast data packets $DP_{ALL}$ may comprise a command code that is configured to prompt an active electrical element in one or more of the LED packages 26 to allow communication from such look up tables and/or transfer coefficient calculations to a single LED package 26, a subgrouping of LED packages 26, or to all of the LED packages 26 in the data stream 126.

As disclosed herein, LED packages are disclosed that include an active electrical element configured to receive data from a data stream and take one or more actions at least partially in response to the data received. In certain embodiments, the active electrical element may take one or more actions based on a command identified by the data received from the data stream in combination with one or more of a current state of the LED package or a previous command received by the active electrical element.

Figure 35:
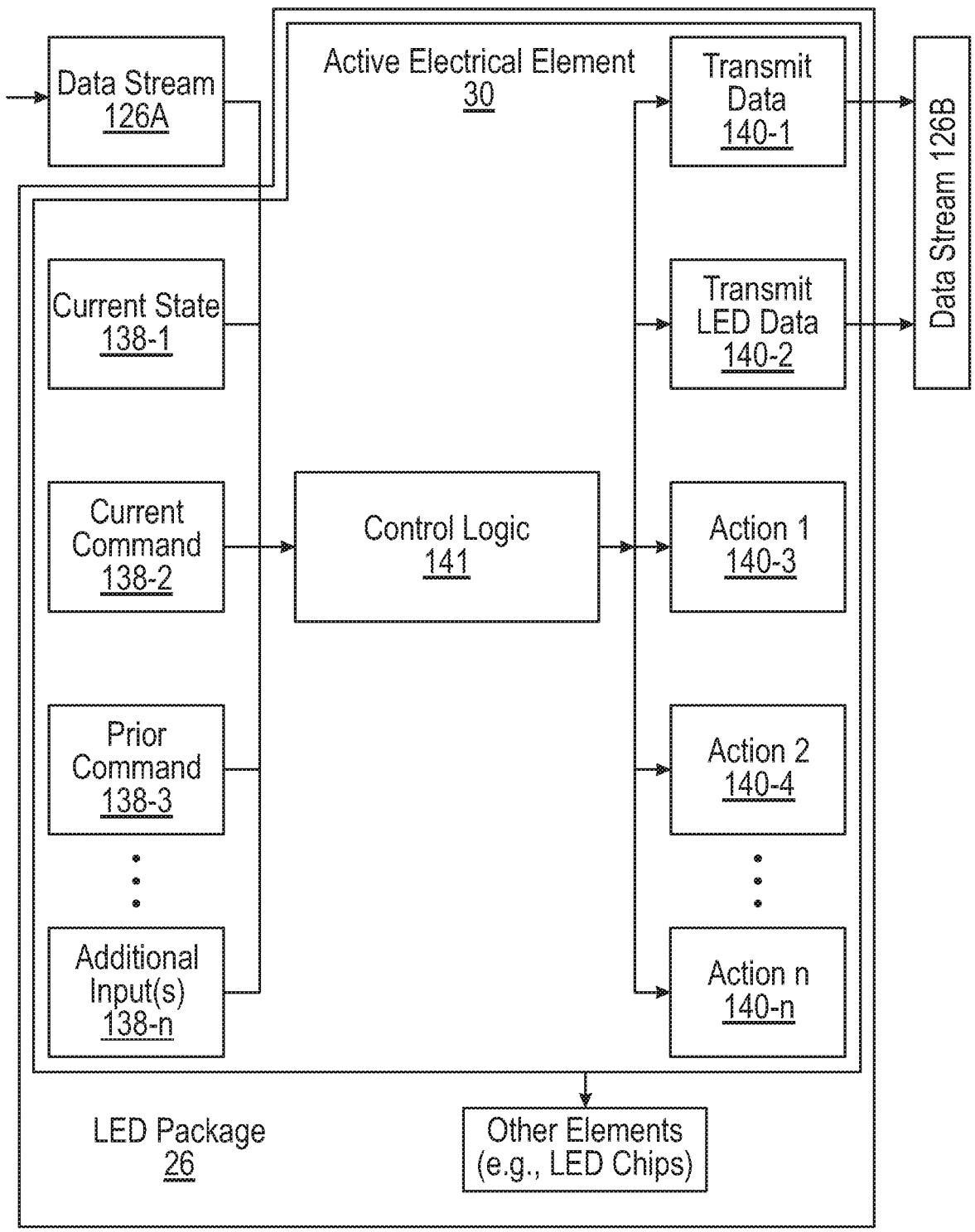
FIG. 35 is a schematic diagram illustrating various inputs and corresponding actions for active electrical elements according to embodiments disclosed herein.

FIG. 35 is a schematic diagram illustrating various inputs and corresponding actions for active electrical elements according to embodiments disclosed herein. As illustrated, the active electrical element 30 is configured to receive an input data stream 126A and act according to the data stream 126A and various inputs and internal states 138-1 to 138-$n$ that are used to identify one or more corresponding actions 140-1 to 140-$n$ to take. In particular, the one or more inputs and internal states 138-1 to 138-$n$ are received by control logic 141 of the active electrical element 30. The one or more inputs or internal states 138-1 to 138-$n$ include a current state 138-1 of the active electrical element 30 (and corresponding LED package 26), a current command 138-2 that corresponds to a command code received from a current portion of the input data stream 126A, a prior command 138-3 that corresponds to a previous command code received from a previous portion of the input data stream 126A, and one or more additional inputs ( . . . 138-$n$). The current state 138-1 may include a reset or startup condition for the active electrical element 30, such as resetting registers to an initial state. If the LED package 26 is arranged with bidirectional communication ports, the initial state may include resetting the bidirectional communication ports to look for input signals. The current state 138-1 may also include waiting for data input from one or more communication ports. After receiving data from the input data stream 126A, the current state 138-1 may include maintaining an operating condition of the LED package 26, or implementation of a common or broadcast command and any corresponding continuation data commands. Upon receiving the current command 138-2, the control logic 141 of the active electrical element 30 may then identify the one or more actions 140-1 to 140-$n$ to take based on one or more combinations of control logic 141 inputs and internal states 138-1 to 138-$n$, and may include changing the current state 138-1. The one or more actions 140-1 to 140-$n$ may include transmitting or retransmitting data 140-1 from the input data stream 126A to an output data stream 126B, transmitting LED data 140-2 such as a talk-back packet to the output data stream 126B, or any number of other actions 140-3, 140-4 . . . 140-$n$, including energizing LED chips or other elements of the LED package 26, turning on or off an output of the LED package 26, sending data to calibration registers according to the input data stream 126A received, identifying and assigning bidirectional communication ports of the LED package 26 as different ones of an input and an output port, changing data rates according to the input or output data stream 126A/126B, implementing a specific set of options for the LED package 26, or changing a driving condition of the LED package 26. In this regard, the active electrical element 30 may comprise a finite state machine that is configured to identify and take actions based on current or previous input commands and one or more finite or current states of the LED package 26.

Figure 36:
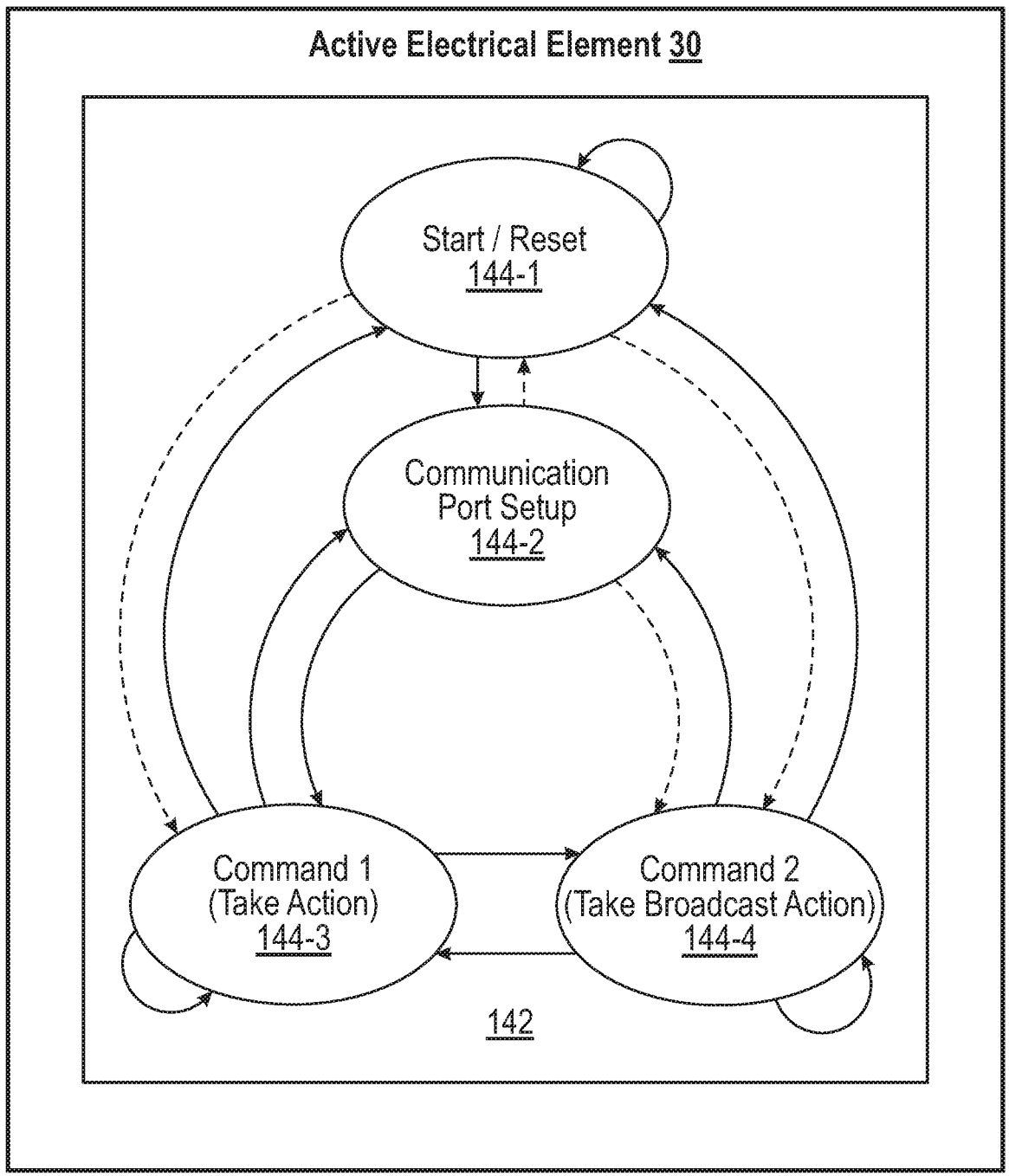
FIG. 36 is a schematic diagram illustrating an active electrical element comprising a finite state machine according to embodiments disclosed herein.

FIG. 36 is a schematic diagram illustrating the active electrical element 30 comprising a finite state machine 142 according to embodiments disclosed herein. The active electrical element 30 may be configured according to any number of states 144-1 to 144-4 that correspond to the current state 138-1 of FIG. 35. A startup or reset state 144-1 may comprise an initial state for resetting registers and communication ports to the initial state. After the startup or reset state 144-1, the active electrical element 30 may advance to a communication port setup state 144-2 where the active electrical element 30 waits for data input from a data stream. Upon receiving data input, the active electrical element 30 may assign an input port and an output port for the corresponding LED package. Depending on the command codes received from various input signals, the active electrical element 30 may advance to one of command states 144-3, 144-4. The command state 144-3 corresponds to implementing and/or maintaining an operating condition of the individual LED package of the active electrical element 30 according to a command code received. The command state 144-4 corresponds to implementing and/or maintaining a common or broadcast operating condition for all LED packages in a data stream. In normal operation, the active electrical element 30 may advance from the startup or reset state 144-1 to the communication port setup state 144-2, before advancing and cycling between the command states 144-3, 144-4 according to various command codes received along with other conditions such as a time out condition. As illustrated, all of the various states 144-1 to 144-4 may loop back to themselves until a condition or command is provided to change the active electrical element 30 to another of the various states 144-1 to 144-4. In certain embodiments, a command or a condition may change one of the various states 144-1 to 144-4 to a different one of the various states 144-1 to 144-4, as indicated by the dashed lines between different ones of the various states 144-1 to 144-4. While only four states 144-1 to 144-4 are illustrated, the active electrical element 30 and the finite state machine 142 may have additional states according to embodiments disclosed herein. As such, FIG. 36 is provided as a high-level conceptual view of the basic operation of the active electrical element 30. It is understood that the same operation could be represented many different ways such as combining the command states into one and demoting the first command condition to a subordinate state. In certain embodiments, all states 144-1 to 144-4 may be configured with one or more timeout conditions that change a particular state 144-1 to 144-4 to a previous one of the states 144-1 to 144-4 that may ultimately force a reset condition. In this regard, the active electrical element 30 may avoid being stuck in an unresponsive state 144-1 to 144-4.

In certain embodiments disclosed herein, LED packages include active electrical elements that are configured to detect adverse operating conditions or corresponding error signals from one or more LEDs within the LED package. In certain embodiments, an active electrical element may be configured to provide and switch between both forward and reverse bias states to the one or more LEDs. A forward bias state is provided to activate or turn on the one or more LEDs, and a reverse bias state may be separately provided to the one or more of the LEDs for other capabilities, including current leakage measurements and reverse bias voltage measurements. In certain embodiments, active electrical elements may be configured to provide forward voltage monitoring and corresponding adjustments to drive signals for the one or more LEDs. LED panels are disclosed that comprise multiple LED packages configured to provide both forward and reverse bias states. The LED panels may be configured such that one or more of the LED packages are capable of running self-check routines at start-up or at other intervals or times. Such self-check routines may include comparing reverse leakage measurements with reverse leakage requirements and forward voltage measurements with forward voltage requirements for any of the LEDs within each LED package. Such self-check routines may also include a temperature assessment for any of the LEDs. In certain embodiments, the reverse leakage measurements and forward voltage measurements may be added to or may replace data that is transmitted back to a control element (e.g., 18 of FIG. 28). In response to unsuitable reverse leakage values, the active electrical element of a particular LED package may shut down a particular LED within the LED package, shut down an LED pixel within the LED package, or shut down the entire LED package during normal operation of the LED panel in order to not draw current away from other LEDs, LED pixels, or LED packages. In response to deviations in forward voltage measurements, the active electrical element of a particular LED package may responsively adjust a drive signal, such as a PWM signal, for one or more of the LEDs within the package. In certain embodiments, an exemplary self-check routine may comprise cycling through each LED to perform an initial brightness measurement, performing internal reverse leakage and/or forward voltage measurements, and providing one or more diagnostic signals via an LED color or pulse sequence for an external machine to detect and decode. In certain embodiments, the self-check routine may provide an output signal indicating at least one of a passing or a failing condition for LEDs within the package. The output signal may be communicated as a digital signal to an electrical port. In other embodiments, the output signal may be communicated as an optical signal through one or more of the LEDs within the package. In certain embodiments, the self-check routine may repeat the steps where the LEDs are electrically activated in a slower manner in order to provide a visible signal to a human observer. In this manner, the optical signal may comprise a code that can be interpreted from blinking of the one or more LEDs with predetermined colors, duration, and/or counts. In certain embodiments, the optical signal may first be communicated at high speed that is undetectable or difficult to detect by a human observer, followed by communication at lower speeds to provide human-readable code for human detection. The LED packages may be configured to perform such self-check routines automatically at power start up or the LED packages may be configured to perform such self-check routines when directly connected to a separate power source for testing. Additionally, a time delay may be provided between higher speed communication at power-on and the lower speed communication code that is significant enough so that a controller has time to send a command to stop the self-check routine before the lower speed communication is displayed or transmitted. As such, a display screen may only blink according to the higher speed communication when power is first applied and a master controller can send an all-off command almost instantly after power up. In this manner, initial blinking at higher speeds during power up will be difficult to detect by a human observer.

FIGS. 37-42 are provided as general schematic and block diagram illustrations to represent concepts related to active electrical elements described herein. While FIGS. 37-42 are illustrated as general schematic and block diagrams, various configurations and additional support elements and circuitry may be present in various embodiments. In FIGS. 37-42, any line connecting different elements may comprise a single line or multiple lines depending on the application and type of signal (e.g. analog or digital) transmitted. Again, these diagrams are intended to convey concepts in a general manner. Addition of other resistive, capacitive, and active elements may be required to achieve the desired function and performance. Other arrangements such as source and/or sink drivers are also considered. Additionally, other arrangements such as using one ADC with a multiplexer switch instead of separate ADC inputs for each node is understood to be within the scope of this disclosure. Also as before, separate voltage inputs can be used for LEDs of different voltage requirements (e.g., a separate voltage input for red LEDs than a voltage input for green or blue LEDs).

Figure 37:
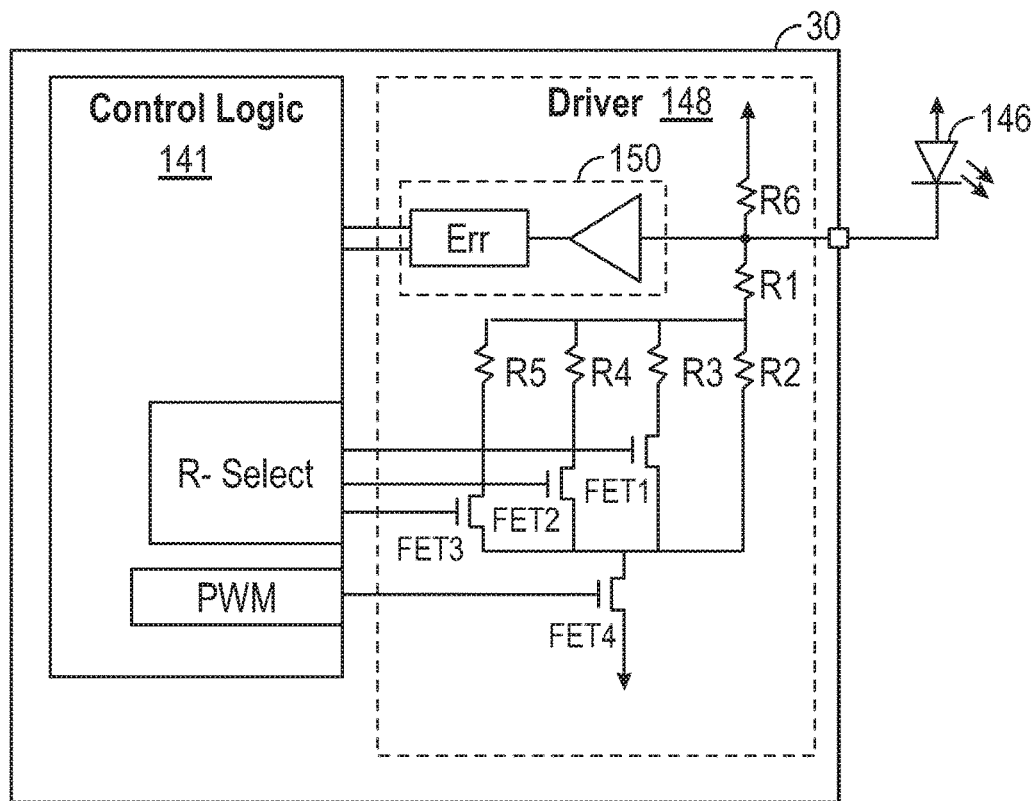
FIG. 37 is a schematic diagram illustrating embodiments where an active electrical element is configured to detect normal or adverse operating conditions of at least one LED according to embodiments disclosed herein.

FIG. 37 is a schematic diagram illustrating embodiments where an active electrical element 30 is configured to detect normal or adverse operating conditions of at least one LED 146 according to embodiments disclosed herein. As illustrated, a driver 148 of the active electrical element 30 is substantially an analog interface of the active electrical element 30 and includes a pullup resistor R6 that is set with a high resistor value (e.g., 10,000-100,000 ohms), a threshold detector 150, and a resistor network R1-R5 of different resistor values with selection switches FET1-FET3 that are respectively coupled with the resisters R3-R5. The threshold detector 150 may include a comparator/operational amplifier configuration for communicating error (ERR) signals to the control logic 141. Such error signals may include an electrical short or open state for the LED1, among others. The control logic 141 is a digital interface of the active electrical element 30 and includes resistor select (R-Select) and PWM circuitry that are coupled with the driver 148. A cathode of the LED 146 is coupled with the pullup resistor R6, the threshold detector 150, and the resistor network R1-R5. In normal operation, the selection switches FET1-FET3 allow selection of the resistors R3-R5 to provide predetermined current limits and a selection switch FET4 is coupled with the PWM circuitry of the control logic 141 to provide brightness control for the LED 146. When the LED 146 is in an electrical short state, an error is detected as a high voltage, such as above 2 V or above 3 V, and a corresponding error signal is communicated to the control logic 141. When the LED 146 is in an electrical open state, an error is detected as a low voltage, such as below 0.5 V depending on the specific resistor selection. While only the LED 146 is illustrated, the concepts described herein are also applicable to multiple LED arrangements, where separate or multiplexed threshold detectors 150 are configured with each LED. As with previously described embodiments, the active electrical element 30 as configured in FIG. 37 may be incorporated into the same LED package as one or more LEDs (e.g. LED 146). Additionally, the active electrical element 30 may be configured to communicate with and respond to commands from another control element (e.g., the control element 18 of FIG. 1B).

Figure 38:
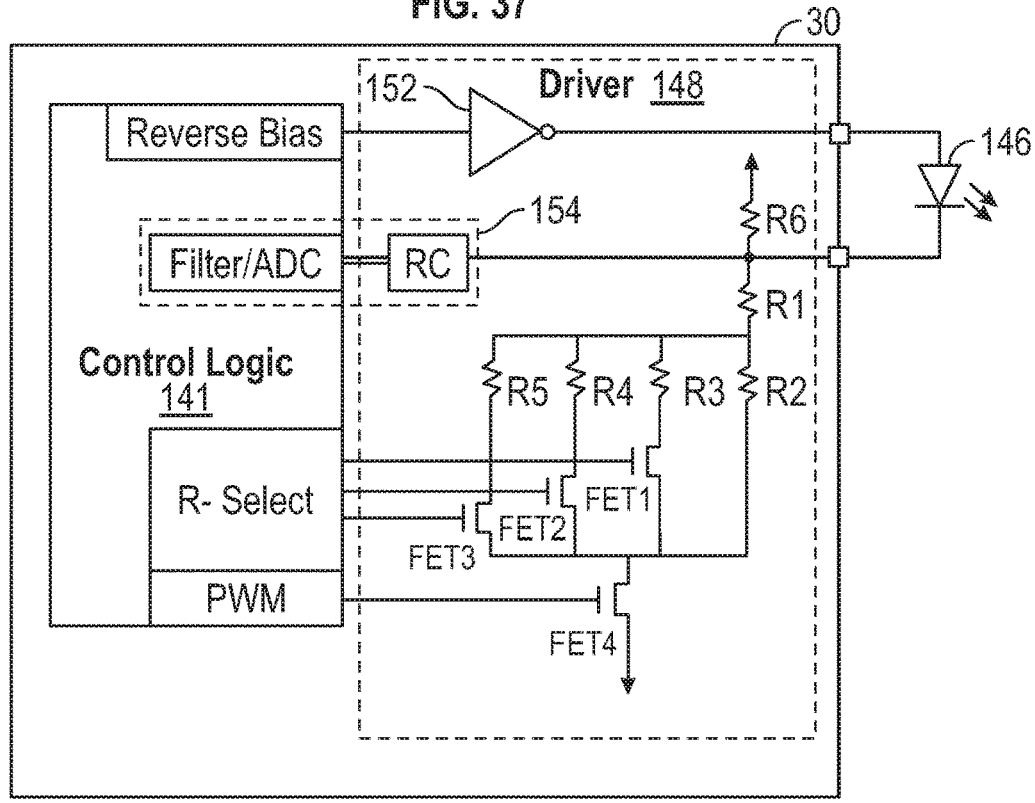
FIG. 38 is a schematic diagram illustrating embodiments where an active electrical element is configured to provide both forward and reverse bias states to at least one LED according to embodiments disclosed herein.

FIG. 38 is a schematic diagram illustrating embodiments where the active electrical element 30 is configured to provide both forward and reverse bias states to at least one LED 146 according to embodiments disclosed herein. In certain embodiments, the control logic 141 includes a reverse bias control output signal that, with appropriate active elements, is configured to supply either near-Vss or near-Vdd voltage levels to the LED 146 in accordance with the output signal. Since the nomenclature "reverse bias" implies that a high level on the control logic 141 output produces a reverse bias condition, the output signal could simply be coupled with an inverter 152 that is provided in the driver 148. As such, the LED 146 may be either forward biased or reverse biased depending on a particular operating state. The inverter 152, or inverter logic element, may have sufficient output characteristics to drive the LED 146. As with other aspects, the addition of other elements may be required to meet all requirements. In FIG. 38, an ADC 154 is configured to detect a voltage at the LED 146 relating to an operating condition of the LED 146. As such, the ADC 154 is arranged to replace the threshold detector 150 of FIG. 37. In certain embodiments, the ADC 154 comprises at least one of a resistor-capacitor (RC) circuit or analog filter that is arranged in the driver 148 and digital filter circuitry that is arranged in the control logic 141. The ADC 154 may further comprise a comparator, a sampling element with digital feedback, and additional filtering in the digital domain. Other arrangements/methods for analog to digital conversion are contemplated. In order to measure an operating condition such as reverse leakage of the LED 146, the control logic 141 may apply a reverse bias to the LED 146 such that an anode of the LED 146 becomes near 0 V. In a reverse biased state with the PWM circuitry turned off, the cathode of the LED 146 coupled to the pullup resistor R6 would be near $V_{dd}$ if the LED 146 demonstrates suitably low reverse leakage. If the LED 146 is leaky under the reverse biased state, then the cathode of the LED 146 would have a lower voltage. This can be sensed with the ADC 154 or limit sensor and used by the control logic 141 to take appropriate action such as shut down the LED 146 and notify the master control element 18 through the communication protocol. In this regard, the ADC 154 may form a level sensor that is configured to provide an error signal while the LED 146 is in a reverse bias state. As such, the ADC 154 is configured to detect a voltage relating to an operating condition of the LED 146 while the LED 146 is in a reverse bias state.

In other embodiments, the control logic 141 may shut down one or more LEDs within an LED package or the control logic 141 may shut down an entire LED package in response to detected reverse leakage. In still other embodiments, the control logic 141 may adjust control signals to the LED 146 in response to detected reverse leakage. As illustrated, the driver 148 may include the resistor network R1-R5 and the selection switches FET1-FET4 and the control logic 141 may include the R-Select circuitry and the PWM circuitry as described for FIG. 37. As mentioned above, during a reverse biased state for the LED 146, the PWM circuitry would be switched off. In certain embodiments, such configurations of the active electrical element 30 may allow for adjustment and improved control of operating conditions of the LED 146 beyond detecting voltages levels and responding only to pass and fail states. The resistor network R1-R5 serves as a current limiting circuit for the LED 146 and in this manner, without active feedback, doesn't precisely control the current of the LED 146 in response to small LED voltage changes. These changes are generally observed over the life of the LED 146. The forward voltage level feedback of the LED 146 from the ADC 154 may be used as part of a calculation to determine and/or adjust a PWM duty cycle for the LED 146. For example, if the ADC 154 detects a decrease in forward voltage levels for the LED 146, the control logic 141 may responsively increase the PWM duty cycle for the LED 146 to compensate for the brightness difference that would otherwise be observed. This pseudo-current control may be preferred over other methods of current control because of it requires fewer resources (e.g., additional chip space and power) to implement. Along with the forward voltage level feedback of the LED 146, transfer curves, temperature compensation data, and input brightness level data may also be part of the calculation for determining and adjusting the PWM duty cycle. Additionally, since the ADC 154 can provide voltage level monitoring of the LED 146 to the control logic 141, electrical short or electrical open states for the LED 146 may also be detected. In this manner, the ADC 154 is configured to detect a voltage relating to an operating condition, such as forward voltage levels, of the LED 146 while the LED 146 is in a forward bias state. According to embodiments disclosed herein, the ADC 154 may be configured to transmit measured data (e.g., reverse leakage and forward voltage measurements) to the active electrical element 30 for serial output to a master control element (e.g., the control element 18 of FIG. 1B). While only the LED 146 is illustrated in FIG. 38, the concepts described herein are also applicable to multiple LED arrangements, where separate ADCs 154 are configured with each LED or a network of switches (e.g., a multiplexer) allows one ADC 154 to take voltage measurements from several LEDs. As with previously described embodiments, the active electrical element 30 as configured in FIG. 38 may be incorporated into the same LED package as one or more LEDs (e.g., LED 146).

Figure 39:
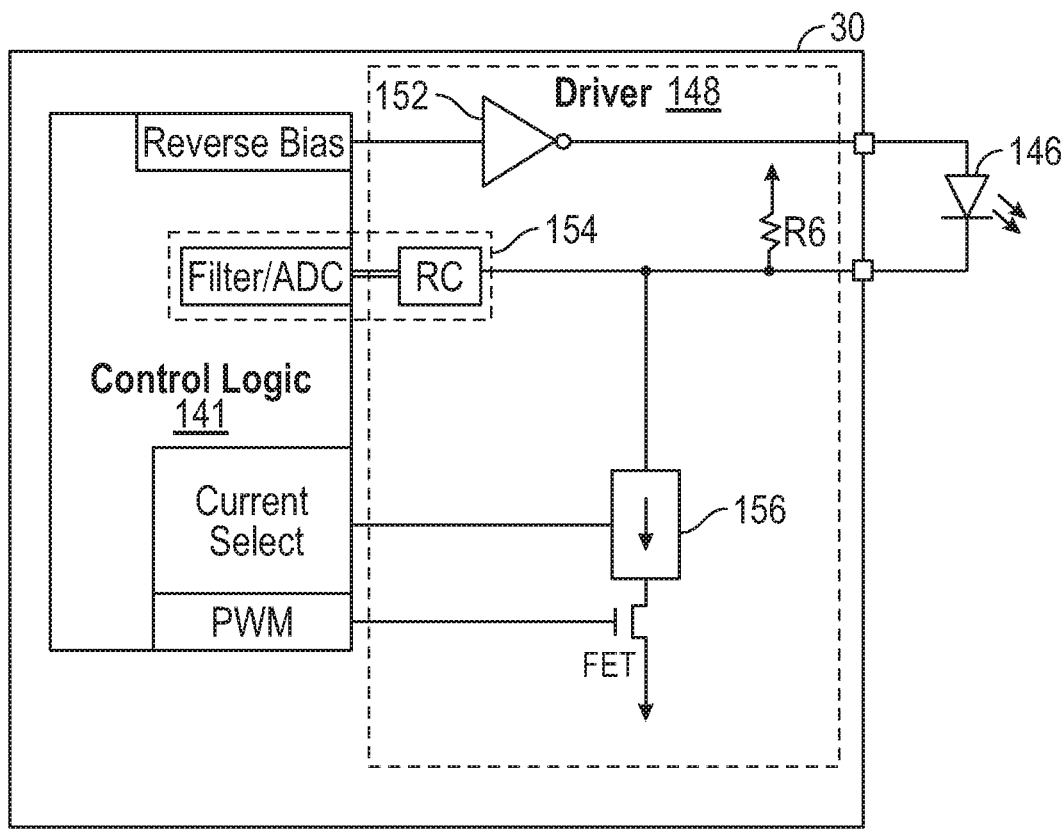
FIG. 39 is a schematic diagram illustrating embodiments where the resistor network and corresponding selection switches of FIG. 38 are replaced with a current source according to embodiments disclosed herein.

FIG. 39 is a schematic diagram illustrating embodiments where the resistor network R1-R5 and the corresponding selection switches FET1-FET3 of FIG. 38 are replaced with a current source 156 in the active electrical element 30 according to embodiments disclosed herein. In FIG. 39, the pullup resistor R6 and the inverter 152 are coupled with the LED 146 as described for FIG. 38. The current source 156 is configured to provide current to the LED 146 that is selectable (e.g., a few levels) or adjustable (e.g., many levels). Since the schematic representation for the current source 156 is more general than the resistor network R1-R5 and the corresponding selection switches FET1-FET3 of FIG. 38, subsequent diagrams will use the current source 156 to represent any method for controlling LED current, including the resistor network R1-R5 and the corresponding selection switches FET1-FET3 of FIG. 38. The control logic 141 includes current-select circuitry (or resistor-select circuitry for FIG. 37) that is generally used to set a maximum current or brightness level based on chip size or the like for the LED 146. Such selection may generally be made at initial setup and may not necessarily be changed afterward. In certain embodiments, the PWM may be omitted and the LED 146 may be run by the current source 156 alone as previously described with the Howland current pump of FIG. 11E. In certain embodiments, the current source 156 is equipped with built-in feedback and accordingly, feedback from the ADC 154 may not be needed. In certain embodiments, temperature measurement feedback may be provided to the current source 156 by one or more components of the ADC154. While only the LED 146 is illustrated in FIG. 39, the concepts described herein are also applicable to multiple LED arrangements. As with previously described embodiments, the active electrical element 30 as configured in FIG. 39 may be incorporated into the same LED package as one or more LEDs (e.g., LED 146).

Figure 40:
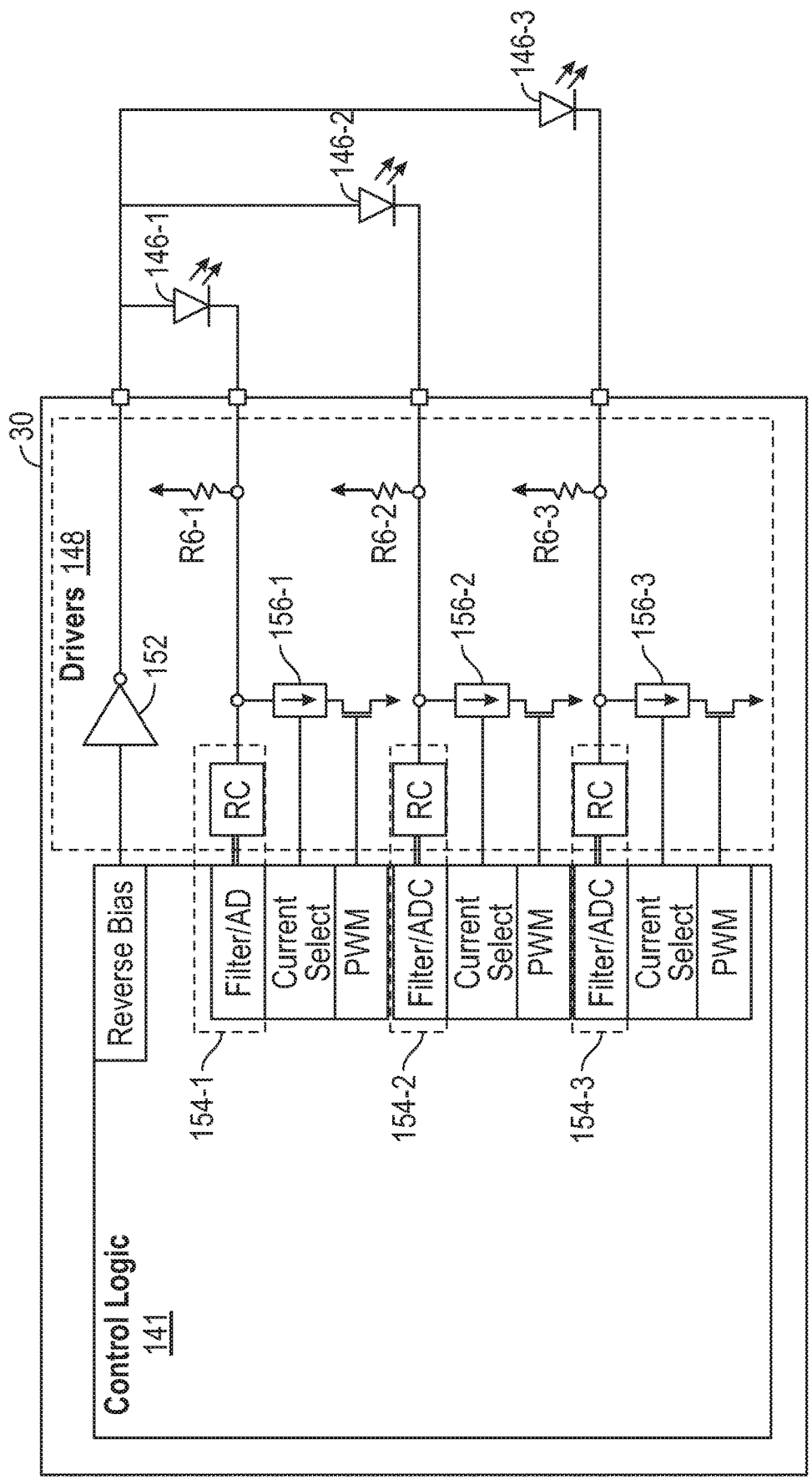
FIG. 40 is a schematic diagram illustrating multiple LED embodiments similar to the schematic diagram of FIG. 39.

FIG. 40 is a schematic diagram illustrating multiple LED embodiments similar to schematic diagram of FIG. 39. As illustrated, a separate one of pullup resistors R6-1 to R6-3 in the active electrical element 30 is coupled to corresponding ones of multiple LEDs 146-1 to 146-3. Additionally, each of the LEDs 146-1 to 146-3 is coupled with a corresponding ADC 154-1 to 154-3 and a corresponding current source 156-1 to 156-3. In FIG. 40, the inverter 152 is configured to change or switch from forward bias states to reverse bias states for each of the LEDs 146-1 to 146-3. In other embodiments, the active electrical element 30 may comprise a separate inverter 152 for each of the LEDs 146-1 to 146-3. As discussed earlier, separate $V_{dd}$ voltage inputs could be utilized to save power by driving the LEDs 146-1 to 146-3 at their respective voltage levels with less power dissipation within the active electrical element 30. While the current sources 156-1 to 156-3 are illustrated, a resistor network (e.g., R1-R5 of FIG. 38) and selection switches (e.g., FET1-FET3 of FIG. 38) may also be configured for each of the LEDs 146-1 to 146-3. As such, the active electrical element 30 of FIG. 40 is configured to provide electrical open detection, electrical short detection, forward voltage monitoring, and reverse leakage monitoring for each of the LEDs 146-1 to 146-3 and responsively adjust or shut off individual ones or groups of the LEDs 146-1 to 146-3. As with previously described embodiments, the active electrical element 30 as configured in FIG. 40 may be incorporated into the same LED package as the LEDs 146-1 to 146-3. While a plurality of the ADCs 154-1 to 154-3 is illustrated, a single ADC may be provided to detect voltages or voltage levels at multiple nodes such that the single ADC is configured to provide at least one of reverse leakage measurements and forward voltage measurements for a plurality of the LEDs 146-1 to 146-3.

Figure 41:
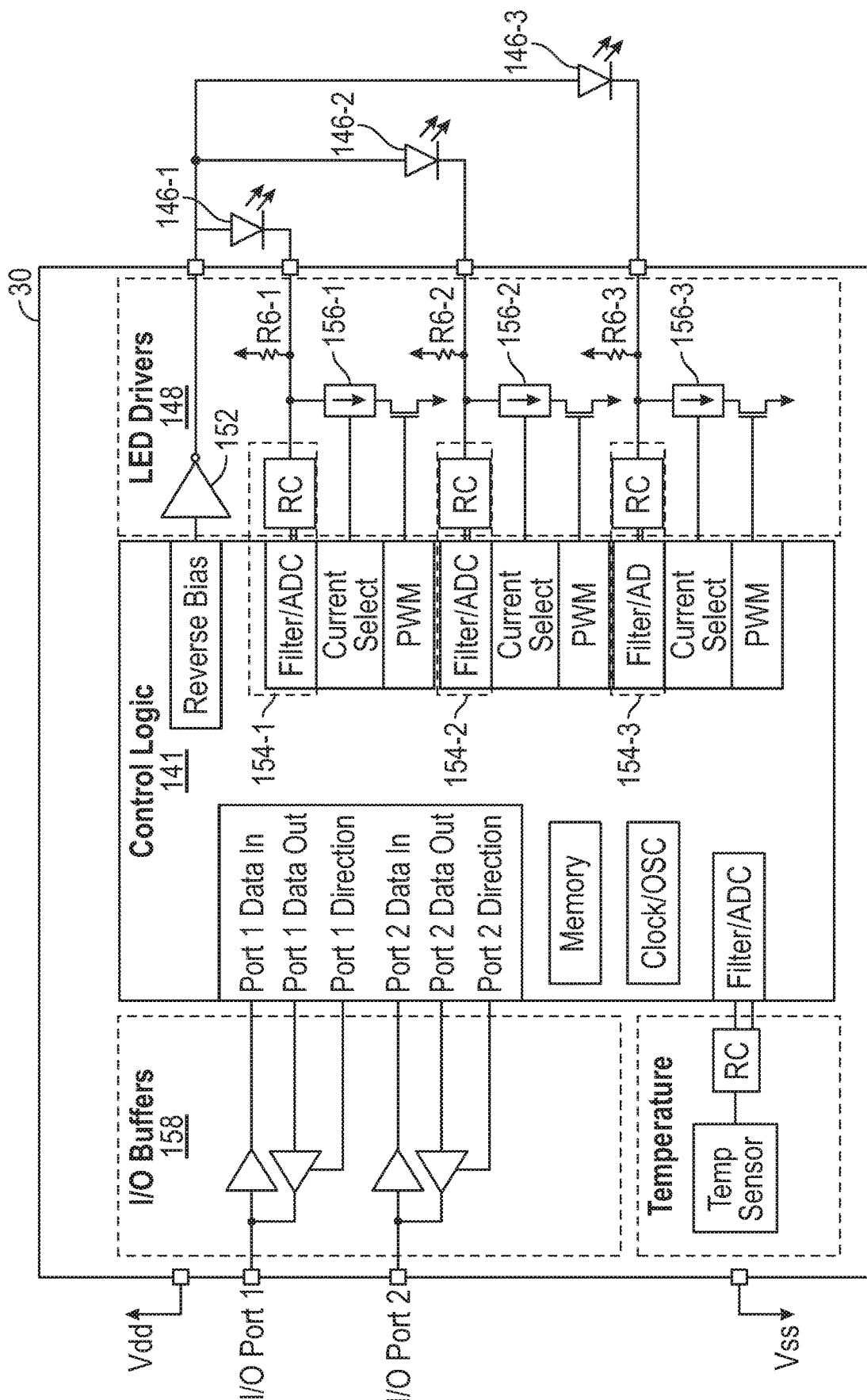
FIG. 41 is a schematic diagram illustrating the active electrical element of FIG. 40 configured with multiple ports that include supply voltage, ground, and bidirectional communication ports according to embodiments disclosed herein.

FIG. 41 is a schematic diagram illustrating the active electrical element 30 of FIG. 40 configured with multiple ports that include a supply voltage $V_{dd}$, ground $V_{ss}$, and bidirectional communication ports (input/output (I/O) Port 1 and I/O Port 2) according to embodiments disclosed herein. In FIG. 41, in addition to the four ports of $V_{dd}$, $V_{ss}$, I/O Port 1, and I/O Port 2 on the left side of the schematic, the active electrical element 30 includes four ports on the right side of schematic that are coupled with the LEDs 146-1 to 146-3. As illustrated, the LEDs 146-1 to 146-3 are electrically coupled with the inverter 152, the pullup resistors R6-1 to R6-3, the ADCs 154-1 to 154-3, and the current sources 156-1 to 156-3 as previously described. In other embodiments, the current sources 156-1 to 156-3 may be replaced with corresponding resistor networks and selection switches as previously described. The bidirectional communication ports I/O Port 1 and I/O Port 2 are electrically coupled with one or more I/O buffers 158. The I/O buffers 158 include circuitry (e.g., various buffers and tri-state buffers) that along with the control logic 141 are configured to assign the bidirectional communication ports I/O Port 1 and I/O Port 2 as either input (Data In) or output (Data Out) communication ports based on how the active electrical element 30 is connected within the system. In response to an input data connection at either of the bidirectional communication ports I/O Port 1 and I/O Port 2, the control logic 141 will accordingly assign an input port direction and an output port direction. The control logic 141 may include one or more additional elements that are generally illustrated in FIG. 41, such as a memory element, a clock or oscillator, and/or a filter and ADC that are connected to a temperature sensor and a resistor-capacitor for providing thermal management capabilities. In certain embodiments, one or more of the ADCs 154-1 to 154-3, or a separate ADC, may be configured to provide temperature measurements by measuring a voltage provided by a temperature sensor.

Figure 42:
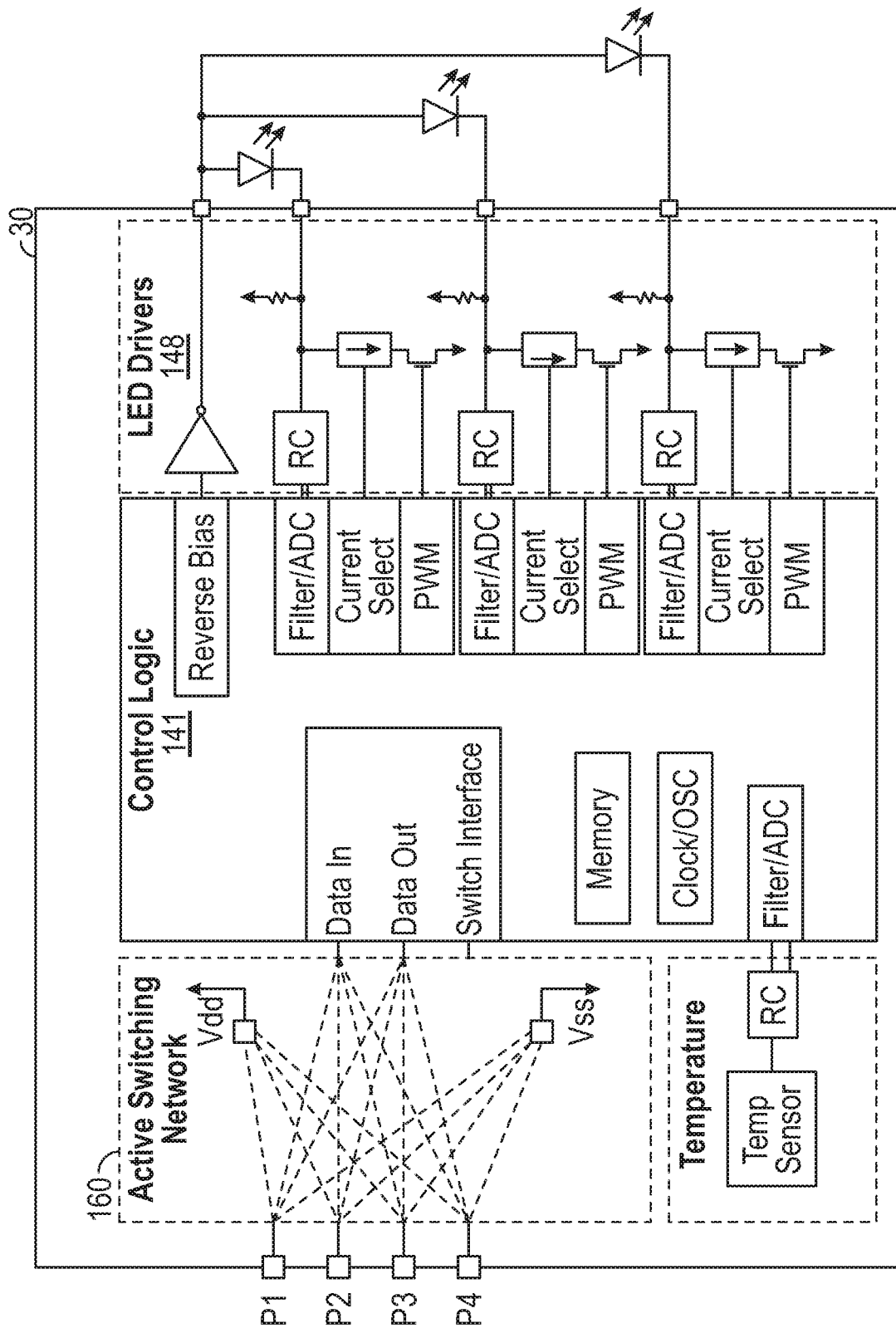
FIG. 42 is a schematic diagram illustrating the active electrical element of FIG. 41 configured with polarity-agnostic input capabilities according to embodiments disclosed herein.
Figure 43:
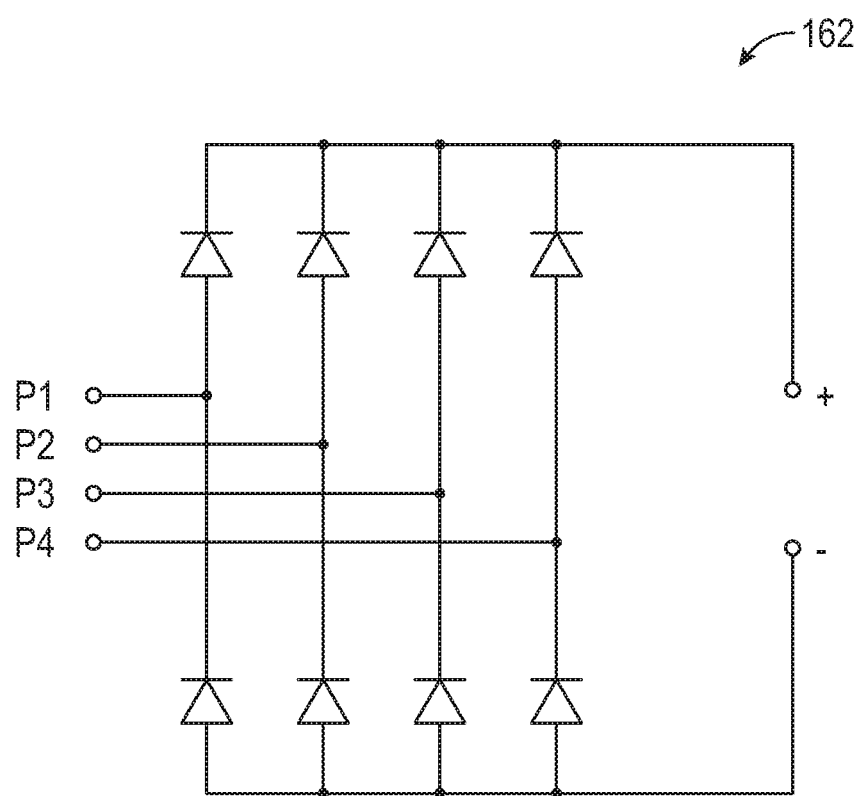
FIG. 43 is a schematic diagram illustrating a four-input rectifier that may be that may be used to provide initial power to a switching network of FIG. 42.

FIG. 42 is a schematic diagram illustrating the active electrical element 30 of FIG. 41 configured with polarity-agnostic or polarity-independent input capabilities according to embodiments disclosed herein. As illustrated, a switching network 160, such as an active switching network, may be arranged that receives or connects with multiple connections (e.g., ports P1-P4) from input ports or pins and configures separate signal lines as one of the $V_{dd}$, $V_{ss}$, Data in, and Data out signal lines. As such, the ports P1-P4 form a plurality of polarity-agnostic connection ports that are arranged to receive or transmit various signals. In certain embodiments, the switching network 160 includes circuitry configured to self-configure irrespective of what order the ports P1-P4 are connected. Exemplary circuitry for the switching network 160 may include a network of actively controlled switches, such as MOSFETS with gates that are biased according to voltage levels sensed on the inputs. In certain embodiments, the switching network 160 may provide part of the function for the I/O buffers 158 of FIG. 41. As such, it may be desirable to combine the functions of the I/O buffers 158 of FIG. 41 into the switching network 160 in certain embodiments. As illustrated by the dashed lines within the active switching network 160 of FIG. 42, each individual one of the ports P1-P4 are capable of being connected as any single one of the $V_{dd}$, $V_{ss}$, Data in, and Data out signal lines. In this manner, the active electrical element 30 of an LED package may comprise the switching network 160 and one or more bidirectional communication ports such that package bond pads (e.g., 48-1 to 48-4 of FIG. 21) of the LED package form polarity-agnostic connection ports that may be connected to any one of $V_{dd}$, $V_{ss}$, input communication, and output communication. For output communication, at least one of the multiple ports (e.g., ports P1-P4) may accordingly be configured as an output communication port. Since the switching network 160 includes power as well, power pins must be designated first and switched to the appropriate nodes. This power input can be accomplished through passive circuitry (e.g., an RC network controlling gates of FETs). By way of example, FIG. 43 is a general schematic diagram illustrating a four-input rectifier 162 that may be used to provide initial power to the switching network 160 of FIG. 42. As illustrated, each of the ports P1-P4 are coupled with a pair of low voltage components such as bipolar diodes, Schottky diodes, and the like. Such diodes may consume too much power because of their voltage drop (particularly for low-voltage LED components), and accordingly, the four-input rectifier 162 may only be used to initially power the switching network 160 of FIG. 42, after which active elements and logic can be used to make the final switch connections. In this manner, the power switching network of FIG. 42 may then use low voltage switches such as MOSFETS to provide low-resistance routing of power pins, bypassing the diode rectifier (e.g., 162 of FIG. 43). In certain embodiments, the MOSFETS may be included in an active rectifier of the switching network 160 that is used in combination with the four-input rectifier 162. In other embodiments, the active rectifier may be used in place of the 4-input rectifier 162 by replacing each of the diodes illustrated in FIG. 43 with actively controlled switches, such as transistors including MOSFETs and/or bipolar junction transistors.

As previously described, an active electrical element of an LED package is disclosed that is configured to receive a digital code, such as a compressed digital code or encoded signal, from a control element of an LED display. For example, the active electrical element may be configured to receive an encoded digital signal (e.g., FIG. 20) that utilizes reduced data bits in a data stream for communicating larger amounts of command codes. In this regard, the active electrical element may be configured to receive a compressed digital code and subsequently decompress the digital code for the data stream received by the active electrical element. As such, decompression of the digital code received may include any nonlinear function or algorithm for expansion of the data stream received, including an exponential inverse power function that may increase a dynamic range of the data stream. The dynamic range of a digital signal may refer to a range (e.g., upper and lower values) of signal levels generally described by the number of bits. One form of compression relates simply to how such bits are used. Bits are often used to generate a current or power input to an LED in a linear manner. This can be an inefficient use of the bit depth (e.g., dynamic range) for a display system because the human observer recognizes light in a nonlinear fashion more akin to a logarithmic or power law function such as used for gamma correction. The dynamic range of a given number of bits may be small (e.g., the highest level of an 8-bit code is 255 times that of the lowest level, excluding zero), but that dynamic range can be extended by orders of magnitude when transforming the data to match the nonlinear response of the eye. As an example, instead of having a dynamic range of 255 for 8 bits, by applying a gamma of 2.2, we get a dynamic range of almost 200,000 while still only using 8 bits. With no compression, 18 bits would be required to achieve the same level of dynamic range. In this manner, the dynamic range may refer to a useful number of bits, sampling, or resolution of the data stream for the active electrical element. As such, active electrical elements as disclosed herein may be configured to receive compressed data and decompress such data to provide a greater observed and useful dynamic range. As just described, certain embodiments, the compression and decompression schemes may follow a power law expression (e.g., gamma correction) to increase a dynamic range between a digital image and a perceived image by a human observer. In other embodiments, the compression and decompression schemes may include grouping of adjacent LED pixels/packages or LED pixels/packages in close proximity to one another. Such grouping of LED pixels may be applicable for embodiments where the groups of LED pixels are under the control of a common electrical element in an LED display matrix. In particular, an LED package may include two or more adjacent LED pixels and the compressed data code and subsequently decompressed data code reduces data inefficiencies by eliminating redundancy within the data that may be expected between neighboring ones of two or more adjacent LED pixels. As such, a common code is decoded or decompressed to provide codes for two or more adjacent LED pixels or subpixels.

As described above for FIGS. 41 and 42, LED packages are disclosed that are capable of receiving compressed digital data at any of several bidirectional communication ports or at any of polarity-agnostic package bond pads (e.g. 48-1 to 48-4 of FIG. 21) and decompressing such digital data. Additionally, LED packages are disclosed that are capable of receiving a transfer function or transfer function values to be applied within an LED package to any of several bidirectional communication ports or at any of polarity-agnostic package bond pads (e.g. 48-1 to 48-4 of FIG. 21). The transfer function may comprise one or more subsets of transfer function coefficients for the active electrical element to interpolate. In this manner, the transfer function may be calculated in the digital domain. In certain embodiments, the transfer function may comprise a piecewise transfer function. According to embodiments disclosed herein, the transfer function may be applied to direct or control one or more of a temperature measurement of one or more LEDs within the LED package, or a brightness output of one or more LEDs within the LED package, to an ADC input (e.g., the ADC 154 of FIG. 38), to a PWM output (e.g., the PWM circuitry of FIG. 38), and to a DAC-controlled output of an active electrical element. As used herein, a "transfer function" refers to any type of function that may be implemented in any number of ways to transform input data into output data such that the output data is different from the input data. In certain embodiments, a transfer function may be configured to transform data according to a linear function such as addition, multiplication, and the like. In certain embodiments, a transfer function may be configured to transform data according to a nonlinear function such as exponential, logarithmic, transcendental, algorithmic functions, Fourier transforms (e.g., discrete Fourier transforms), and the like. Transfer functions may be applied to temperature control by transforming temperature sensor values to generate corresponding control signals for the LEDs for temperature, brightness, or voltage adjustments, and combinations thereof. In certain embodiments, a transfer function may be configured to receive and transform multiple inputs of data values from multiple sources, such inputs from a control element (18 of FIG. 1B), inputs from a temperature sensor, and inputs that include forward voltage measurements or reverse leakage measurements of LEDs. Inputs from a control element that is external to an LED package may be configured as serial communication or serial input that includes desired brightness, calibration, and transfer coefficients, among others. Inputs from a temperature sensor, or inputs that include forward voltage and/or reverse leakage measurements may be internally generated within a particular LED package. In this manner, an LED package is disclosed herein that includes an active electrical element configured to receive data values and transform the data values according to a transfer function. In certain embodiments, the data values comprise a compressed data code that is received by the active electrical element, and the active electrical element is configured to transform the compressed data code to decompressed data code. The decompressed data code may comprise a brightness level or other control signal for an LED within the LED package.

In certain embodiments as disclosed herein, active electrical elements of LED packages are configured to receive data from a data stream that includes user-selectable color depth data. Color depth may refer to a number of data bits used to indicate or represent a color of an LED or an LED pixel. For example, 1-bit color depth may include monochromatic colors such as black and white, and 24-bit color depth may include 8-bits for each of a red LED, a blue LED, and a green LED within a particular LED package. Depending on the application, the user-selectable color depth data may comprise color depths in a range from 1-bit color depth to 100-bit color depth. In certain embodiments, a user may select a color depth for one or more LED packages within an LED display that is selectable from any one of 24-bit, 30-bit, 36-bit, and 48-bit color depths. In certain embodiments, a particular bit depth (e.g., one of 24-bit, 30-bit, 36-bit, and 48-bit color depths) may be achieved by selecting a next-higher bit depth and zero-padding a number of least significant bits relating to the difference. Depending on the color depth selected, the data stream received by the active electrical element of a particular LED package may be adjusted according to a bit size that corresponds to the selected color depth. For example, when changing from a larger color depth to a smaller color depth, the number of corresponding bits and transmission time is reduced. In this manner, a bit size of the selectable color depth data is adjustable. At different communication speeds for the data stream, there can be a trade-off between bit size or depth related to color depth, frame rate, and a number of pixels or subpixels in a control chain.

As disclosed herein, active electrical elements of LED packages may be configured to receive various data signals, including compressed or encoded signals and color depth data that correspond to any number of command codes. As previously described, the command codes may be included as part of data packets of a data stream. In certain embodiments, a command code for a particular LED or LED pixel may include an identifier signal that indicates to the active electrical element how the particular LED or LED pixel should respond to the command code. By way of example, the identifier signal may include: a "0" digital signal that indicates the command code is a single-pixel command code that is intended for a single LED or single LED pixel; or a "1" digital signal that indicates the command code is an all-pixel command code that is intended for all LEDs or all LED pixels. In certain embodiments, the single-pixel data are removed from the data stream by the particular pixel receiving the data and may be replaced with talk-back data or talk-back data packets as previously described. Single-pixel command codes may include any one of a skip pixel, a set brightness return on voltage, a set brightness return temperature and status, and a return or talk-back reverse leakage command, among others. Skip pixel command codes allow the ability to address a particular LED or LED pixel in a chain without affecting other LEDs or LED pixels that are upstream. All-pixel command codes may include any one of a set brightness for all LEDs or LED pixels, or an end of frame command code. In certain embodiments, an end of frame command code is provided to indicate that the LED or LED pixel should respond to a next single-pixel command code. In certain embodiments, single-pixel command codes may be transmitted or retransmitted along the chain for addressing particular LEDs or LED pixels. In this regard, the active electrical element of an LED package that responds to a single-pixel command code may responsively transmit the single-pixel command code with an altered code to indicate an "executed" command code and then wait until the end of frame command code is received before responding to the next single-pixel command code. Such an active electrical element may be referred to as a pseudo-repeater in cascade communication as it receives and retransmits data, but sometimes alters or replaces the data and does not always return the same data as the data received.

Examples of command codes that can be either a single-pixel command code or an all-pixel command code (e.g., either 0 or 1 for the "All" command bit) may include any one of a reset, a set options, a set RGB calibration, a set RGB transfer coefficients, and a set RGB thermal coefficients command code. In certain embodiments, the set options command code may be followed with additional bytes of data where each bit represents one of the following options: red LED off, green LED off, blue LED off, disable thermal shutdown, disable red LED shutdown, disable green LED shutdown, disable blue LED shutdown, communication speed 0, communication speed 1, color depth 0, color depth 1, turn off/on parity fail, PWM type 0, PWM type 1, resistor select 0, resistor select 1, resistor select 2, do not turn off shorted LED, use thermal compensation, setup acknowledge to acknowledge that a power on reset condition has been addressed, and to use voltage compensation that sets a mode where forward voltage feedback is used to adjust the PWM duty cycle. The communication speed 0 and 1 options may provide at least four communication speeds for output or may be provided to detect a communication speed from input. In this regard, an LED package is disclosed that includes an active electrical element configured to change or adapt a communication speed of data without a transmitted clock signal. The color depth 0 and 1 options may be configured toggle between color depths that include 24-bit-depth, 30-bit-depth, 36-bit-depth, and 48-bit-depth.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light emitting diode (LED) package, comprising:
   a submount;
   at least one LED mounted on the submount;
   an active electrical element electrically connected to the at least one LED, the active electrical element configured to drive the at least one LED in a forward bias state and switch the at least one LED to a reverse bias state where the at least one LED is reverse biased, wherein the active electrical element comprises at least two bidirectional communication ports;
   an input/output buffer electrically coupled to the at least two bidirectional communication ports;
   an inverter logic element directly coupled to the at least one LED; and
   an encapsulant on the submount, wherein the encapsulant covers at least a portion of the at least one LED and at least a portion of the active electrical element.

2. The LED package of claim 1, wherein the active electrical element further comprises a level sensor that is configured to provide an error signal while the at least one LED is in the reverse bias state.

3. The LED package of claim 1, wherein the active electrical element further comprises an analog-to-digital converter that is configured to provide reverse leakage measurements while the at least one LED is in the reverse bias state.

4. The LED package of claim 3, wherein the analog-to-digital converter comprises at least one of an analog filter circuit and digital filter circuitry.

5. The LED package of claim 3, wherein the analog-to-digital converter is configured to detect a voltage relating to an operating condition of the at least one LED while the at least one LED is in the reverse bias state.

6. The LED package of claim 3, wherein the analog-to-digital converter is configured to detect a voltage relating to an operating condition of the at least one LED while the at least one LED is in the forward bias state.

7. The LED package of claim 6, wherein the active electrical element is configured to adjust a drive signal of the at least one LED based on the voltage detected while the at least one LED is in the forward bias state.

8. The LED package of claim 7, wherein the drive signal comprises a pulse width modulation signal and the active electrical element is configured to adjust a pulse width modulation duty cycle of the at least one LED.

9. The LED package of claim 1, wherein the active electrical element comprises a resistor network that provides predetermined current limits to the at least one LED.

10. The LED package of claim 1, wherein the active electrical element comprises a current source that provides an adjustable current to the at least one LED.

11. The LED package of claim 1, wherein the inverter logic element is configured to provide the reverse bias state.

12. The LED package of claim 1, wherein the active electrical element is configured to communicate with and respond to commands from another control element.

13. The LED package of claim 1, wherein the active electrical element is configured to receive data values and transform the data values according to a transfer function.

14. The LED package of claim 1, wherein the active electrical element is configured to receive selectable color depth data.

15. The LED package of claim 1, wherein the at least two bidirectional communication ports comprise a first bidirectional communication port and a second bidirectional communication port, wherein the active electrical element is configured to selectively assign either the first bidirectional communication port or the second bidirectional communication port as an input port in response to an input signal received by the active electrical element, and selectively assign the other of the first bidirectional communication port or the second bidirectional communication port as an output port.

16. The LED package of claim 1, wherein the submount is a light-transmissive submount that comprises a first face and a second face that is opposite the first face, wherein the at least one LED and the active electrical element are mounted on the first face and the second face is a primary emission face of the LED package.

17. A light emitting diode (LED) package, comprising:
a submount;
at least one LED mounted on the submount;
an active electrical element electrically connected to the at least one LED, the active electrical element configured to drive the at least one LED in a forward bias state and switch the at least one LED to a reverse bias state where the at least one LED is reverse biased, the active electrical element comprising at least one analog-to-digital converter, the active electrical element further comprising at least two bidirectional communication ports;
an input/output buffer electrically coupled to the at least two bidirectional communication ports;
an inverter logic element directly coupled to the at least one LED; and
an encapsulant on the submount, wherein the encapsulant covers at least a portion of the at least one LED and at least a portion of the active electrical element;
wherein the at least one analog-to-digital converter is configured to detect a voltage relating to reverse leakage measurements of the at least one LED while the at least one LED is reverse biased.

18. The LED package of claim 17, wherein the at least one analog-to-digital converter is configured to detect a voltage relating to forward voltage measurements of the at least one LED.

19. The LED package of claim 17, wherein the at least one analog-to-digital converter is configured to detect an electrical short condition of the at least one LED.

20. The LED package of claim 17, wherein the at least one analog-to-digital converter is configured to detect an electrical open condition of the at least one LED.

21. The LED package of claim 17, wherein the active electrical element is configured to adjust a pulse width modulation duty cycle of the at least one LED based on voltage levels that are detected by the at least one analog-to-digital converter.

22. The LED package of claim 17, wherein the at least one analog-to-digital converter is configured to transmit measured data from the at least one LED to the active electrical element for serial output.

23. The LED package of claim 17, wherein the at least one analog-to-digital converter is configured to provide at least one of reverse leakage measurements and forward voltage measurements for a plurality of LEDs.

24. The LED package of claim 17, wherein the at least one analog-to-digital converter is configured to provide temperature measurements by measuring a voltage provided by a thermal sensor.

25. The LED package of claim 17, wherein the active electrical element is configured to receive data values and transform the data values according to a transfer function.

26. The LED package of claim 17, wherein the active electrical element is configured to receive selectable color depth data.

27. The LED package of claim 17, wherein the at least two bidirectional communication ports comprise a first bidirectional communication port and a second bidirectional communication port, wherein the active electrical element is configured to selectively assign either the first bidirectional communication port or the second bidirectional communication port as an input port in response to an input signal received by the active electrical element, and selectively assign the other of the first bidirectional communication port or the second bidirectional communication port as an output port.

28. The LED package of claim 17, wherein the submount is a light-transmissive submount that comprises a first face and a second face that is opposite the first face, wherein the at least one LED and the active electrical element are mounted on the first face and the second face is a primary emission face of the LED package.

29. The LED package of claim 1, wherein the active electrical element comprises pulse width modulation (PWM) circuitry configured to control a brightness of the at least one LED and the PWM circuitry is turned off when the at least one LED is reverse biased.

30. The LED package of claim 17, wherein the active electrical element comprises pulse width modulation (PWM) circuitry configured to control a brightness of the at least one LED and the PWM circuitry is turned off when the at least one LED is reverse biased.

\* \* \* \* \*